United States Patent
Yamazaki et al.

(10) Patent No.: US 11,495,601 B2
(45) Date of Patent: Nov. 8, 2022

(54) SEMICONDUCTOR DEVICE AND MANUFACTURING METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Takanori Matsuzaki, Kanagawa (JP); Ryo Tokumaru, Kanagawa (JP); Ryota Hodo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 55 days.

(21) Appl. No.: 17/253,239

(22) PCT Filed: Jun. 17, 2019

(86) PCT No.: PCT/IB2019/055013
§ 371 (c)(1),
(2) Date: Dec. 17, 2020

(87) PCT Pub. No.: WO2020/003047
PCT Pub. Date: Jan. 2, 2020

(65) Prior Publication Data
US 2021/0273109 A1 Sep. 2, 2021

(30) Foreign Application Priority Data

Jun. 29, 2018 (JP) .............................. JP2018-124870

(51) Int. Cl.
*H01L 27/108* (2006.01)
*H01L 29/66* (2006.01)
*H01L 29/786* (2006.01)

(52) U.S. Cl.
CPC .. *H01L 27/10805* (2013.01); *H01L 27/10808* (2013.01); *H01L 27/10855* (2013.01);
(Continued)

(58) Field of Classification Search
CPC ........... H01L 27/0629; H01L 27/10805; H01L 27/10808; H01L 27/10847;
(Continued)

(56) References Cited

U.S. PATENT DOCUMENTS 6,476,432 B1 11/2002 Basceri et al.
7,170,176 B2 1/2007 Ishikawa et al.
(Continued)

FOREIGN PATENT DOCUMENTS

CN 101084580 A 12/2007
CN 105659369 A 6/2016
(Continued)

OTHER PUBLICATIONS

International Search Report (Application No. PCT/IB2019/055013) dated Aug. 6, 2019.
(Continued)

*Primary Examiner* — Cheung Lee
(74) *Attorney, Agent, or Firm* — Fish & Richardson P.C.

(57) ABSTRACT

A semiconductor device that can be miniaturized or highly integrated is provided. The semiconductor device includes a capacitor, an electrode, and an interlayer film. The transistor includes a semiconductor layer, a gate, a source, and a drain; the transistor and the capacitor are placed to be embedded in the interlayer film. Below the semiconductor layer, one of the source and the drain is in contact with the electrode. Above the semiconductor layer, the other of the source and the drain is in contact with one electrode of the capacitor.

15 Claims, 26 Drawing Sheets

(52) U.S. Cl.
CPC .. *H01L 27/10873* (2013.01); *H01L 29/66742* (2013.01); *H01L 29/7869* (2013.01); *H01L 29/78696* (2013.01)

(58) Field of Classification Search
CPC ......... H01L 27/10852; H01L 27/10855; H01L 27/10873; H01L 27/1225; H01L 27/1255; H01L 28/40; H01L 28/60; H01L 29/66742; H01L 29/66969; H01L 29/7869; H01L 29/78696; G02F 1/1362; G02F 1/136213; G02F 1/1368
See application file for complete search history.

(56) References Cited

U.S. PATENT DOCUMENTS

| | | |
|---|---|---|
| 8,455,868 B2 | 6/2013 | Yamazaki et al. |
| 8,547,771 B2 | 10/2013 | Koyama |
| 9,419,018 B2 | 8/2016 | Sasagawa et al. |
| 9,424,890 B2 | 8/2016 | Inoue et al. |
| 9,431,435 B2 | 8/2016 | Ando et al. |
| 9,443,872 B2 | 9/2016 | Miyairi |
| 9,466,615 B2 | 10/2016 | Miyairi et al. |
| 9,640,226 B2 | 5/2017 | Matsuzaki et al. |
| 9,673,224 B2 | 6/2017 | Yamazaki et al. |
| 9,780,201 B2 | 10/2017 | Ando et al. |
| 9,905,657 B2 | 2/2018 | Endo et al. |
| 10,186,604 B2 | 1/2019 | Ando et al. |
| 10,217,736 B2 | 2/2019 | Kato et al. |
| 10,504,920 B2 | 12/2019 | Matsukura |
| 2003/0001187 A1 | 1/2003 | Basceri et al. |
| 2009/0039341 A1 | 2/2009 | Marsman et al. |
| 2010/0102313 A1 | 4/2010 | Miyairi et al. |
| 2015/0084046 A1 | 3/2015 | Kato et al. |
| 2015/0108470 A1 | 4/2015 | Yamazaki et al. |
| 2015/0108475 A1 | 4/2015 | Ando et al. |
| 2015/0187814 A1* | 7/2015 | Miyairi .................. H01L 29/26 257/43 |
| 2016/0149045 A1* | 5/2016 | Tanaka ................ H01L 27/1207 257/315 |
| 2016/0155480 A1 | 6/2016 | Inoue et al. |
| 2016/0172009 A1 | 6/2016 | Matsuzaki et al. |
| 2017/0025543 A1 | 1/2017 | Kakehata |
| 2017/0033111 A1 | 2/2017 | Yamazaki et al. |
| 2017/0033239 A1 | 2/2017 | Nakano et al. |

FOREIGN PATENT DOCUMENTS

| | | |
|---|---|---|
| EP | 1700342 A | 9/2006 |
| JP | 2006-261178 A | 9/2006 |
| JP | 2007-525829 | 9/2007 |
| JP | 2011-151383 A | 8/2011 |
| JP | 2012-257187 A | 12/2012 |
| JP | 2015-084418 A | 4/2015 |
| JP | 2015-109425 A | 6/2015 |
| JP | 2015-109433 A | 6/2015 |
| JP | 2016-110688 A | 6/2016 |
| JP | 2016-149174 A | 8/2016 |
| JP | 2017-028282 A | 2/2017 |
| KR | 2006-0120220 A | 11/2006 |
| KR | 2016-0070698 A | 6/2016 |
| KR | 2016-0072110 A | 6/2016 |
| KR | 2016-0073374 A | 6/2016 |
| TW | 200534467 | 10/2005 |
| TW | 201517276 | 5/2015 |
| TW | 201523885 | 6/2015 |
| TW | 201901814 | 1/2019 |
| WO | WO-2005/064681 | 7/2005 |
| WO | WO-2015/060133 | 4/2015 |
| WO | WO-2015/060318 | 4/2015 |

OTHER PUBLICATIONS

Written Opinion (Application No. PCT/IB2019/055013) dated Aug. 6, 2019.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Yamazaki.S et al., "In—Ga—Zn-Oxide Semiconductor and its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CaAc—IgZo and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

\* cited by examiner

FIG. 25A
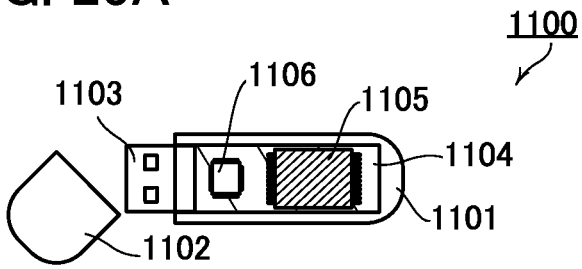
FIG. 25B  FIG. 25C
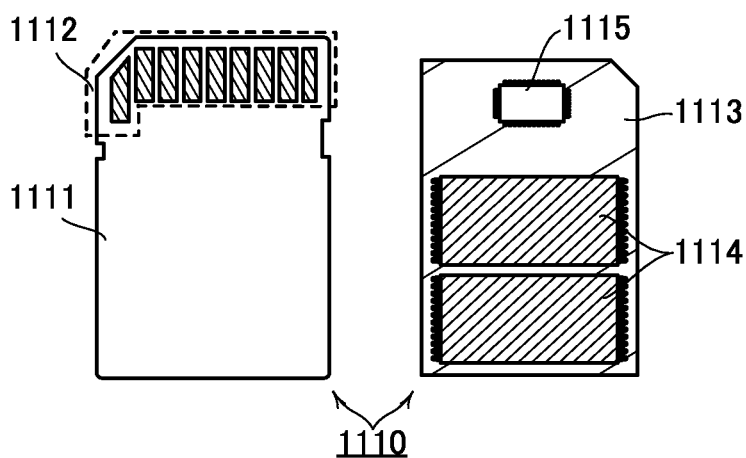
FIG. 25D  FIG. 25E
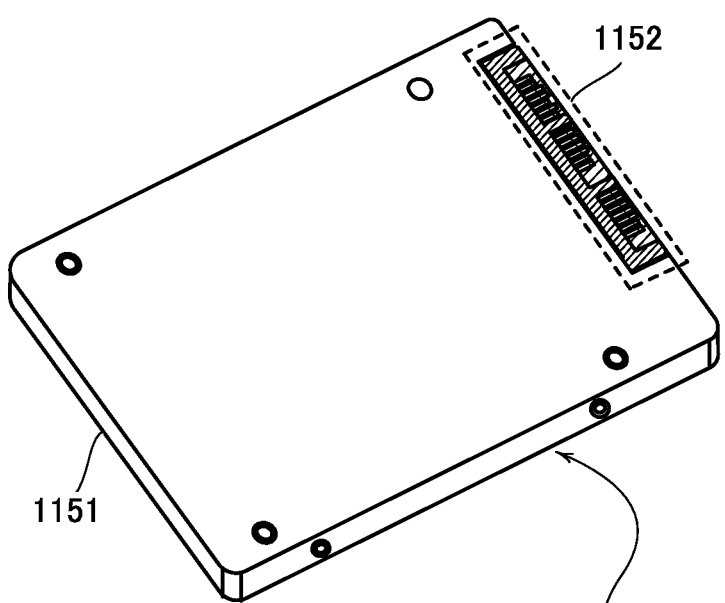
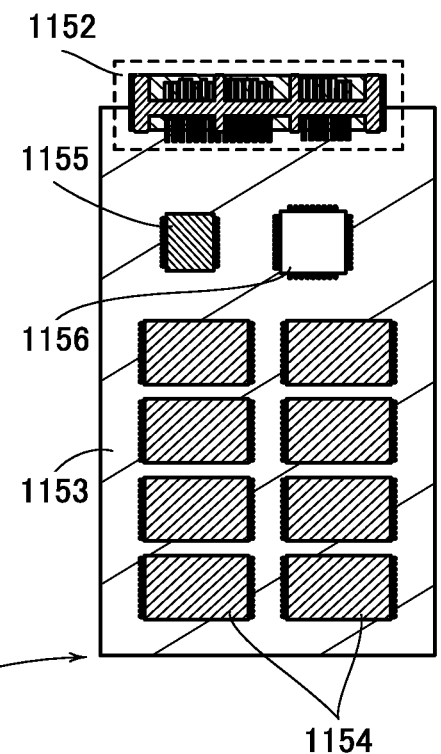

SEMICONDUCTOR DEVICE AND MANUFACTURING METHOD OF SEMICONDUCTOR DEVICE

CROSS REFERENCE TO RELATED APPLICATIONS

This application is a U.S. National Phase Application under 35 U.S.C. § 371 of International Application PCT/IB2019/055013, filed on Jun. 17, 2019, which is incorporated by reference and claims the benefit of a foreign priority application filed in Japan on Jun. 29, 2018, as Application No. 2018-124870.

TECHNICAL FIELD

One embodiment of the present invention relates to a semiconductor device and a method for manufacturing the semiconductor device. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of the semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

In recent years, semiconductor devices have been developed and LSIs, CPUs, and memories are mainly used. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of LSIs, CPUs, memories, and the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film that can be used in a transistor, and as another material, an oxide semiconductor has been attracting attention.

It is known that a transistor using an oxide semiconductor has an extremely low leakage current in an off state. For example, a low-power CPU utilizing a characteristic of a low leakage current of the transistor using an oxide semiconductor has been disclosed (see Patent Document 1). Furthermore, a memory device that can retain stored data for a long time by utilizing a characteristic of a low leakage current of the transistor using an oxide semiconductor has been disclosed, for example (see Patent Document 2).

In recent years, demand for an integrated circuit with higher density has risen with reductions in size and weight of electronic devices. In addition, the productivity of a semiconductor device including an integrated circuit is required to be improved.

REFERENCES

Patent Documents

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device that can be miniaturized or highly integrated. Another object of one embodiment of the present invention is to provide a semiconductor device with favorable electrical characteristics. Another object of one embodiment of the present invention is to provide a semiconductor device with a high on-state current. Another object of one embodiment of the present invention is to provide a semiconductor device with favorable frequency characteristics. Another object of one embodiment of the present invention is to provide a highly reliable semiconductor device. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device capable of reducing power consumption. Another object of one embodiment of the present invention is to provide a novel semiconductor device.

Note that the description of these objects does not disturb the existence of other objects. In one embodiment of the present invention, there is no need to achieve all these objects. Objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device including a capacitor, an electrode, and an interlayer film. The transistor includes a semiconductor layer, a gate, a source, and a drain; the transistor and the capacitor are placed to be embedded in the interlayer film; below the semiconductor layer, one of the source and the drain is in contact with the electrode; and above the semiconductor layer, the other of the source and the drain is in contact with one electrode of the capacitor.

In the above, it is preferable that an opening reaching the other of the source and the drain be provided in the interlayer film, and the one electrode of the capacitor be placed along a side surface and a bottom surface of the opening. In the above, an insulator may be provided between the one electrode of the capacitor and the interlayer film. In the above, the semiconductor layer is preferably an oxide semiconductor.

Another embodiment of the present invention is a semiconductor device including a first transistor and a capacitor. The first transistor includes first to fourth conductors, first to fourth insulators, and first and second oxides; the first insulator is placed over the first conductor; the first oxide is placed over the first insulator; a first opening reaching the first conductor is provided in the first insulator and the first oxide; the second conductor and the third conductor provided apart from each other are placed over the first oxide; at least part of the second conductor overlaps with the first opening and is in contact with a top surface of the first conductor; the second oxide is placed over the first oxide to at least partly overlap with a region between the second conductor and the third conductor; the second insulator is placed over the second oxide; the fourth conductor is placed over the second insulator; the third insulator is placed over the first insulator, the second conductor, and the third conductor; the fourth insulator is placed in contact with a top surface of the third insulator, a top surface of the second oxide, a top surface of the second insulator, and a top surface of the fourth conductor; a second opening reaching the third conductor is provided in the third insulator and the fourth insulator; the capacitor includes fifth and sixth conductors and a fifth insulator; the fifth conductor is placed in the second opening to be in contact with a top surface of the third conductor; the fifth insulator is placed over the fifth conductor and the fourth insulator; and the sixth conductor is placed over the fifth insulator.

In the above, a sixth insulator may be further included between the fifth conductor and the third insulator. In the above, the sixth insulator preferably has lower hydrogen permeability than the third insulator. In the above, in a top view, the length of the fifth conductor in the channel width direction is preferably shorter than the length of the first oxide in the channel width direction. In the above, the level of part of a top surface of the fifth conductor may be substantially aligned with the level of a top surface of the fourth insulator.

In the above, a seventh conductor, which is placed under the first insulator to at least partly overlap with the fourth conductor, is preferably further included. In the above, the third conductor may be in contact with a side surface of the first oxide in the first opening. In the above, a seventh insulator, which is placed between the second conductor and the third conductor, and the third insulator, is preferably further included. In the above, the first oxide and the second oxide preferably contain In, an element M (M is Al, Ga, Y, or Sn), and Zn.

In the above, it is preferable that a second transistor be further provided under the first conductor, and a source or a drain of the second transistor be electrically connected to the first conductor. In the above, the second transistor may be formed on a silicon substrate. In the above, the second transistor may include a third oxide.

Effect of the Invention

According to one embodiment of the present invention, a semiconductor device that can be miniaturized or highly integrated can be provided. According to one embodiment of the present invention, a semiconductor device with favorable electrical characteristics can be provided. According to one embodiment of the present invention, a semiconductor device with a high on-state current can be provided. According to one embodiment of the present invention, a semiconductor device with favorable frequency characteristics can be provided. According to one embodiment of the present invention, a highly reliable semiconductor device can be provided. According to one embodiment of the present invention, a semiconductor device with high productivity can be provided.

One embodiment of the present invention can provide a semiconductor device capable of retaining data for a long time. One embodiment of the present invention can provide a semiconductor device capable of high-speed data writing. One embodiment of the present invention can provide a semiconductor device with high design flexibility. One embodiment of the present invention can provide a semiconductor device capable of reducing power consumption. One embodiment of the present invention can provide a novel semiconductor device.

Note that the description of these effects does not disturb the existence of other effects. In one embodiment of the present invention, there is no need to achieve all these effects. Effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 25(A) to (E) Schematic views of memory devices according to embodiments of the present invention.

MODE FOR CARRYING OUT THE INVENTION

Figure 1A:
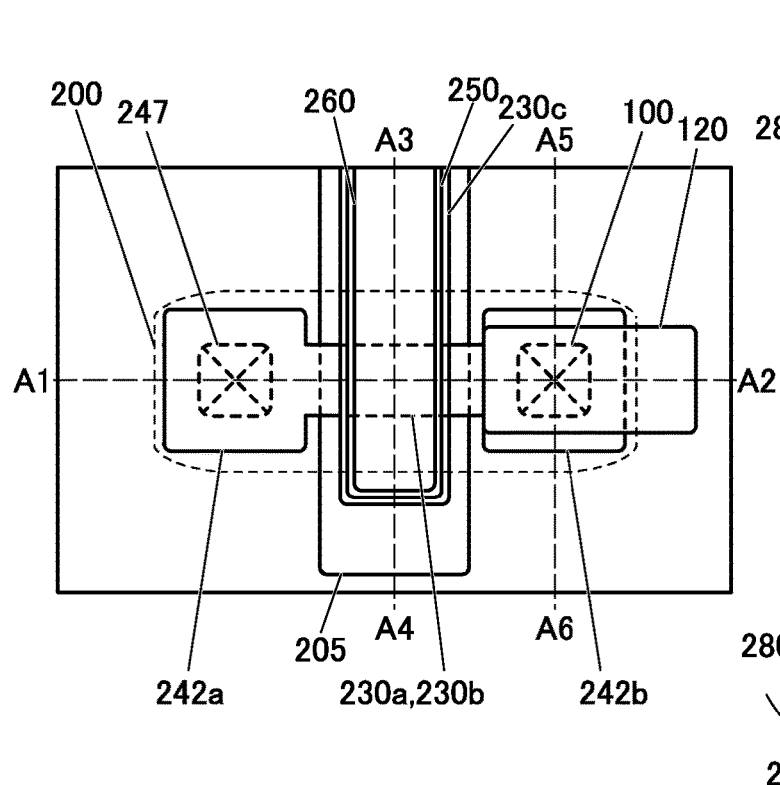
FIG. 1(A) to (D) A top view and cross-sectional views of a semiconductor device according to one embodiment of the present invention.

Embodiments will be hereinafter described with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is sometimes exaggerated for clarity. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not reflected in the drawings in some cases for easy understanding. In the drawings, the same portions or portions having similar functions are denoted by the same reference numerals in different drawings, and explanation thereof will not be repeated in some cases. The same hatching pattern is applied to portions having similar functions, and the portions are not denoted by specific reference numerals in some cases.

Furthermore, especially in a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as the ordinal numbers used to specify one embodiment of the present invention.

In this specification and the like, terms for describing arrangement, such as "over" and "under", are used for convenience to describe a positional relationship between components with reference to drawings. Furthermore, the positional relationship between components is changed as appropriate in accordance with the direction in which each component is described. Thus, without limitation to terms described in this specification, the description can be changed appropriately depending on the situation.

For example, when this specification and the like explicitly state that X and Y are connected, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than one shown in drawings or texts is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or when a direction of current flow is changed in circuit operation, for example. Therefore, the terms "source" and "drain" can be interchanged in some cases in this specification and the like.

Note that in this specification and the like, depending on the transistor structure, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width and its influence cannot be ignored in some cases. For example, in a miniaturized transistor having a gate electrode covering a side surface of a semiconductor, the proportion of a channel formation region formed in a side surface of a semiconductor is increased in some cases. In that case, an effective channel width is greater than an apparent channel width.

In such a case, an effective channel width is difficult to estimate by measuring in some cases. For example, to estimate an effective channel width from a design value, it is necessary to assume that the shape of a semiconductor is known. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width in this specification. Note that the values of a channel length, a channel width, an effective channel width, an apparent channel width, and the like can be determined by analyzing a cross-sectional TEM image and the like.

Note that an impurity in a semiconductor refers to, for example, elements other than the main components of the semiconductor. For example, an element with a concentration lower than 0.1 atomic % can be regarded as an impurity. When an impurity is contained, for example, the DOS (Density of States) in a semiconductor may be increased, or the crystallinity may be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. For an oxide semiconductor, entry of impurities may lead to formation of oxygen vacancies, for example. When the semiconductor is silicon, examples of an impurity which changes the characteristics of the semiconductor include oxygen, Group 1 elements except hydrogen, Group 2 elements, Group 13 elements, and Group 15 elements.

In this specification and the like, silicon oxynitride refers to a substance that contains more oxygen than nitrogen. In addition, silicon nitride oxide refers to a substance that contains more nitrogen than oxygen.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to −10° and less than or equal to 10°. Thus, the case where the angle is greater than or equal to −5° and less than or equal to 5° is also included. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°.

Note that in this specification, a barrier film refers to a film having a function of inhibiting the penetration of oxygen and impurities such as water and hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET or an OS transistor is a transistor including an oxide or an oxide semiconductor.

In this specification and the like, the term "normally off" means that current per micrometer of channel width that flows through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device of one embodiment of the present invention including a transistor 200 and a capacitor 100 is described below.

<Structure Example of Semiconductor Device>

FIG. 1(A), FIG. 1(B), FIG. 1(C), and FIG. 1(D) are a top view and cross-sectional views of a semiconductor device of one embodiment of the present invention including the transistor 200 and the capacitor 100.

Figure 1C:
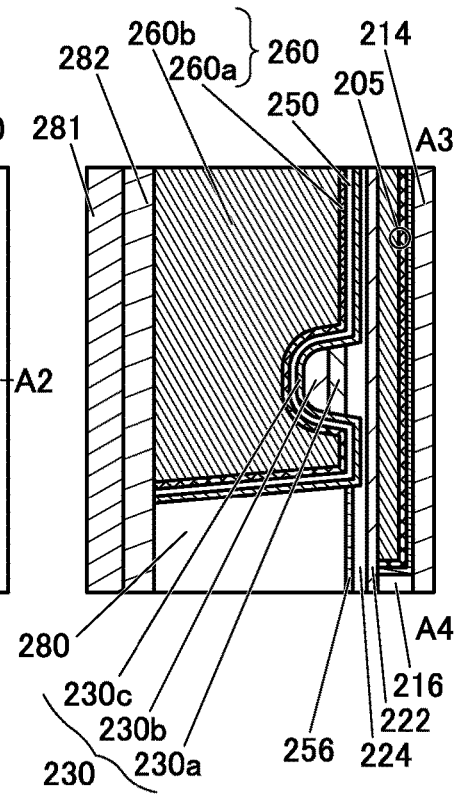
Figure 1B:
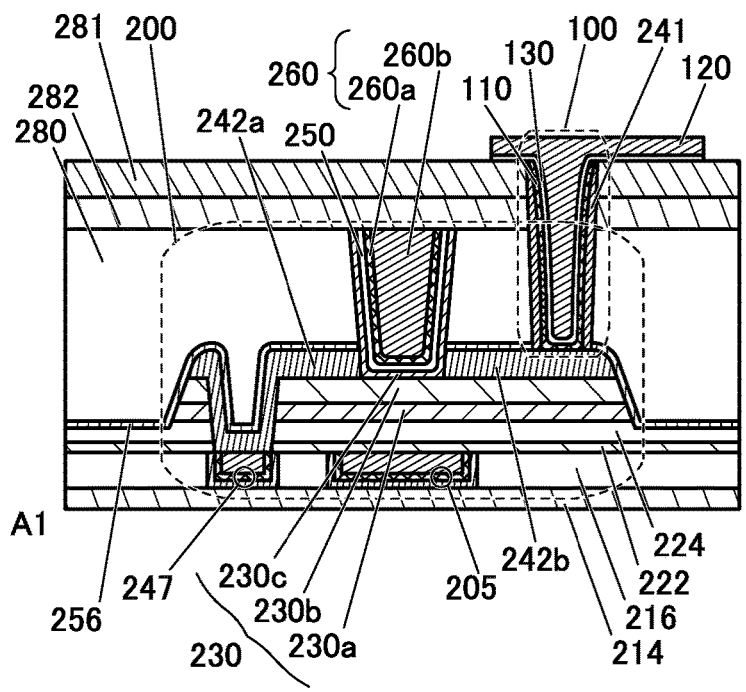
Figure 1D:
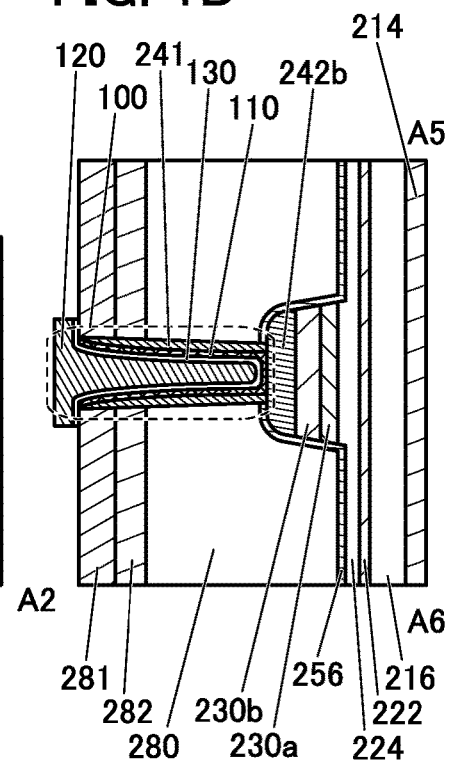

FIG. 1(A) is a top view of the semiconductor device including the transistor 200 and the capacitor 100. FIG. 1(B), FIG. 1(C), and FIG. 1(D) are cross-sectional views of the semiconductor device. Here, FIG. 1(B) is a cross-sectional view of a portion indicated by the dashed-dotted line A1-A2 in FIG. 1(A), and is also a cross-sectional view of the transistor 200 in the channel length direction. FIG. 1(C) is a cross-sectional view of a portion indicated by the dashed-dotted line A3-A4 in FIG. 1(A), and is also a cross-sectional view of the transistor 200 in the channel width direction. FIG. 1(D) is a cross-sectional view of a portion indicated by the dashed-dotted line A5-A6 in FIG. 1(A), and is also a cross-sectional view of a source region or a drain region of the transistor 200 in the channel width direction. Note that for clarity of the drawing, some components are not illustrated in the top view of FIG. 1(A).

The semiconductor device of one embodiment of the present invention includes an insulator 214 over a substrate (not illustrated), the transistor 200 over the insulator 214, an insulator 280 over an insulator 256 provided in the transistor 200, an insulator 282 over the insulator 280, and an insulator 281 over the insulator 282. The insulator 214, the insulator 280, the insulator 282, and the insulator 281 function as interlayer films. As illustrated in FIG. 1, at least parts of the transistor 200 and the capacitor 100 are placed to be embedded in the insulator 280.

Here, the transistor 200 includes a semiconductor layer, a first gate, a second gate, a source, and a drain. A conductor 247 is provided below the semiconductor layer of the transistor 200. Below the semiconductor layer, one of the source and the drain of the transistor 200 is in contact with the conductor 247, and above the semiconductor layer, the other of the source and the drain of the transistor 200 is in contact with one electrode of the capacitor 100.

The capacitor 100 is provided in an opening that is formed in the insulator 256, the insulator 280, the insulator 282, and the insulator 281 and reaches the other of the source and the drain of the transistor 200. The capacitor 100 includes a conductor 110 in contact with a top surface of the other of the source and the drain of the transistor 200 in the opening, an insulator 130 placed over the conductor 110 and the insulator 281, and a conductor 120 placed over the insulator 130. Here, the conductor 110 is preferably placed along a side surface and a bottom surface of the opening.

An insulator 241 is preferably provided between the conductor 110 and the insulator 280. It is preferable that the insulator 241 have a function of inhibiting diffusion of hydrogen (e.g., at least one of a hydrogen atom, a hydrogen molecule, and the like). In addition, it is preferable that the insulator 241 have a function of inhibiting diffusion of oxygen (e.g., at least one of an oxygen atom, an oxygen molecule, and the like). For example, the insulator 241 preferably has lower permeability of one or both of oxygen and hydrogen than the insulator 280.

[Transistor 200]

Hereinafter, a typical structure of the transistor 200 will be described. Note that a structure of the transistor 200 described below is one embodiment of the present invention, and the present invention is not limited thereto. The structure of the transistor 200 can be changed as appropriate in accordance with a function required for the semiconductor device.

As illustrated in FIG. 1, the transistor 200 includes an insulator 216 over the insulator 214; a conductor 205 placed to be embedded in the insulator 216; an insulator 222 over the insulator 216 and the conductor 205; an insulator 224 over the insulator 222; an oxide 230a over the insulator 224; an oxide 230b over the oxide 230a; a conductor 242a and a conductor 242b over the oxide 230b; an oxide 230c over the oxide 230b; an insulator 250 over the oxide 230c; a conductor 260 (a conductor 260a and a conductor 260b) positioned over the insulator 250 and overlapping with the oxide 230c; and the insulator 256 in contact with part of a top surface of the insulator 224, a side surface of the oxide 230a, a side surface of the oxide 230b, a side surface of the conductor 242a, a top surface of the conductor 242a, a side surface of the conductor 242b, and a top surface of the conductor 242b. The oxide 230c is in contact with the side surface of the conductor 242a and the side surface of the conductor 242b. The conductor 260 includes the conductor 260a and the conductor 260b, and the conductor 260a is placed to cover a bottom surface and a side surface of the conductor 260b. Here, as illustrated in FIG. 1(B), the level of a top surface of the conductor 260 is substantially aligned with the levels of a top surface of the insulator 250, a top surface of the oxide 230c, and a top surface of the insulator 280. The insulator 282 is in contact with each of the top surfaces of the conductor 260, the oxide 230c, the insulator 250, and the insulator 280.

An opening is formed in the insulator 216, and the above-described conductor 247 is placed in the opening. It is preferable that at least part of a top surface of the conductor 247 be exposed from the insulator 216, and the level of the top surface of the conductor 247 be substantially aligned with the level of a top surface of the insulator 216.

Here, the conductor 247 functions as a plug or a wiring for electrically connecting the transistor 200 to a circuit element such as a switch, a transistor, a capacitor, an inductor, a resistor, or a diode, a wiring, an electrode, or a terminal which is provided in a lower layer of the insulator 214. For example, a structure may be employed in which the conductor 247 is electrically connected to a gate, a source, or a drain of a transistor provided in a lower layer of the insulator 214.

In addition, an opening in which at least part of the conductor 247 is exposed is formed in the insulator 222, the insulator 224, the oxide 230a, and the oxide 230b. The conductor 242a is placed over the oxide 230b and is in contact with at least part of the top surface of the conductor 247 through the opening. Moreover, inside the opening, the conductor 242a may be in contact with the side surface of the oxide 230a and the side surface of the oxide 230b. By connecting the conductor 242a and the conductor 247 in such a manner, electrical resistance between the conductor 247 and the source or the drain of the transistor 200 can be reduced. With such a structure, frequency characteristics of a semiconductor device including the transistor 200 can be improved and favorable electric characteristics can be achieved.

It is preferable that at least part of a circuit element such as a switch, a transistor, a capacitor, an inductor, a resistor, or a diode, a wiring, an electrode, or a terminal, which is electrically connected to the conductor 247, overlap with the oxide 230. This can reduce the area occupied by the transistor 200, the circuit element, the wiring, the electrode, or the terminal in a top view, so that the semiconductor device according to this embodiment can be miniaturized or highly integrated.

The semiconductor device described in this embodiment can be used as a memory cell of a memory device. In this case, the conductor 247 is electrically connected to a sense amplifier in some cases. The sense amplifier does not function in some cases when the parasitic capacitances of the conductor 247 and a wiring for connecting the conductor 247 and the sense amplifier are significantly larger than the electrostatic capacitance of the capacitor 100.

Meanwhile, in the semiconductor device according to this embodiment, the conductor 247 is provided under the oxide 230, whereby the parasitic capacitance is reduced as compared to the case where the conductor 247 is provided over the conductor 242a. When the conductor 247 is provided under the oxide 230, it is unnecessary to lead a wiring over the transistor 200; accordingly, the wiring for connecting the conductor 247 and the sense amplifier can be shortened and thus the parasitic capacitance of the wiring can be reduced. Furthermore, when the conductor 247 is provided under the oxide 230, parasitic capacitance generated between the conductor 247 and the conductor 260 and parasitic capacitance generated between the conductor 247 and the conductor 120 can be reduced.

When the parasitic capacitances of the conductor 247 and the wiring connected to the conductor 247 are reduced in such a manner, electrostatic capacitance required for the capacitor 100 can be reduced. Accordingly, the capacitor 100 can be reduced in size. For example, as illustrated in FIG. 1(A), the capacitor 100 can be provided in some cases so that the capacitor 100 is in the area of the oxide 230b in the top view. In that case, the length of the conductor 110 in the channel width direction is smaller than the length of the oxide 230b in the channel width direction. In such a manner, the capacitor 100 can be provided without increasing the area occupied by the capacitor 100 in the top view, and thus the semiconductor device according to this embodiment can be miniaturized or highly integrated.

Although the conductor 247 is provided under the conductor 242a in FIGS. 1(A) and 1(B), the semiconductor device described in this embodiment is not limited thereto. For example, the conductor 247 may be provided under the conductor 242*b* or the conductor 247 may be provided under both of the conductor 242*a* and the conductor 242*b*.

It is preferable that the insulator 214, the insulator 222, the insulator 256, the insulator 282, and the insulator 281 have a function of inhibiting diffusion of at least one of hydrogen (e.g., a hydrogen atom, a hydrogen molecule, and the like). In addition, it is preferable that the insulator 214, the insulator 222, the insulator 256, the insulator 282, and the insulator 281 have a function of inhibiting diffusion of oxygen (e.g., at least one of an oxygen atom, an oxygen molecule, and the like). For example, the insulator 214, the insulator 222, the insulator 256, the insulator 282, and the insulator 281 each preferably have lower permeability of one or both of oxygen and hydrogen than any one of the insulator 224, the insulator 250, and the insulator 280.

As illustrated in FIG. 1(B), it is preferable that the conductor 242*a* and the conductor 242*b* be provided over the oxide 230*b*, and the insulator 256 be in contact with the top surface and side surface of the conductor 242*a*, the top surface and side surface of the conductor 242*b*, the side surface of the oxide 230*b*, the side surface of the oxide 230*a*, and the top surface of the insulator 224. Note that the insulator 256 may have either a single-layer structure or a stacked-layer structure. Accordingly, the side surfaces of the oxide 230*a* and the oxide 230*b* are not in contact with the conductor 242*a* and the conductor 242*b* in parts except in the opening, that is, the peripheral side surfaces. In addition, the insulator 280 is isolated from the insulator 224, the oxide 230*a*, and the oxide 230*b* by the insulator 256.

The conductor 260 functions as a gate electrode of the transistor and the conductor 242*a* and the conductor 242*b* function as a source electrode and a drain electrode. In the transistor 200, the conductor 260 functioning as the gate electrode is formed in a self-aligned manner to fill an opening formed in the insulator 280 and the like. The formation of the conductor 260 in this manner allows the conductor 260 to be surely placed in a region between the conductor 242*a* and the conductor 242*b* without alignment.

The oxide 230 preferably includes the oxide 230*a* over the insulator 224, the oxide 230*b* over the oxide 230*a*, and the oxide 230*c* which is placed over the oxide 230*b* and at least partly in contact with a top surface of the oxide 230*b*.

Note that in the transistor 200, in the region where a channel is formed (hereinafter also referred to as a channel formation region) and its vicinity, the oxide 230 has a stacked-layer structure of three layers of the oxide 230*a*, the oxide 230*b*, and the oxide 230*c*; however, the present invention is not limited thereto. For example, the oxide 230 may have a single-layer structure of the oxide 230*b*, a two-layer structure of the oxide 230*b* and the oxide 230*a*, a two-layer structure of the oxide 230*b* and the oxide 230*c*, or a stacked-layer structure of four or more layers is provided. Alternatively, the oxide 230*a*, the oxide 230*b*, and the oxide 230*c* may each have a stacked-layer structure of two or more layers.

In the transistor 200, as the oxide 230 (the oxide 230*a*, the oxide 230*b*, and the oxide 230*c*), which includes the channel formation region, a metal oxide functioning as an oxide semiconductor (hereinafter also referred to as an oxide semiconductor) is preferably used.

The transistor 200 using an oxide semiconductor in the channel formation region has an extremely low leakage current (off-state current) in a non-conduction state; thus, a semiconductor device with low power consumption can be provided. An oxide semiconductor can be deposited by a sputtering method or the like, and thus can be used for the transistor 200 included in a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 230, an In—Ga oxide or an In—Zn oxide may be used.

Here, when the oxide 230 contains impurities such as hydrogen, nitrogen, and a metal element, the carrier density may increase and the resistance may be lowered. Furthermore, when the oxygen concentration in the oxide 230 decreases, the carrier density may increase and the resistance may be lowered.

When the conductor 242 (the conductor 242*a* and the conductor 242*b*) that is provided over and in contact with the oxide 230*b* and functions as the source electrode and the drain electrode has a function of absorbing oxygen in the oxide 230 or has a function of supplying impurities such as hydrogen, nitrogen, and a metal element to the oxide 230, a low-resistance region is partly formed in the oxide 230 in some cases. The conductor 242 is formed over the oxide 230*b* and is not in contact with the side surfaces of the oxide 230*a* and the oxide 230*b* and the insulator 224 in parts except in the opening reaching the conductor 247, that is, the peripheral side surfaces. Therefore, oxidation of the conductor 242 due to oxygen contained in at least one of the oxide 230*a*, the oxide 230*b*, and the insulator 224 can be suppressed. In addition, oxygen contained in the oxide 230*a* and the oxide 230*b*, particularly in the channel formation region and its vicinity can be prevented from being absorbed into the conductor 242 from the side surfaces of the oxide 230*a* and the oxide 230*b*.

The insulator 256 is provided so that the side surfaces of the oxide 230*a* and the oxide 230*b* are not directly in contact with the insulator 280. Moreover, the insulator 256 is provided to inhibit oxidation of the conductor 242. Note that in the case where the conductor 242 is an oxidation-resistance material or in the case where the conductivity of the conductor 242 is not significantly decreased even when the conductor 242 absorbs oxygen, the insulator 256 does not need to have an effect of inhibiting oxidation of the conductor 242.

The insulator 256 can inhibit supply of oxygen contained in the insulator 280 from the side surfaces of the oxide 230*a* and the oxide 230*b*.

Figure 2:
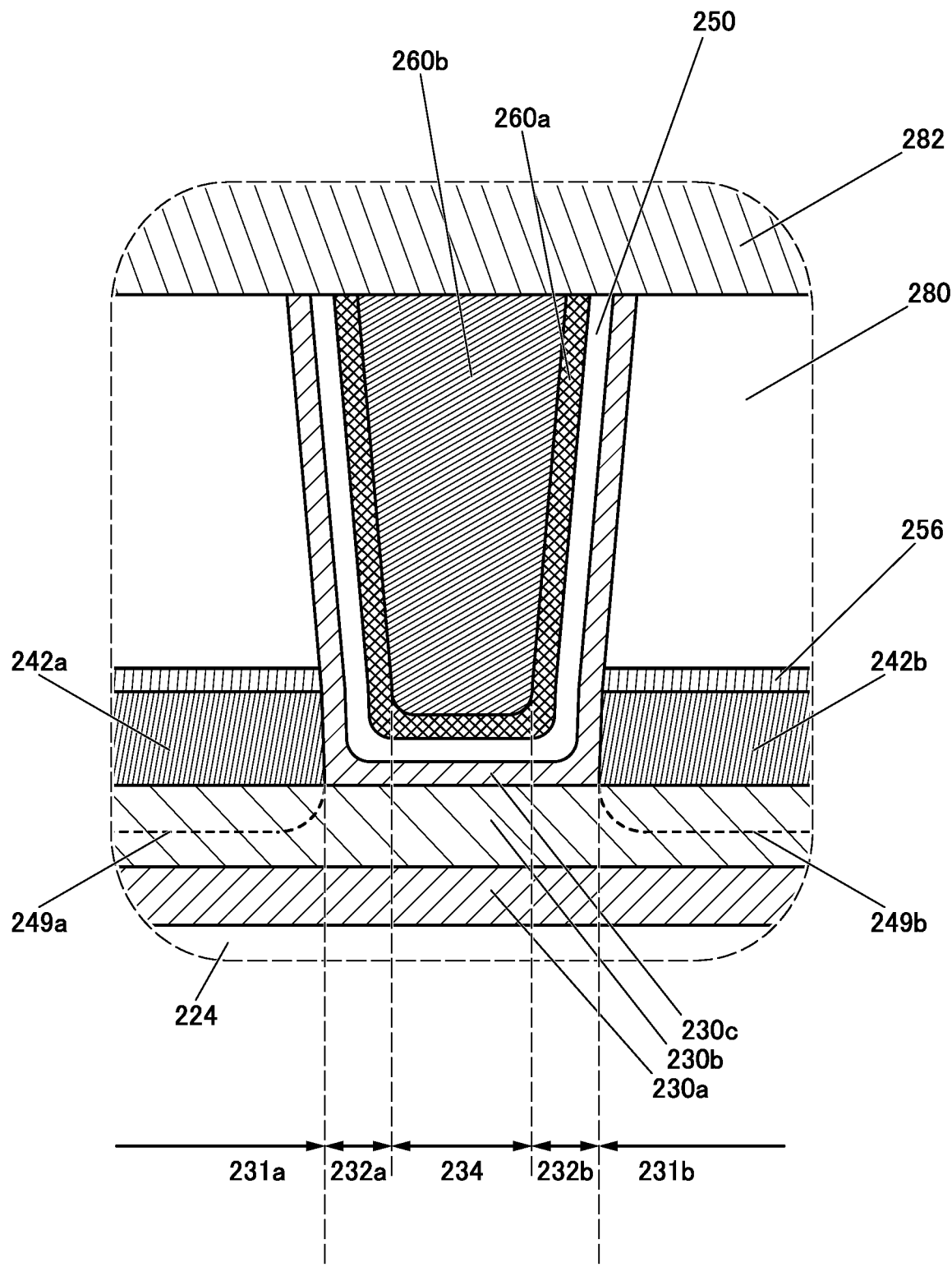
FIG. 2 A cross-sectional view of a semiconductor device according to one embodiment of the present invention.
Figure 3A:
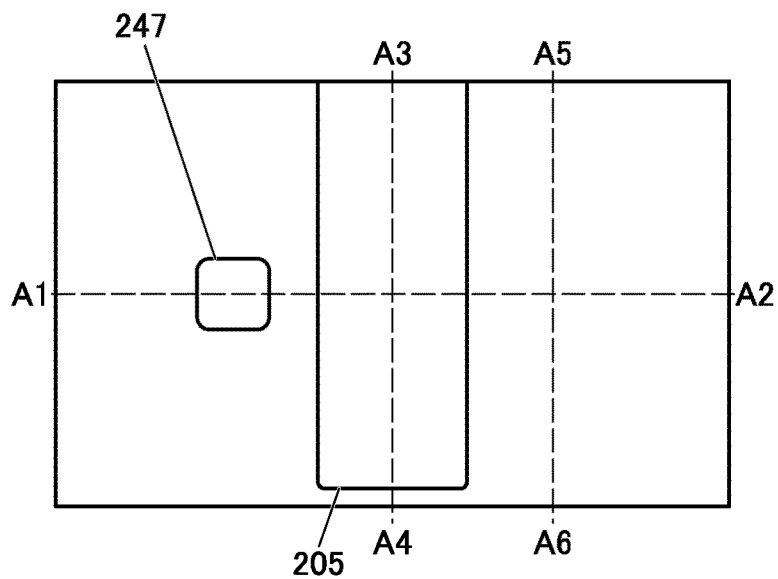
FIG. 3(A) to (D) A top view and cross-sectional views illustrating a method for manufacturing a semiconductor device according to one embodiment of the present invention.
Figure 3C:
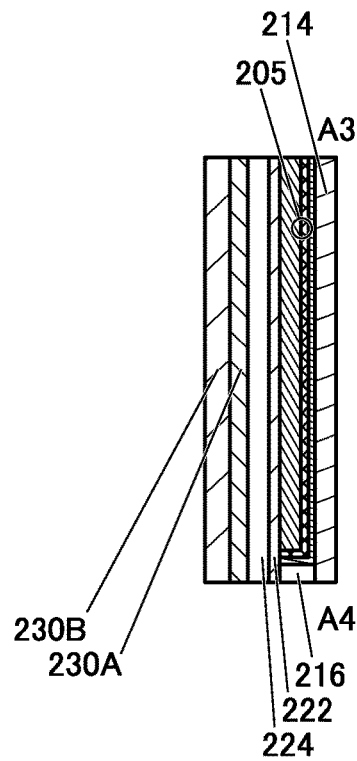
Figure 3B:
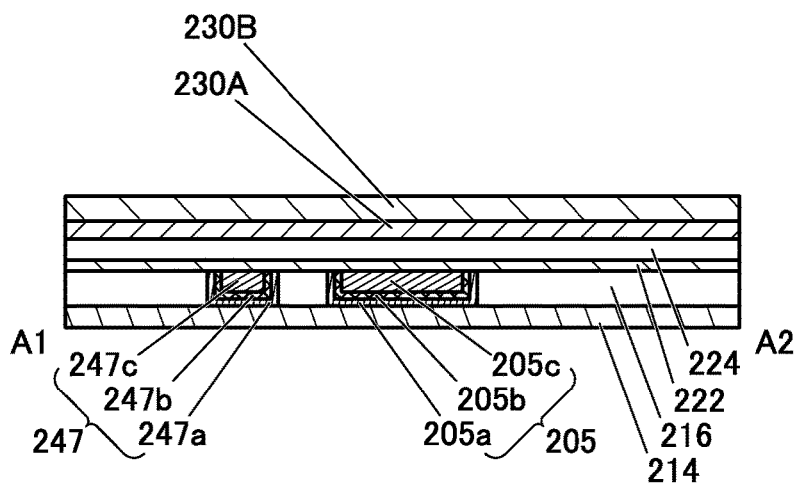
Figure 3D:
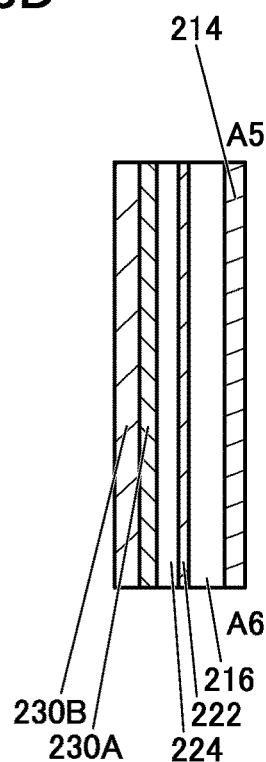
Figure 4A:
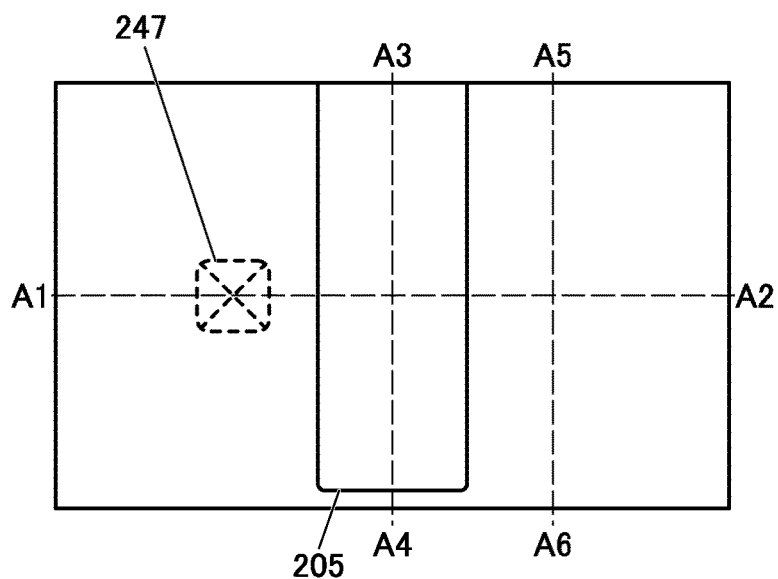
FIG. 4(A) to (D) A top view and cross-sectional views illustrating a method for manufacturing a semiconductor device according to one embodiment of the present invention.
Figure 4C:
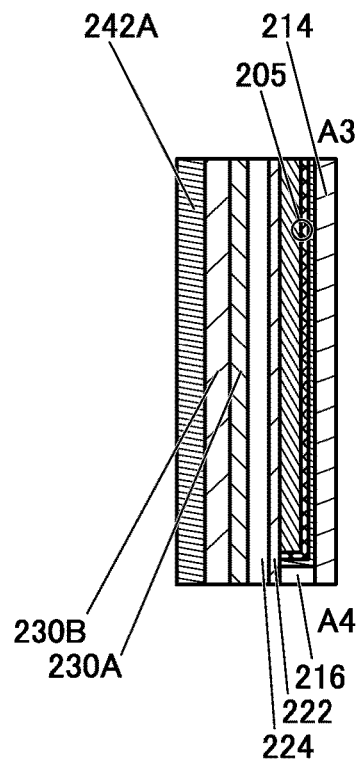
Figure 4B:
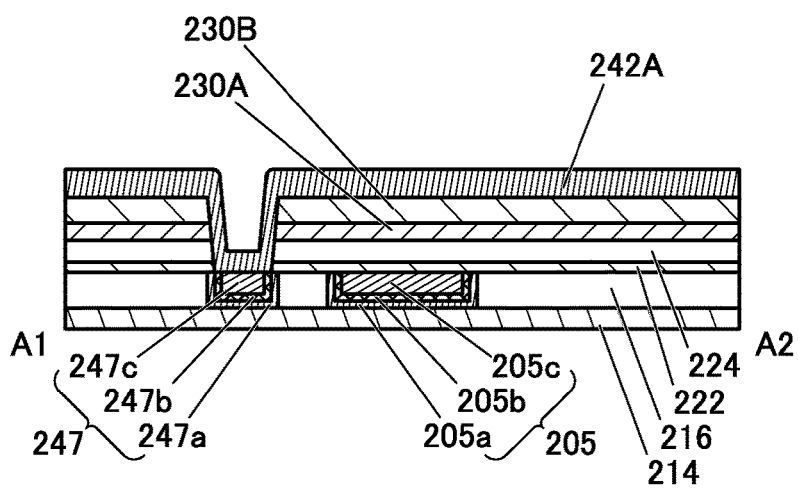
Figure 4D:
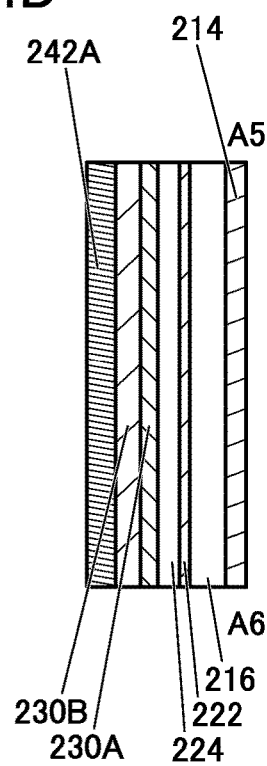
Figure 5A:
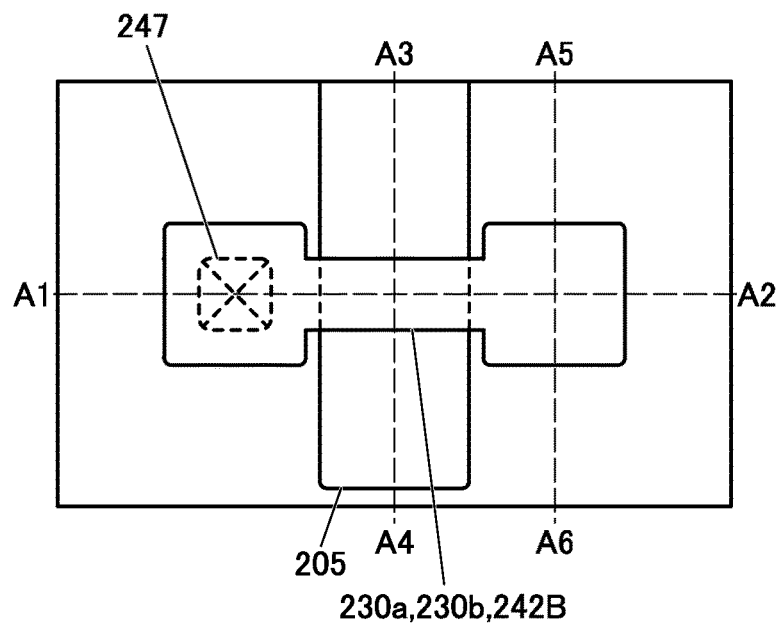
FIG. 5(A) to (D) A top view and cross-sectional views illustrating a method for manufacturing a semiconductor device according to one embodiment of the present invention.
Figure 5C:
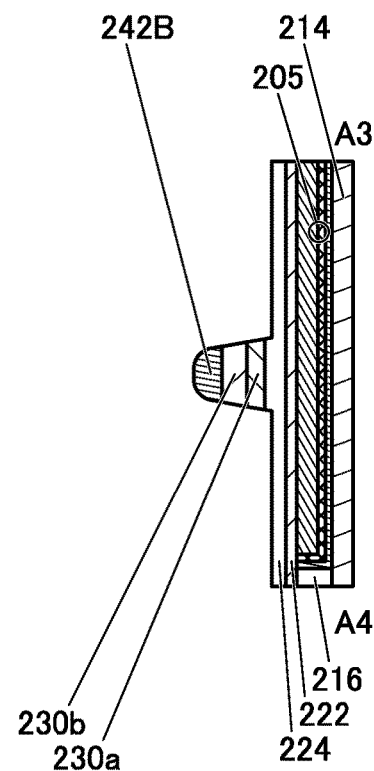
Figure 5B:
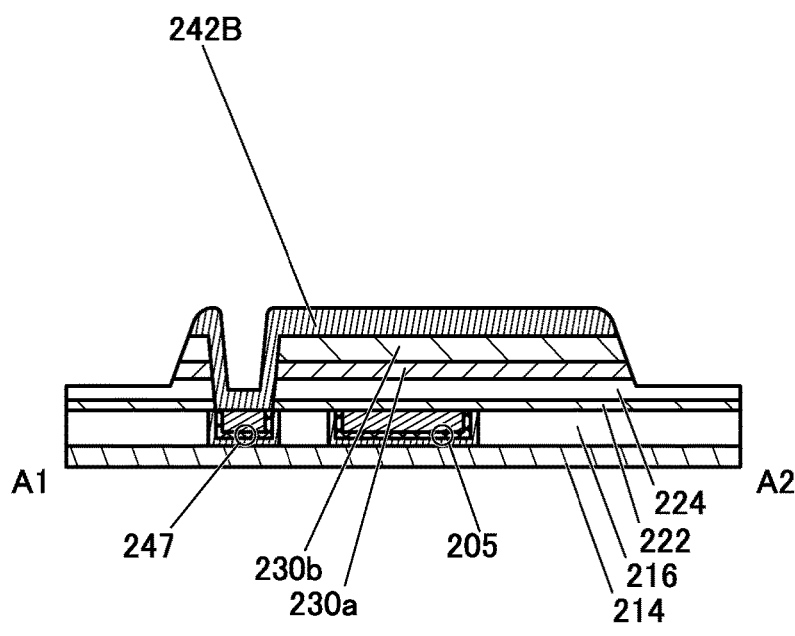
Figure 5D:
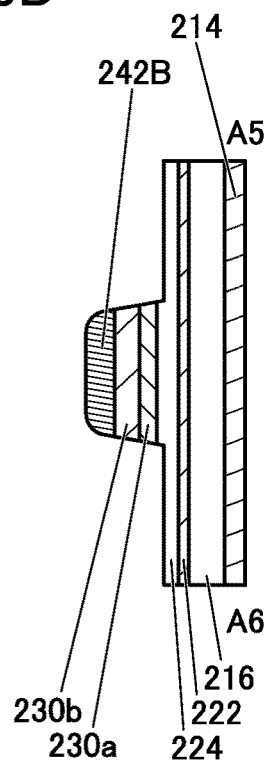
Figure 6A:
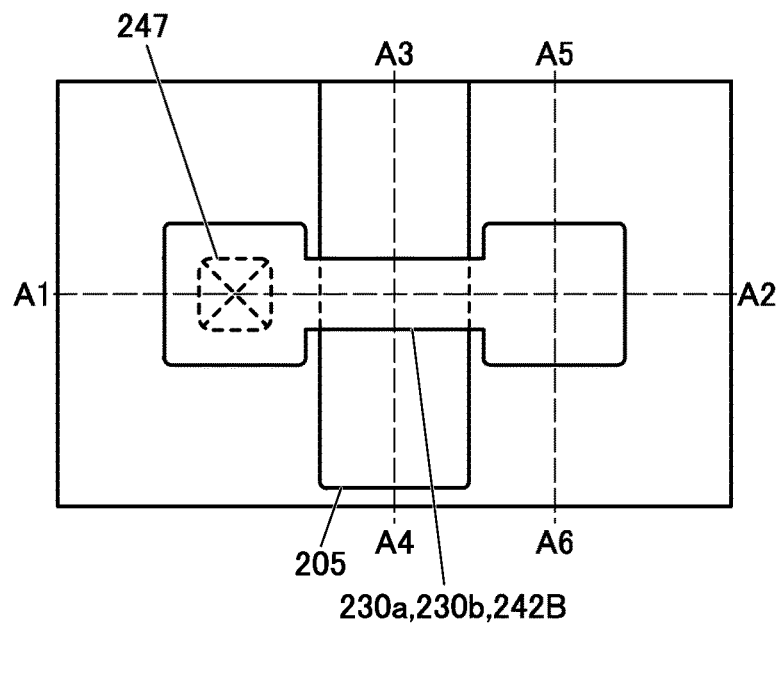
FIG. 6(A) to (D) A top view and cross-sectional views illustrating a method for manufacturing a semiconductor device according to one embodiment of the present invention.
Figure 6C:
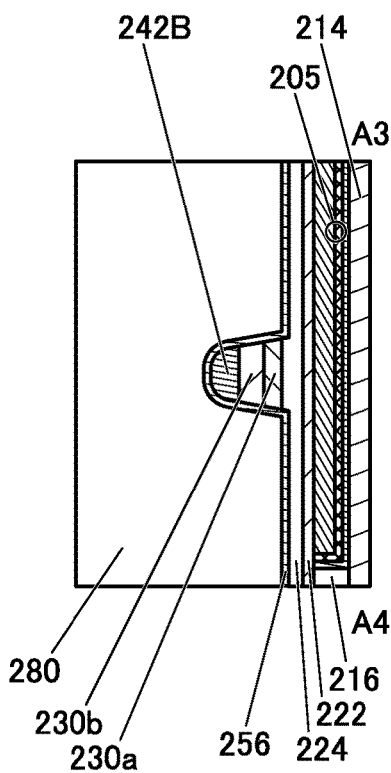
Figure 6B:
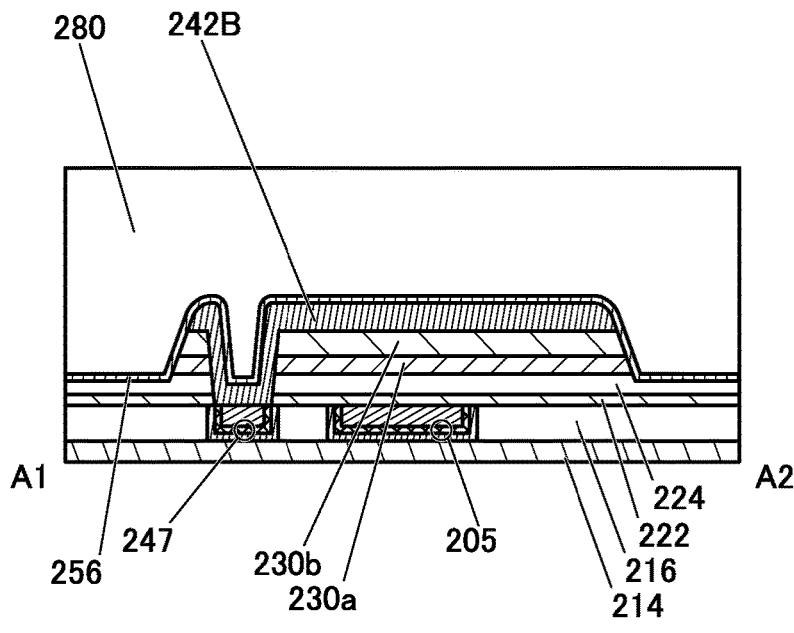
Figure 6D:
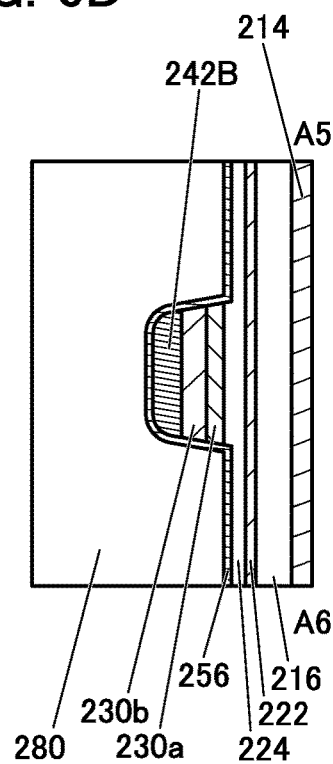
Figure 7A:
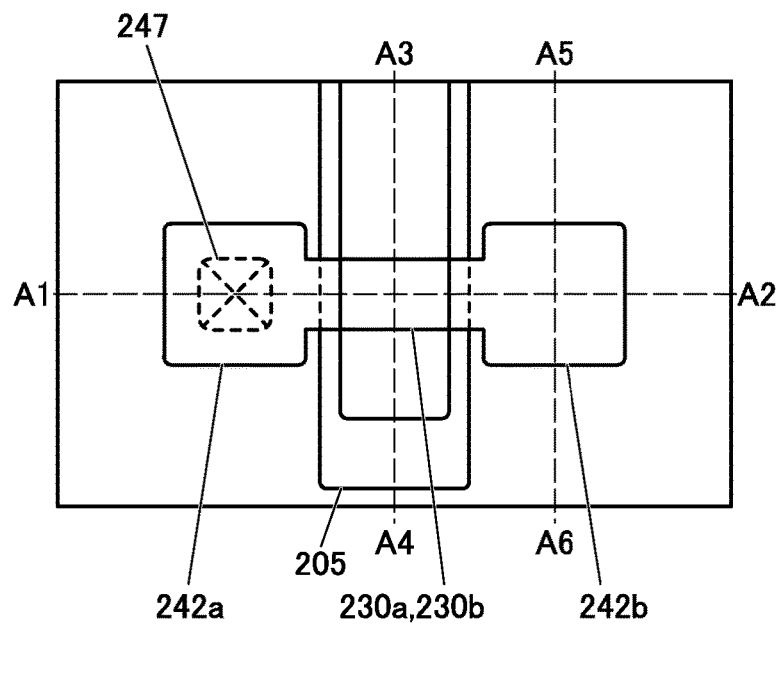
FIG. 7(A) to (D) A top view and cross-sectional views illustrating a method for manufacturing a semiconductor device according to one embodiment of the present invention.
Figure 7B:
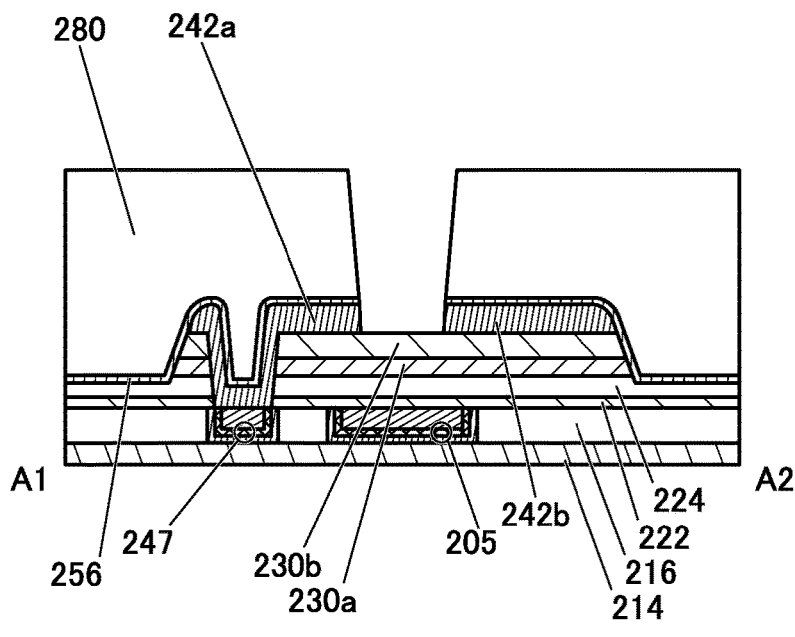
Figure 7C:
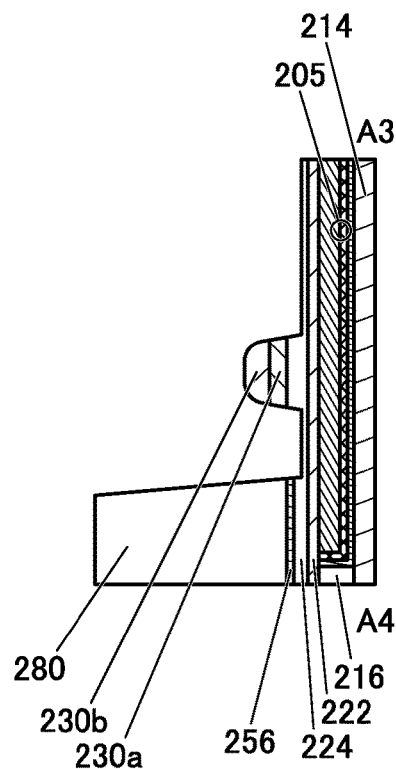
Figure 7D:
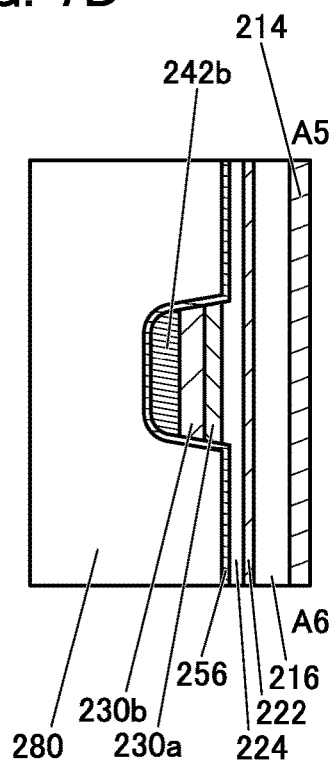
Figure 8A:
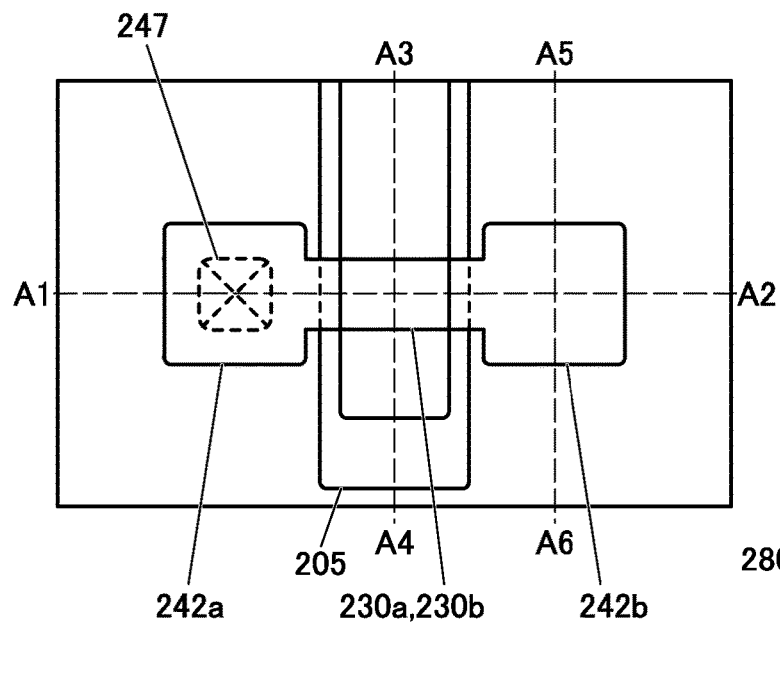
FIG. 8(A) to (D) A top view and cross-sectional views illustrating a method for manufacturing a semiconductor device according to one embodiment of the present invention.
Figure 8C:
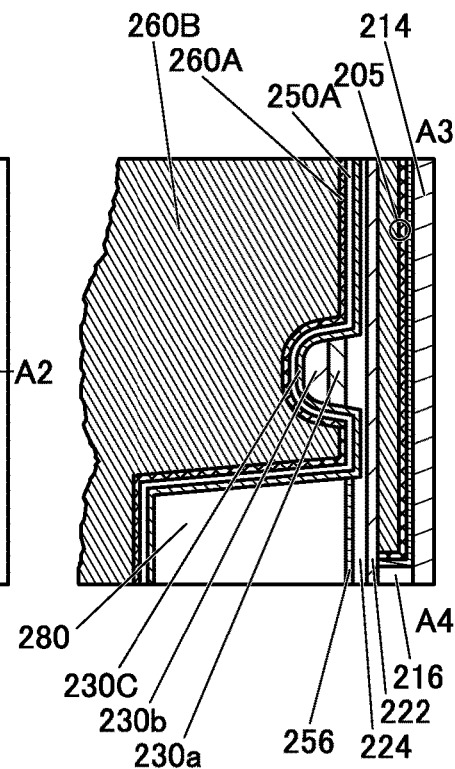
Figure 8B:
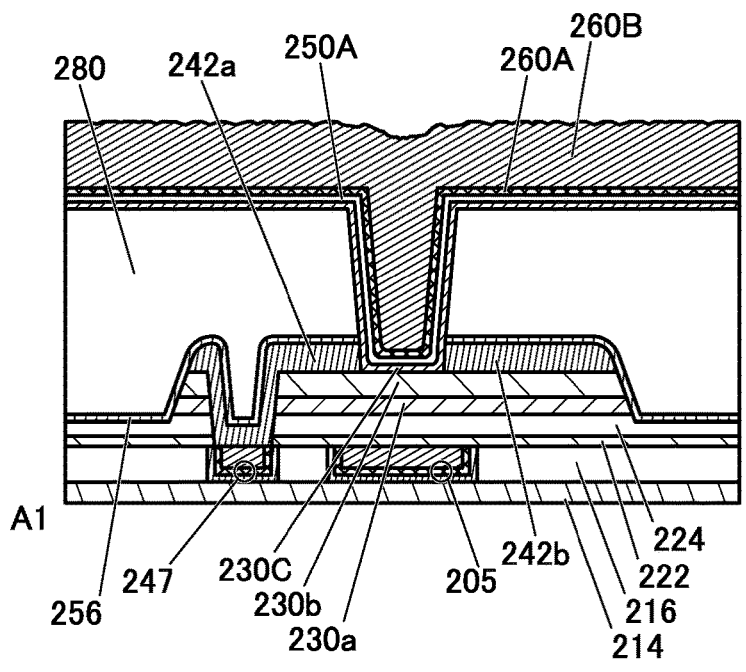
Figure 8D:
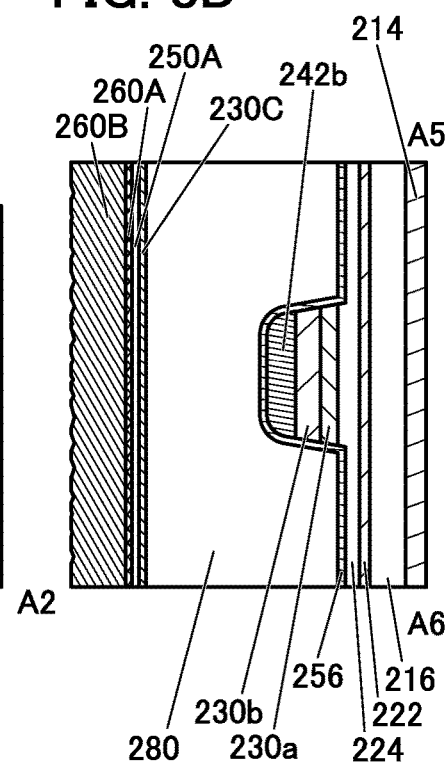
Figure 9A:
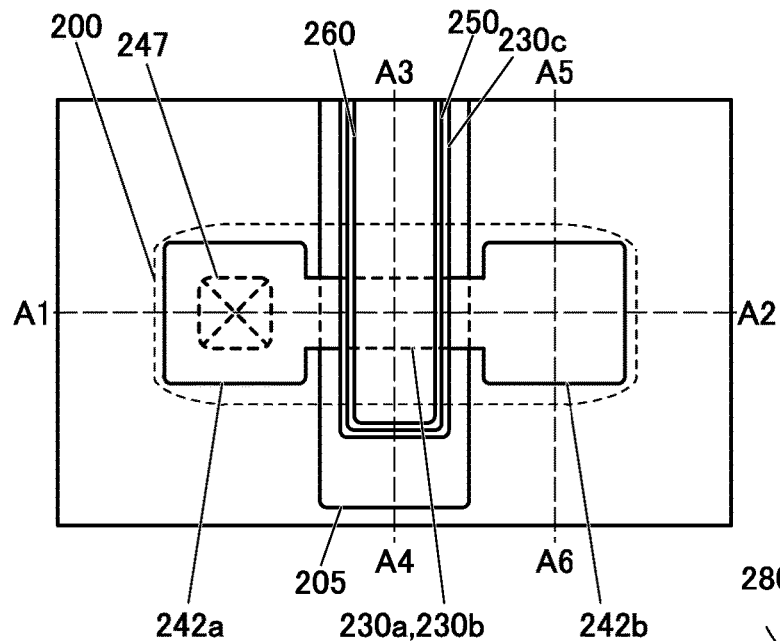
FIG. 9(A) to (D) A top view and cross-sectional views illustrating a method for manufacturing a semiconductor device according to one embodiment of the present invention.
Figure 9C:
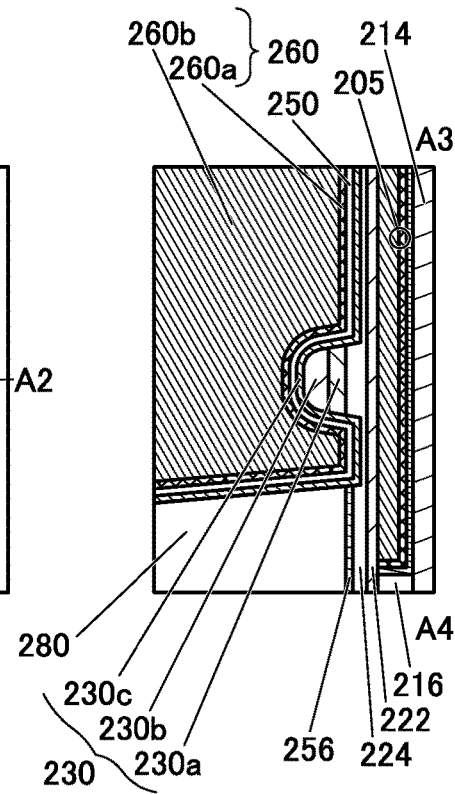
Figure 9B:
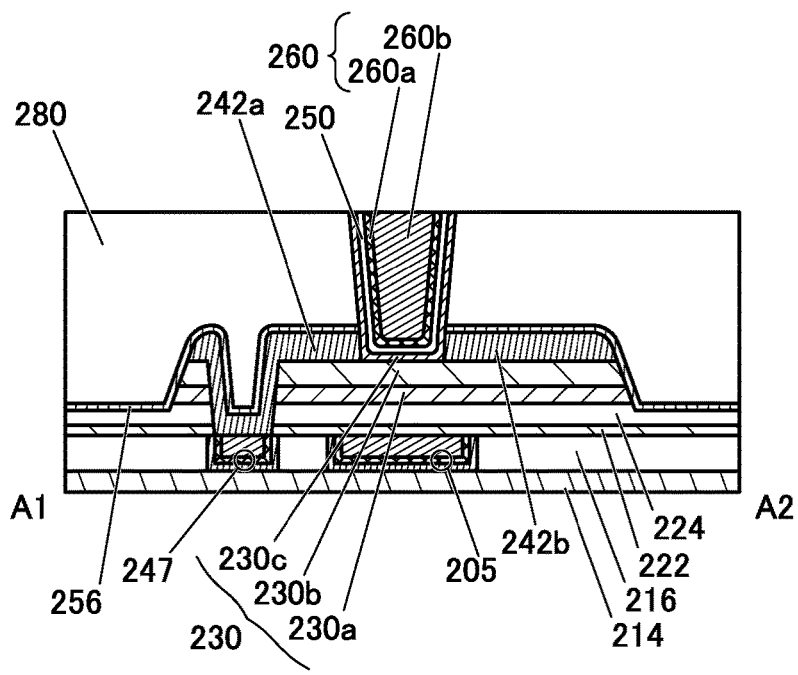
Figure 9D:
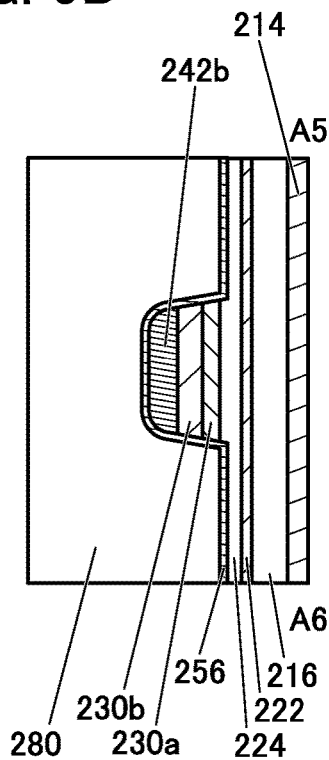
Figure 10A:
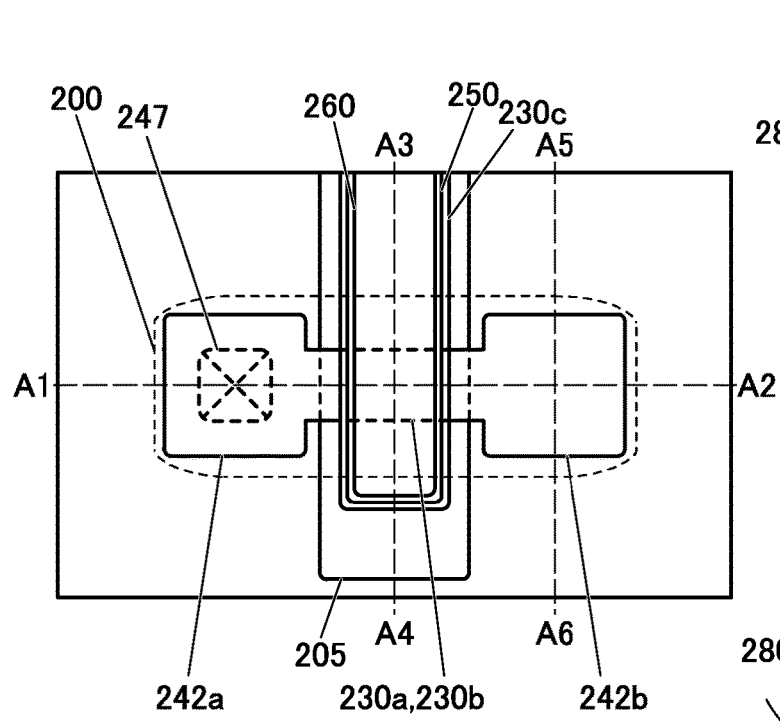
FIG. 10(A) to (D) A top view and cross-sectional views illustrating a method for manufacturing a semiconductor device according to one embodiment of the present invention.
Figure 10C:
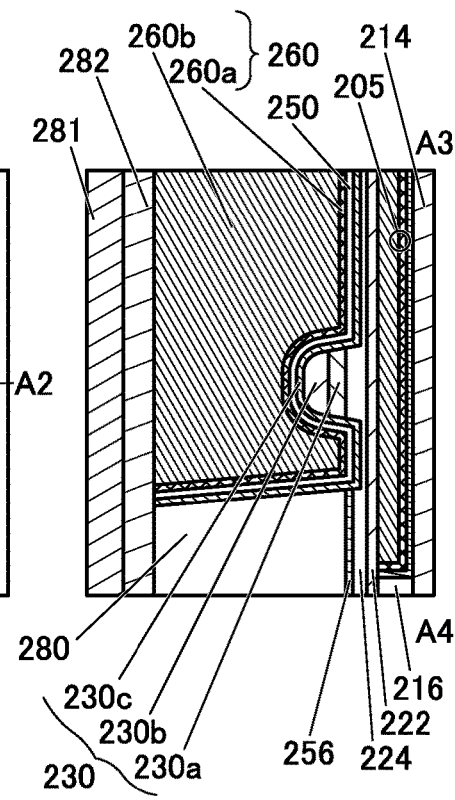
Figure 10B:
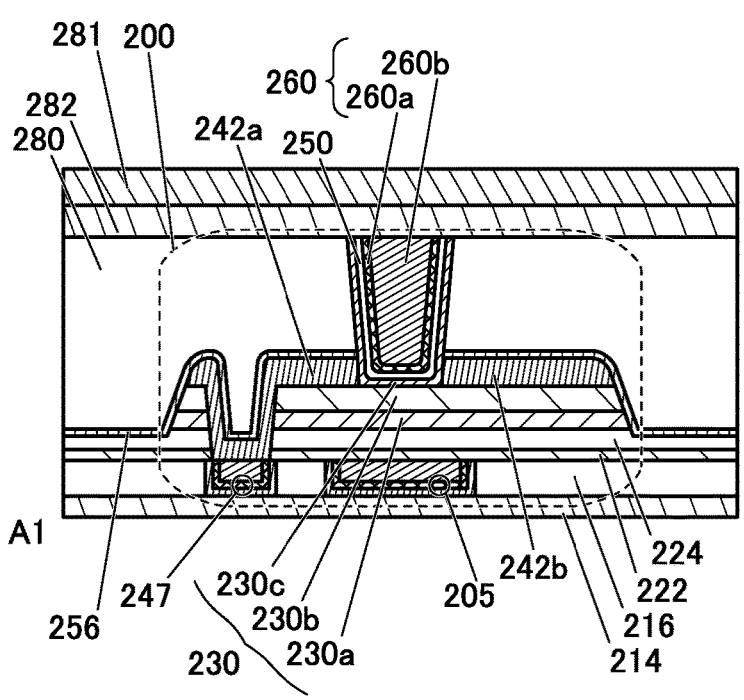
Figure 10D:
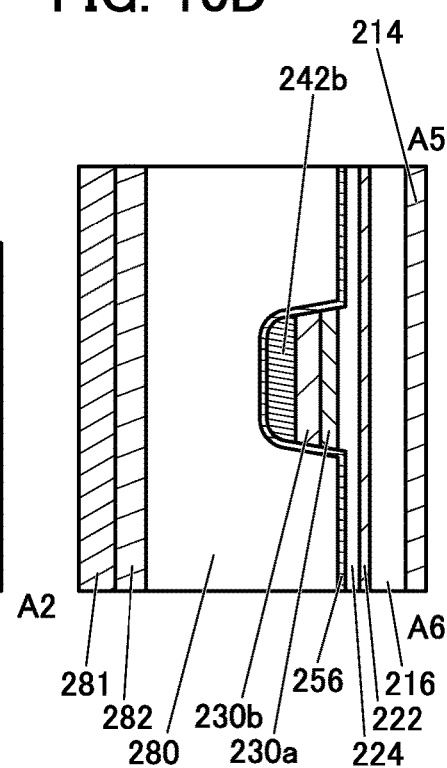
Figure 11A:
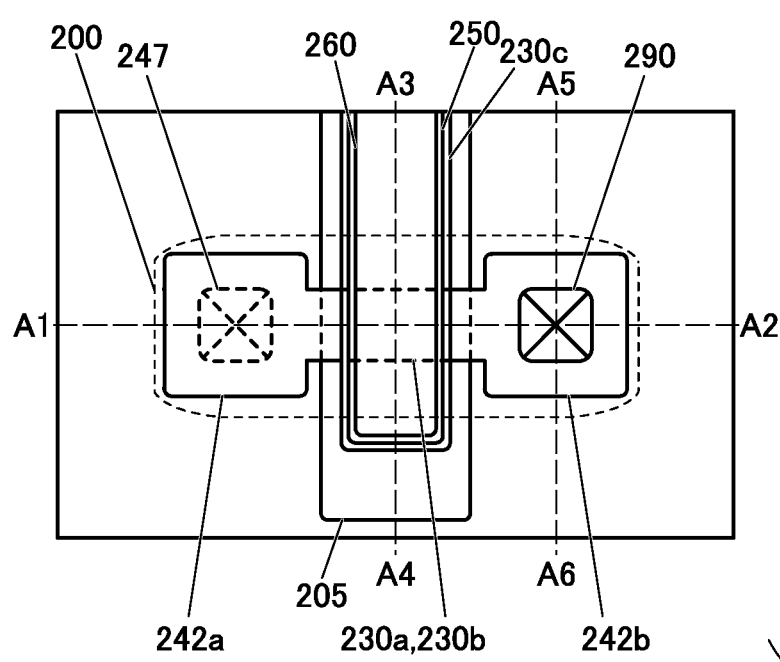
FIG. 11(A) to (D) A top view and cross-sectional views illustrating a method for manufacturing a semiconductor device according to one embodiment of the present invention.
Figure 11C:
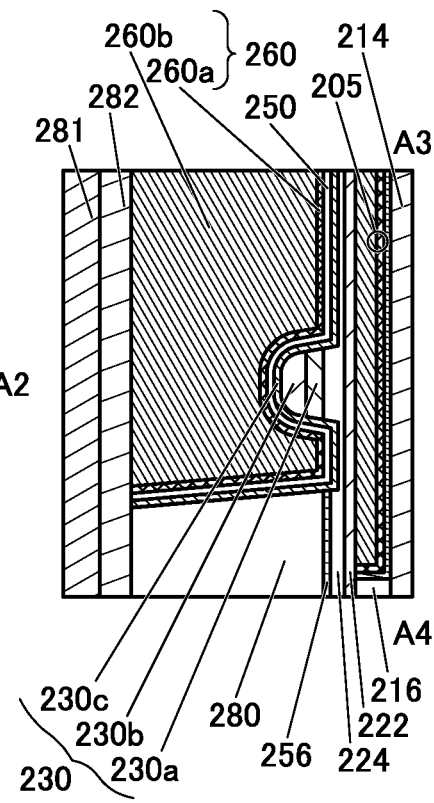
Figure 11B:
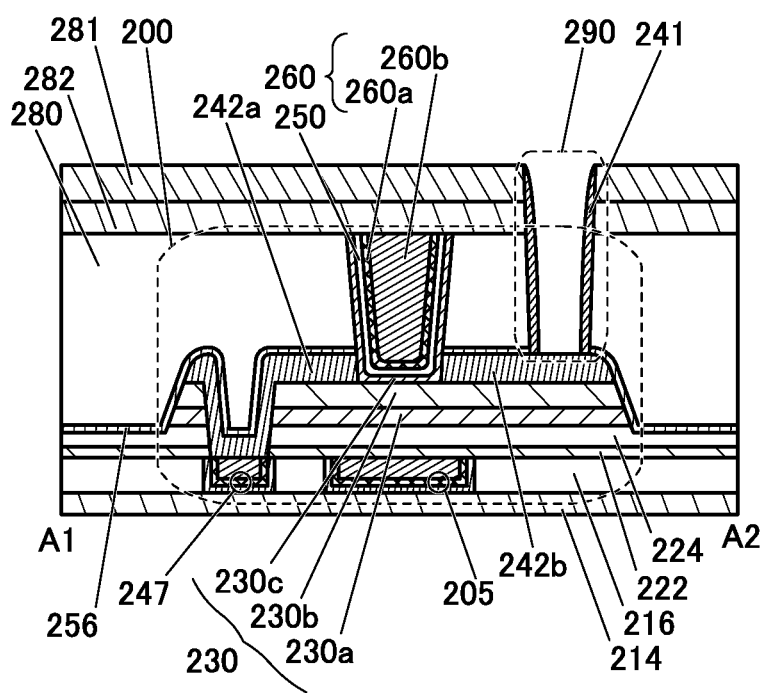
Figure 11D:
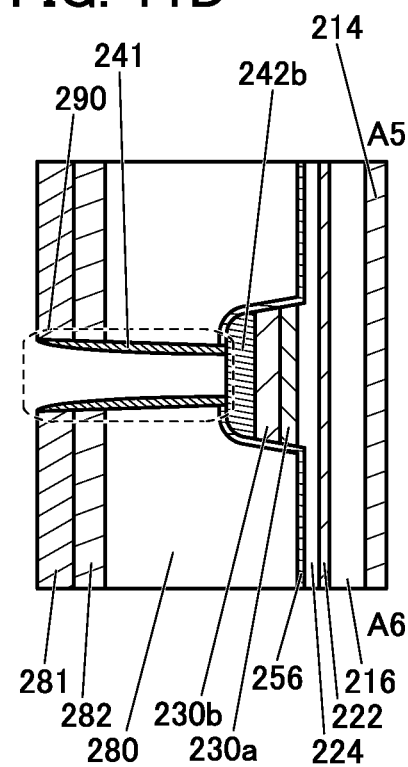
Figure 12A:
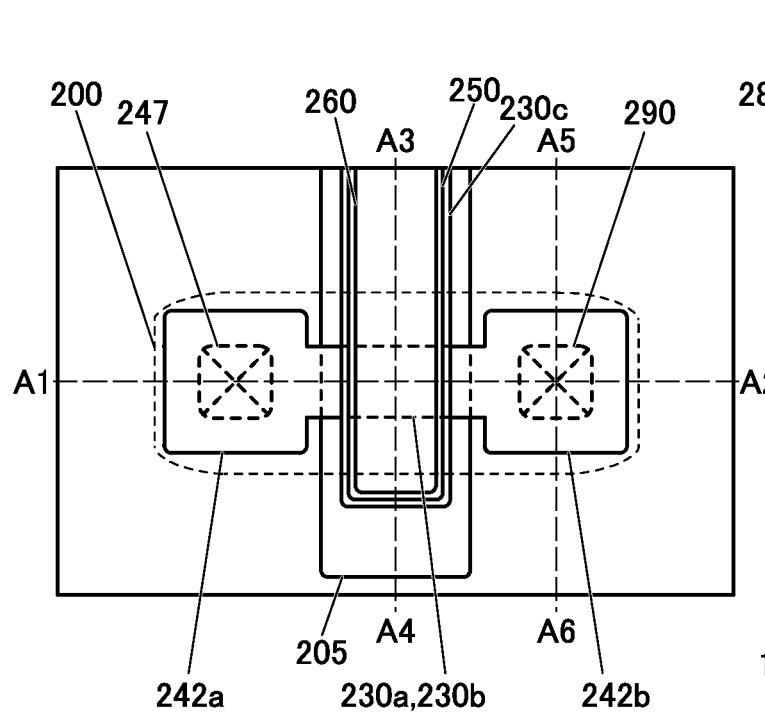
FIG. 12(A) to (D) A top view and cross-sectional views illustrating a method for manufacturing a semiconductor device according to one embodiment of the present invention.
Figure 12C:
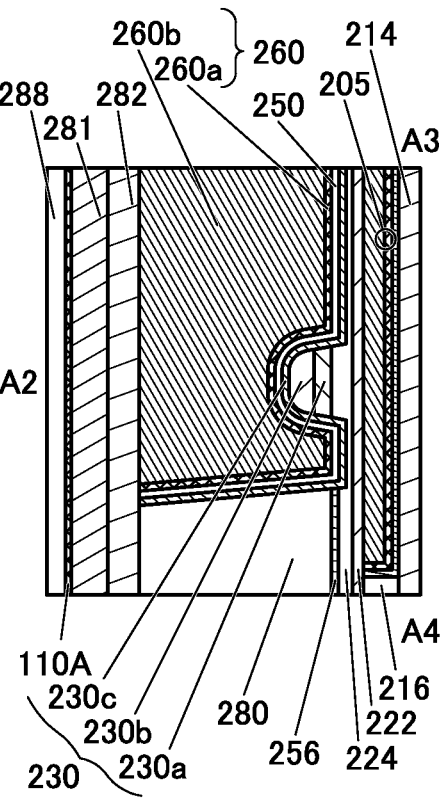
Figure 12B:
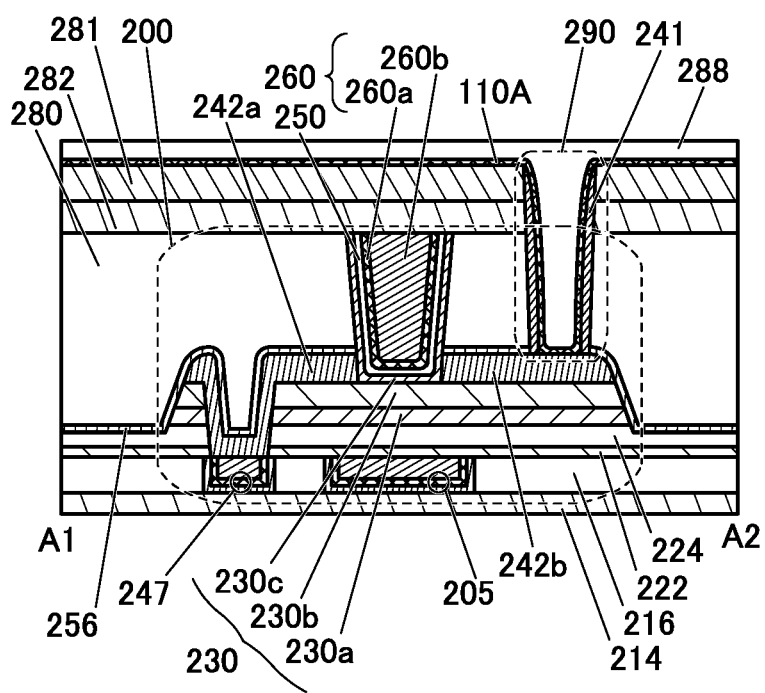
Figure 12D:
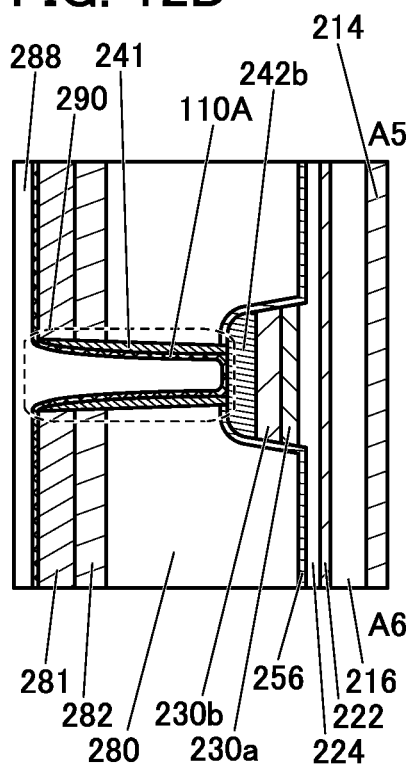
Figure 13A:
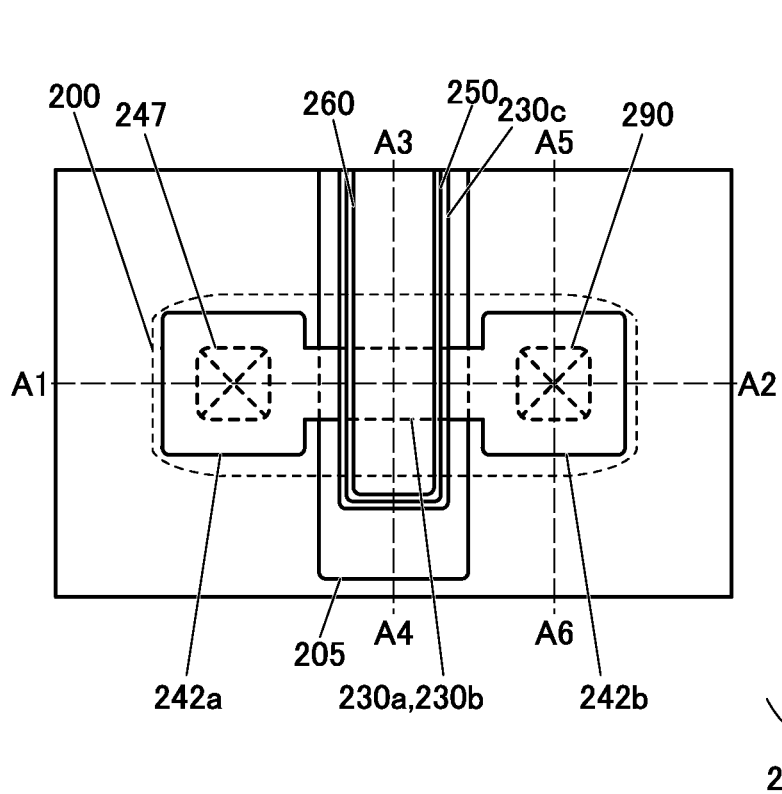
FIG. 13(A) to (D) A top view and cross-sectional views illustrating a method for manufacturing a semiconductor device according to one embodiment of the present invention.
Figure 13C:
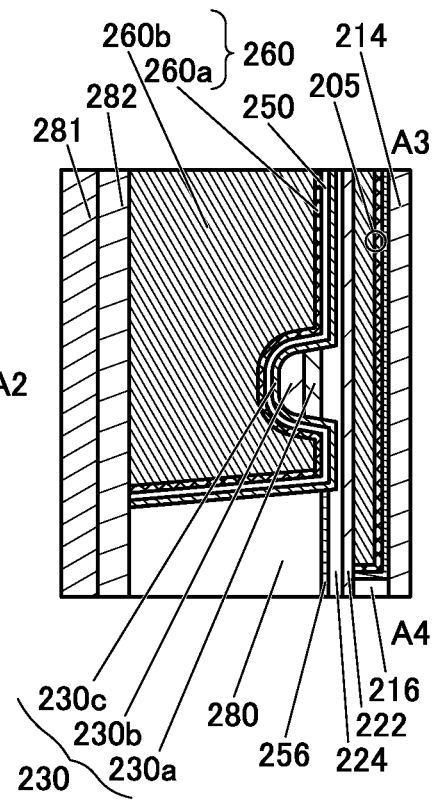
Figure 13B:
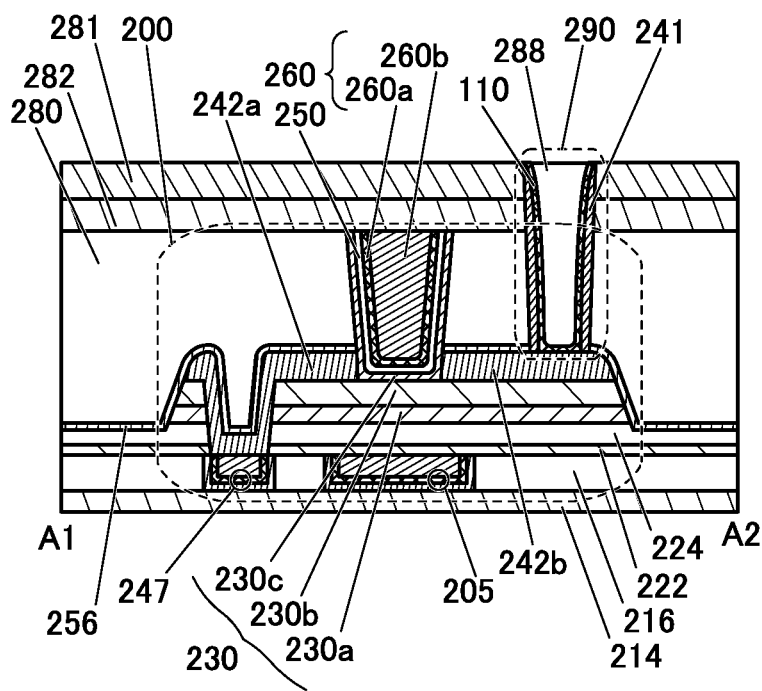
Figure 13D:
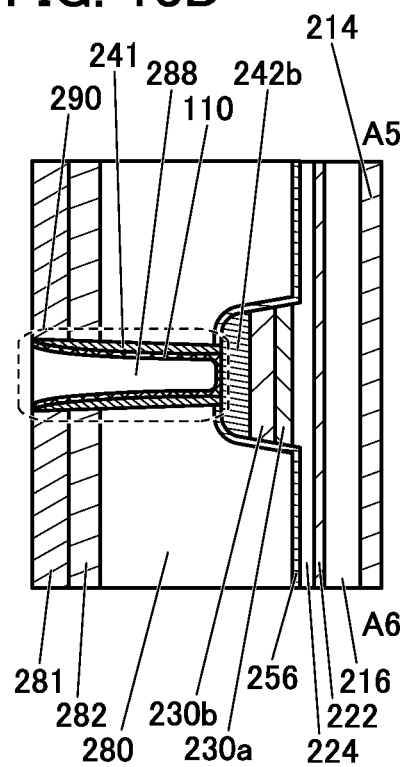
Figure 14A:
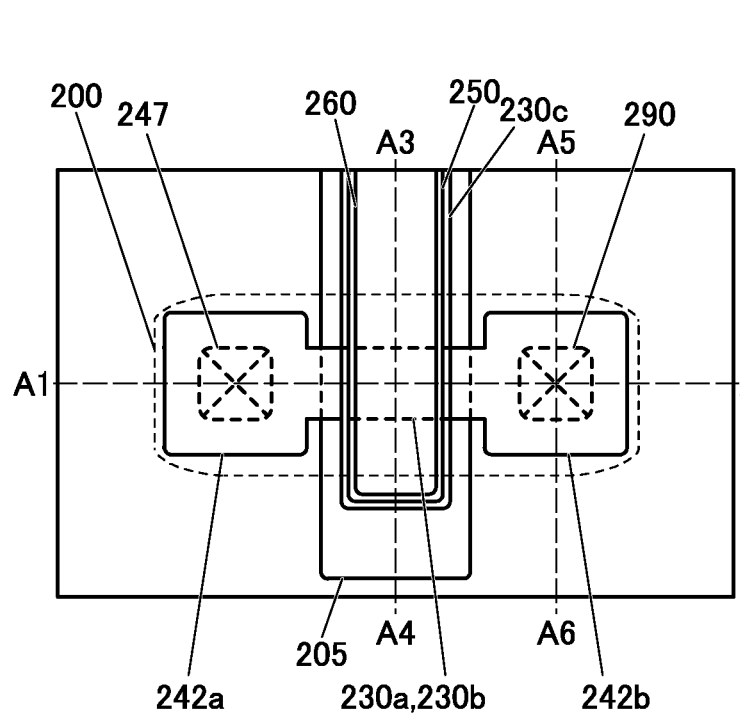
FIG. 14(A) to (D) A top view and cross-sectional views illustrating a method for manufacturing a semiconductor device according to one embodiment of the present invention.
Figure 14C:
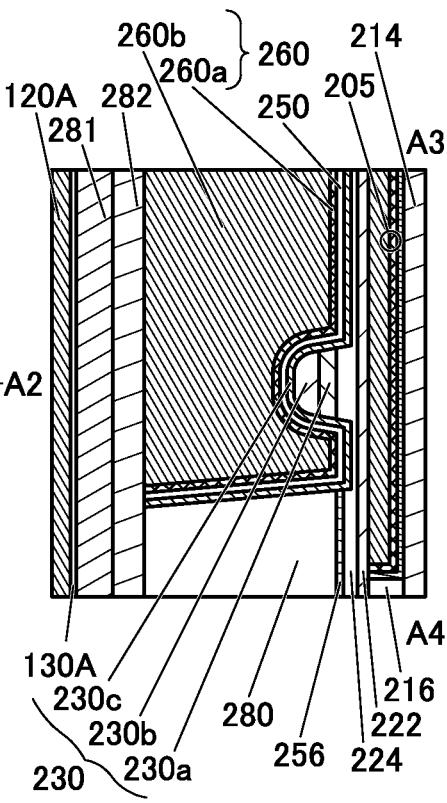
Figure 14B:
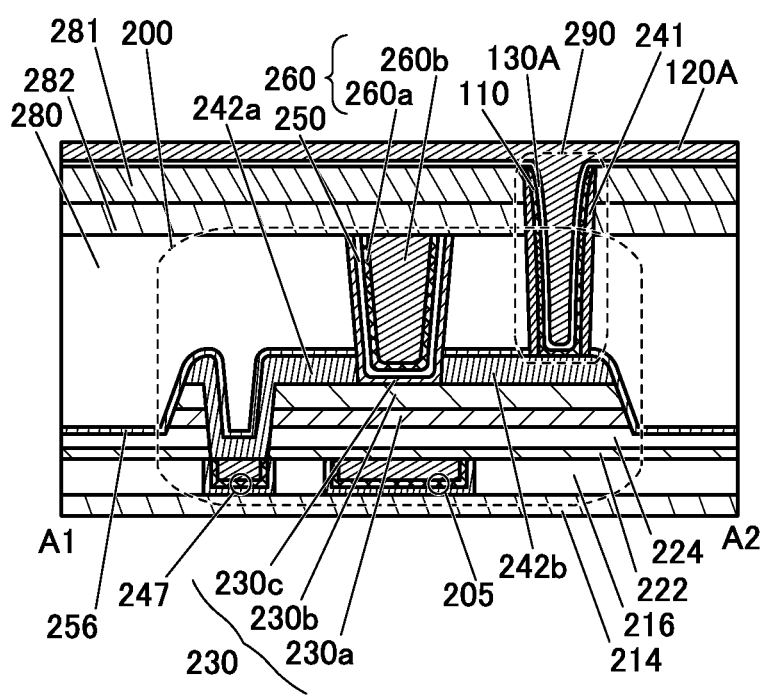
Figure 14D:
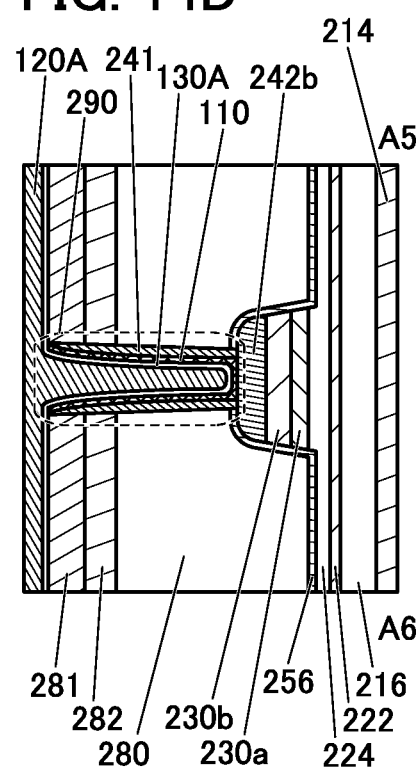
Figure 15A:
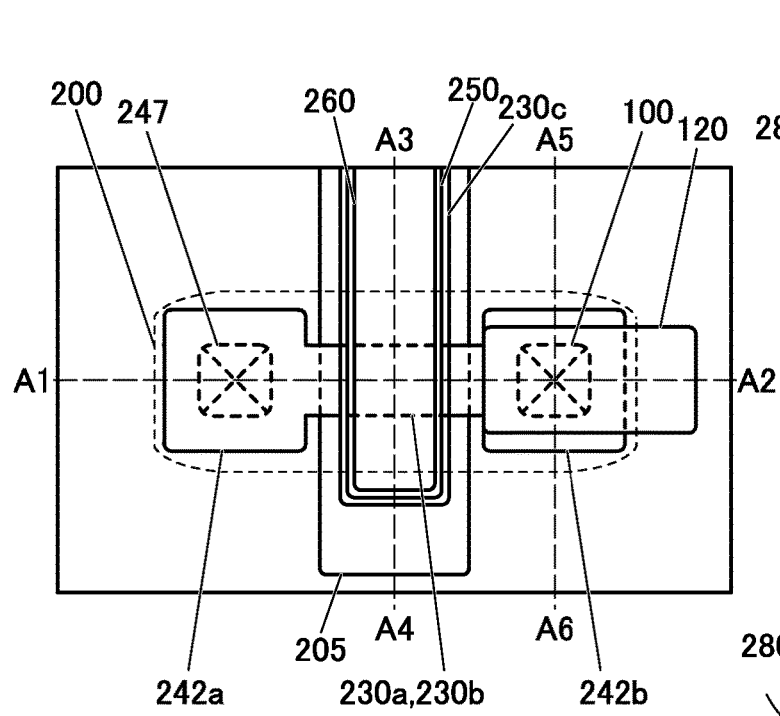
FIG. 15(A) to (D) A top view and cross-sectional views of a semiconductor device according to one embodiment of the present invention.
Figure 15C:
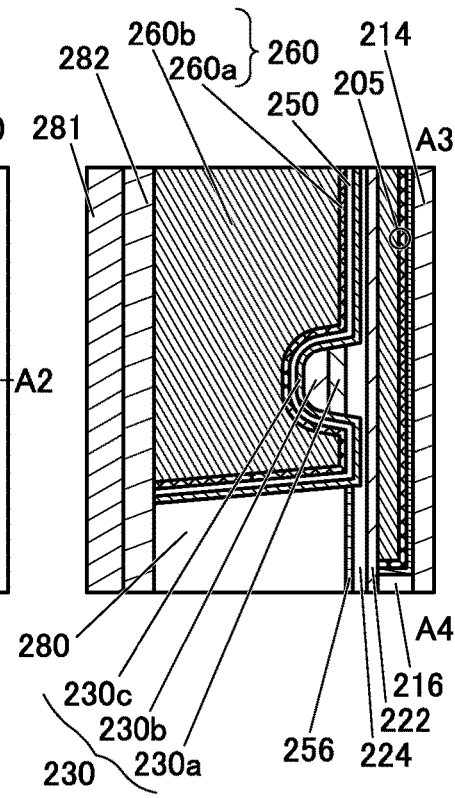
Figure 15B:
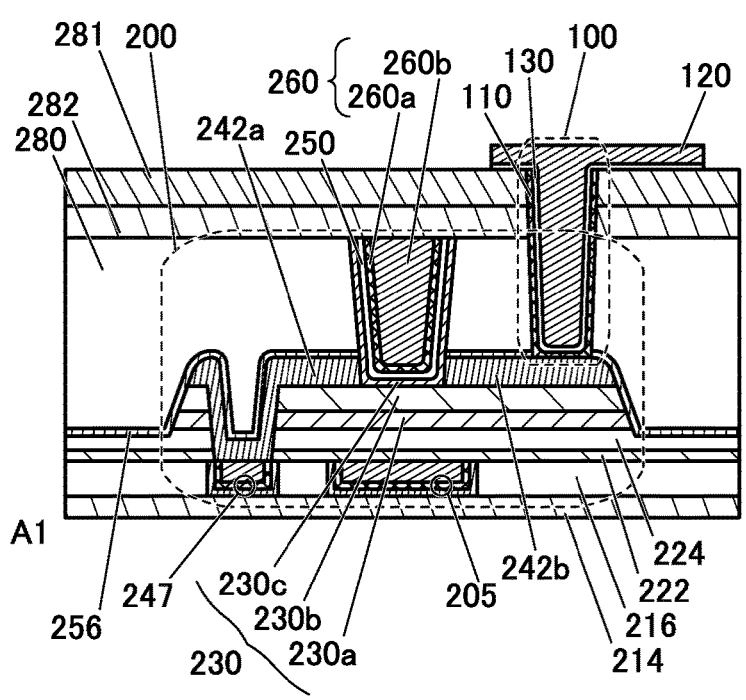
Figure 15D:
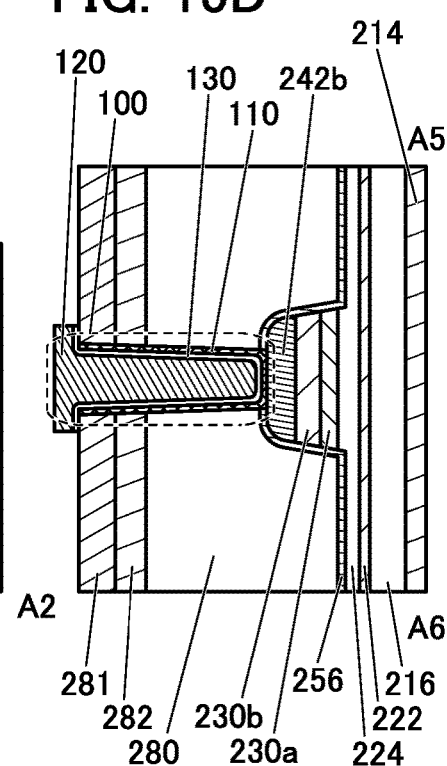

FIG. 2 is an enlarged view of the vicinity of the channel formation region in FIG. 1(B).

As illustrated in FIG. 2, the conductor 242 is provided over and in contact with the oxide 230*b*, and a region 249 (a region 249*a* and a region 249*b*) is formed as a low-resistance region at and near the interface of the oxide 230 with the conductor 242. The oxide 230 includes a region 234 functioning as the channel formation region of the transistor 200, a region 231 (a region 231*a* and a region 231*b*) functioning as the source region or the drain region, and a region 232 (a region 232*a* and a region 232*b*) between the region 234 and the region 231. Here, the region 231 includes the region 249. Although the oxide 230*c* has a single-layer structure in the example of FIG. 2, this embodiment is not limited thereto. The oxide 230*c* may have a stacked-layer structure of two or more layers.

In the region 231 functioning as the source region or the drain region, particularly the region 249 has reduced resistance by having an increased carrier concentration due to a low oxygen concentration or contained impurities such as hydrogen, nitrogen, or a metal element. In other words, the region 231 has higher carrier density and lower resistance than the region 234. Furthermore, the region 234 functioning as a channel formation region is a high-resistance region with a low carrier density because it has a higher oxygen concentration or a lower impurity concentration than specifically the region 249 of the region 231. It is preferable that the oxygen concentration in the region 232 be higher than or equal to the oxygen concentration in the region 231 and lower than or equal to the oxygen concentration in the region 234. Alternatively, it is preferable that the impurity concentration in the region 232 be lower than or equal to the impurity concentration in the region 231 and higher than or equal to the impurity concentration in the region 234.

That is, the region 232 may function as a channel formation region like the region 234 when having resistance substantially equal to that of the region 234, a low-resistance region that has resistance substantially equal to that of the region 231, or a low-resistance region that has higher resistance than the region 231 and lower resistance than the region 234, depending on the concentration of oxygen or impurities contained in the region 232. In particular, in the case where part of the oxide 230 includes a CAAC-OS described later, impurities contained in the region 231 are easily diffused in the a-b plane direction and the resistance of the region 232 is reduced in some cases.

Note that, in the case where the region 249, which is a low-resistance region, contains a metal element, the region 249 preferably contains any one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum in addition to the metal element contained in the oxide 230.

Although the region 249 is formed near the interface of the oxide 230b with the conductor 242 in the thickness direction of the oxide 230b in FIG. 2, this embodiment is not limited thereto. For example, the region 249 may have substantially the same thickness as the oxide 230b or may also be formed in the oxide 230a. Although the region 249 is formed only in the region 231 in FIG. 2, this embodiment is not limited thereto. In the case where impurities are diffused in the a-b plane direction as described above, the region 249 may be formed in the region 231 and the region 232, in the region 231 and part of the region 232, or in the region 231, the region 232, and part of the region 234.

In the oxide 230, the boundaries between the regions are difficult to detect clearly in some cases. The concentrations of a metal element and an impurity element such as hydrogen and nitrogen, which are detected in each region, may be not only gradually changed between the regions, but also continuously changed (also referred to as gradation) in each region. That is, the region closer to the channel formation region has lower concentrations of a metal element and an impurity element such as hydrogen and nitrogen.

To selectively reduce the resistance of the oxide 230, for the conductor 242, a material containing at least one of impurities and metal elements that increase conductivity, such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum is preferably used, for example. Alternatively, a conductive film 242A to be the conductor 242 is formed using a material, a deposition method, or the like that injects impurities such as an element that forms oxygen vacancies or an element trapped by oxygen vacancies into the oxide 230. Examples of the element include hydrogen, boron, carbon, nitrogen, fluorine, phosphorus, sulfur, chlorine, and a rare gas element. Typical examples of the rare gas element include helium, neon, argon, krypton, and xenon.

A transistor using an oxide semiconductor is likely to have its electrical characteristics changed by impurities and oxygen vacancies in a channel formation region of the oxide semiconductor, which may affect the reliability. Moreover, if the channel formation region of the oxide semiconductor includes oxygen vacancies, the transistor tends to have normally-on characteristics. Thus, oxygen vacancies in the region 234 where a channel is formed are preferably reduced as much as possible.

To inhibit the transistor from becoming normally on, the insulator 250 near the oxide 230 preferably contains oxygen more than oxygen in the stoichiometric composition (also referred to as excess oxygen). Oxygen contained in the insulator 250 is diffused into the oxide 230 to reduce oxygen vacancies in the oxide 230 and prevent the transistor from becoming normally on.

That is, oxygen contained in the insulator 250 is diffused into the region 234 of the oxide 230, whereby oxygen vacancies in the region 234 of the oxide 230 can be reduced. Moreover, oxygen contained in the insulator 280 is diffused into the region 234 of the oxide 230 through the oxide 230c, whereby oxygen vacancies in the region 234 of the oxide 230 can be reduced. In that case, the oxide 230c may have a stacked-layer structure and a material that is likely to transmit oxygen may be used for a layer of the oxide 230c that is in contact with the insulator 280. Accordingly, oxygen contained in the insulator 280 is easily diffused into the region 234 of the oxide 230 through the layer of the oxide 230c. Furthermore, when a material that is less likely to transmit oxygen is used for a layer of the oxide 230c that is not in contact with the insulator 280, oxygen contained in the insulator 280 can be prevented from being diffused into the insulator 250 or the conductor 260, and oxygen in the insulator 280 can be efficiently supplied to the region 234 of the oxide 230.

The above-described structure enables the amount of oxygen supplied to the oxide 230 to be adjusted; accordingly, a highly reliable transistor which is prevented from becoming normally-on can be obtained.

As illustrated in FIGS. 1(B) and 1(C), the transistor 200 of one embodiment of the present invention has a structure in which the insulator 282 and the insulator 250 are directly in contact with each other. With such a structure, oxygen contained in the insulator 280 is less likely to be absorbed into the conductor 260. Therefore, oxygen contained in the insulator 280 can be supplied to the oxide 230a and the oxide 230b efficiently through the oxide 230c; hence, oxygen vacancies in the oxide 230a and the oxide 230b can be reduced and the electrical characteristics and the reliability of the transistor 200 can be improved. In addition, the entry of impurities such as hydrogen contained in the insulator 280 into the insulator 250 can be inhibited, which can inhibit the adverse effects on the electrical characteristics and the reliability of the transistor 200. For the insulator 282, silicon nitride, silicon nitride oxide, aluminum oxide, or hafnium oxide can be used. For the insulator 282, it is particularly suitable to use silicon nitride. The silicon nitride can suitably block an impurity (e.g., hydrogen or water) that might enter from the outside.

The insulator 256 preferably has a function of inhibiting the permeation of oxygen and impurities such as hydrogen and water. The insulator 256 may have a single-layer structure or a stacked-layer structure of two or more layers. As the insulator 256, for example, aluminum oxide, hafnium oxide, a silicon oxide film, a silicon nitride film, or a silicon nitride oxide film can be used. In the case where the insulator 256 has a stacked-layer structure, the same material or different materials may be used for an upper layer and a lower layer. When the insulator 256 has a stacked-layer structure and the same material is used for the upper layer and the lower layer, the upper layer and the lower layer of the insulator 256 may be formed by different deposition methods. For example, the lower layer of the insulator 256 may be formed by a sputtering method, and the upper layer of the insulator 256 may be formed by an ALD (Atomic Layer Deposition) method. Alternatively, the lower layer of the insulator 256 may be formed by an ALD method, and the upper layer of the insulator 256 may be formed by a sputtering method. For the insulator 256, a material that can be used for the oxide 230 may be used. In that case, a metal oxide with In:Ga: Zn=1:3:4 [atomic ratio] or 1:1:0.5 [atomic ratio], which is an oxide that is less likely to transmit oxygen, is used for the insulator 256.

FIG. 1(D) is a cross-sectional view of a portion indicated by the dashed-dotted line A5-A6 in FIG. 1(A), and is also a cross-sectional view of the source region or the drain region of the transistor 200 in the channel width direction. As illustrated in FIG. 1(D), a structure is employed in which the top surface of the conductor 242b and the side surface of the conductor 242b are covered with the insulator 256; thus, oxygen and impurities such as hydrogen and water can be inhibited from being diffused into the conductor 242b from the side surface direction of the conductor 242b and the top surface direction of the conductor 242b. Diffusion of oxygen from the periphery of the conductor 242b into the conductor 242b can be inhibited, so that the oxidation of the conductor 242b can be inhibited. Note that a similar effect can also be obtained with the conductor 242a. Impurities such as hydrogen and water can be inhibited from being diffused into the oxide 230a and the oxide 230b from the side surface direction of the oxide 230a and the side surface direction of the oxide 230b.

As illustrated in FIG. 1(C), when a bottom surface of the insulator 224 is used as a reference, the level of the bottom surface of the conductor 260 in a region where the oxide 230a and the oxide 230b do not overlap with the conductor 260 is preferably placed lower than the level of a bottom surface of the oxide 230b. The difference between the level of the bottom surface of the conductor 260 in a region where the oxide 230b does not overlap with the conductor 260 and the level of the bottom surface of the oxide 230b is set to greater than or equal to 0 nm and less than or equal to 100 nm, preferably greater than or equal to 3 nm and less than or equal to 50 nm, further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 positioned therebetween; this enables the electrical field of the conductor 260 to easily affect the entire oxide 230b of the channel formation region. Consequently, the on-state current of the transistor 200 can be increased and the frequency characteristics can be improved.

Accordingly, a semiconductor device that is miniaturized or highly integrated can be provided. Alternatively, a semiconductor device that includes a transistor with a high on-state current can be provided. Alternatively, a semiconductor device that includes a transistor with favorable frequency characteristics can be provided. Alternatively, a semiconductor device that has stable electrical characteristics with a small variation in electrical characteristics and improved reliability can be provided. Alternatively, a semiconductor device that includes a transistor with a low off-state current can be provided.

The detailed structure of the semiconductor device of one embodiment of the present invention including the transistor 200 will be described below.

The conductor 205 is placed to overlap with the oxide 230 and the conductor 260. Furthermore, the conductor 205 is preferably embedded in the insulator 216.

Here, the conductor 260 sometimes functions as a first gate (also referred to as a top gate) electrode. The conductor 205 sometimes functions as a second gate (also referred to as a bottom gate) electrode. In that case, the $V_{th}$ of the transistor 200 can be controlled by changing a potential applied to the conductor 205 independently of a potential applied to the conductor 260. In particular, the $V_{th}$ of the transistor 200 can be higher than 0 V and the off-state current can be reduced by applying a negative potential to the conductor 205. Thus, a drain current when a potential applied to the conductor 260 is 0 V can be smaller in the case where a negative potential is applied to the conductor 205 than in the case where the negative potential is not applied to the conductor 205.

As illustrated in FIG. 1(A), the conductor 205 is preferably provided to be larger than a region of the oxide 230 that does not overlap with the conductor 242a or the conductor 242b. As illustrated in FIG. 1(C), it is particularly preferable that the conductor 205 extend to a region outside an end portion of the oxide 230 that intersects with the channel width direction. That is, the conductor 205 and the conductor 260 preferably overlap with each other with the insulators positioned therebetween on an outer side of the side surface of the oxide 230 in the channel width direction. A large conductor 205 can sometimes reduce local charging (referred to as charge up) in a treatment using plasma of a fabrication step after the formation of the conductor 205. Note that one embodiment of the present invention is not limited thereto. The conductor 205 overlaps with at least the oxide 230 positioned between the conductor 242a and the conductor 242b.

With the above structure, the channel formation region can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

A first conductive layer of the conductor 205 is preferably a conductor that inhibits the permeation of oxygen and impurities such as water and hydrogen. For example, a single layer or a stacked layer of titanium, titanium nitride, tantalum, or tantalum nitride can be used. Furthermore, for a second conductive layer of the conductor 205, a conductor with favorable adhesion to the first conductive layer and a third conductive layer may be used. For the third conductive layer of the conductor 205, a conductive material containing tungsten, copper, or aluminum as its main component is preferably used. Although the conductor 205 has three layers in the drawing, a single-layer structure, a two-layer structure, or a multilayer structure of four or more layers may be employed.

The insulator 214, the insulator 256, the insulator 282, and the insulator 281 preferably function as barrier insulating films that inhibit impurities such as water and hydrogen from entering the transistor 200 from the substrate side or from above. Thus, for each of the insulator 214, the insulator 256, the insulator 282, and the insulator 281, an insulating material having a function of inhibiting diffusion of impurities (through which the impurities are less likely to pass) such as a hydrogen atom, a hydrogen molecule, a water molecule, a nitrogen atom, a nitrogen molecule, a nitrogen oxide molecule (e.g., $N_2O$, NO, or $NO_2$), or a copper atom is preferably used. Alternatively, it is preferable to use an insulating material having a function of inhibiting diffusion of oxygen (e.g., at least one of an oxygen atom, an oxygen molecule, and the like) (or through which the above oxygen is less likely to pass).

For the insulator 214, the insulator 256, the insulator 282, and the insulator 281, aluminum oxide, hafnium oxide, silicon nitride, or the like is preferably used. For example, aluminum oxide may be used for the insulator 214, the insulator 256, and the insulator 282, and aluminum nitride may be used for the insulator 281. Accordingly, diffusion of impurities such as water and hydrogen into the insulator 224, the oxide 230, the insulator 250, and the like can be inhibited.

The resistivities of the insulator 214, the insulator 256, the insulator 282, and the insulator 281 are preferably low in some cases. For example, by setting the resistivities of the insulator 214, the insulator 256, the insulator 282, and the insulator 281 to approximately $1 \times 10^{13}$ Ωcm, the insulator 214, the insulator 256, the insulator 282, and the insulator 281 can reduce charge up of the conductor 205, the conductor 242 or the conductor 260 in a treatment using plasma or the like of a fabrication step of a semiconductor device in some cases. The resistivities of the insulator 214, the insulator 256, the insulator 282, and the insulator 281 are preferably higher than or equal to $1 \times 10^{10}$ Ωcm and lower than or equal to $1 \times 10^{15}$ Ωcm.

The insulator 214 may have a stacked-layer structure. For example, it is suitable to use an aluminum oxide film for an upper layer of the insulator 214 and a silicon nitride film for a lower layer of the insulator 214. With the aluminum oxide film, oxygen can be supplied to a lower part of the insulator 214. Furthermore, diffusion of impurities such as hydrogen and water to the transistor 200 side from the substrate side can be inhibited by the silicon nitride film.

The insulator 216 and the insulator 280 preferably have a lower dielectric constant than the insulator 214. When a material having a low dielectric constant is used for an interlayer film, parasitic capacitance generated between wirings can be reduced. As the insulator 216 and the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 have a function of a gate insulator.

Here, it is preferable that oxygen be released from the insulator 224 in contact with the oxide 230 by heating. In this specification, oxygen that is released by heating is referred to as excess oxygen in some cases. For example, silicon oxide, silicon oxynitride, or the like is used for the insulator 224 as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits impurities such as water and hydrogen from entering the transistor 200 from the substrate side. For example, the insulator 222 has lower hydrogen permeability than the insulator 224. Surrounding the insulator 224, the oxide 230, and the like by the insulator 222 and the insulator 256 can inhibit entry of impurities such as water and hydrogen into the transistor 200 from the outside.

Furthermore, it is preferable that the insulator 222 have a function of inhibiting diffusion of oxygen (e.g., at least one of an oxygen atom, an oxygen molecule, and the like) (or through which the above oxygen is less likely to pass). For example, the insulator 222 preferably has lower oxygen permeability than the insulator 224. The insulator 222 preferably has a function of inhibiting diffusion of oxygen or impurities, in which case diffusion of oxygen contained in the oxide 230 into a layer below the insulator 222 can be reduced. Furthermore, the conductor 205 can be inhibited from reacting with oxygen contained in the insulator 224 or the oxide 230.

It is preferable to use an insulator containing an oxide of one or both of aluminum and hafnium, which is an insulating material, for the insulator 222. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 in the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

The conductor 247 may also have a structure including a first conductive layer, a second conductive layer placed on an inner side of the first conductive layer, and a third conductive layer placed on an inner side of the second conductive layer like the conductor 205. The first conductive layer of the conductor 247 is preferably a conductor that inhibits the permeation of oxygen and impurities such as water and hydrogen. For example, titanium, titanium nitride, tantalum, or tantalum nitride can be used. Furthermore, for the second conductive layer of the conductor 247, a conductor with favorable adhesion to the first conductive layer and the third conductive layer may be used. For the third conductive layer of the conductor 247, a conductive material containing tungsten, copper, or aluminum as its main component is preferably used. Although the conductor 247 has three layers in the drawing, a single-layer structure, a two-layer structure, or a multilayer structure of four or more layers may be employed.

An insulator that inhibits diffusion of oxygen and impurities such as hydrogen and water, like the insulator 241, may be provided at a side surface of the conductor 247.

The oxide 230 includes the oxide 230a, the oxide 230b over the oxide 230a, and the oxide 230c over the oxide 230b. Here, the oxide 230c is placed to at least partly overlap with a region between the conductor 242a and the conductor 242b. When the oxide 230a is provided under the oxide 230b, impurities can be inhibited from being diffused into the oxide 230b from the components formed below the oxide 230a. When the oxide 230c is provided over the oxide 230b, impurities can be inhibited from being diffused into the oxide 230b from the components formed above the oxide 230c.

Note that the oxide 230 preferably has a stacked-layer structure using oxides which differ in the atomic ratio of metal atoms. Specifically, the atomic ratio of the element M in constituent elements in the metal oxide used as the oxide 230a is preferably greater than the atomic ratio of the element M in constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; hence, the transistor 200 is stable with respect to high temperatures in the manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum is gradually varied at a junction region of the oxide 230a, the oxide 230b, and the oxide 230c. In other words, the energy level of the conduction band minimum at a junction region of each of the oxide 230a, the oxide 230b, and the oxide 230c is continuously varied or continuously connected. To obtain this, the densities of defect states in mixed layers formed at an interface between the oxide 230a and the oxide 230b and an interface between the oxide 230b and the oxide 230c are preferably made low.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] as a lower layer of the oxide 230c and In:Ga:Zn=1:3:4 [atomic ratio] as an upper layer of the oxide 230c, a stacked-layer structure of In:Ga:Zn=4:2:3 [atomic ratio] as the lower layer of the oxide 230c and Ga:Zn=2:1 [atomic ratio] as the upper layer of the oxide 230c, a stacked-layer structure of In:Ga:Zn=4:2:3 [atomic ratio] as the lower layer of the oxide 230c and Ga:Zn=2:5 [atomic ratio] as the upper layer of the oxide 230c, and a stacked-layer structure of In:Ga:Zn=4:2:3 [atomic ratio] as the lower layer of the oxide 230c and gallium oxide as the upper layer of the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and favorable frequency characteristics. Note that in the case where the oxide 230c has a stacked-layer structure, not only the above effect of reducing the density of defect states at the interface between the oxide 230b and the oxide 230c but also the effect of inhibiting diffusion of a constituent element included in the oxide 230c to the insulator 250 side should be obtained. More specifically, the oxide 230c has a stacked-layer structure and an oxide containing no In or having a reduced In concentration is positioned in an upper portion of the stacked layer structure, so that In, which can be diffused to the insulator 250 side, can be inhibited. Since the insulator 250 functions as the gate insulator, the transistor has defects in characteristics when In is diffused. Thus, when the oxide 230c has a stacked-layer structure, a highly reliable semiconductor device can be provided.

When the oxide 230c has a stacked-layer structure, the interface between the oxide 230b and the lower layer of the oxide 230c and its vicinity may serve as a main carrier path.

Since the lower layer of the oxide 230c is in contact with a side surface of the insulator 280, oxygen contained in the insulator 280 can be supplied to the channel formation region of the transistor 200 through the lower layer of the oxide 230c. For the upper layer of the oxide 230c, a material that is less likely to transmit oxygen is preferably used. The use of the above material can inhibit absorption of oxygen contained in the insulator 280 into the insulator 250 or the conductor 260 through the upper layer of the oxide 230c; as a result, oxygen can be efficiently supplied to the channel formation region.

The oxide 230 includes the regions 231 and the region 234. At least part of each region 231 includes a region in contact with the conductor 242.

When the transistor 200 is turned on, one of the region 231a and the region 231b functions as the source region and the other functions as the drain region. At least part of the region 234 functions as the region where the channel is formed.

That is, through appropriate selection of the areas of the regions, a transistor having electrical characteristics necessary for a circuit design can be easily provided.

As the oxide 230, a metal oxide functioning as an oxide semiconductor is preferably used. For example, a metal oxide whose energy gap is greater than or equal to 2 eV, preferably greater than or equal to 2.5 eV, is preferably used. With the use of a metal oxide having such a large energy gap, the off-state current of the transistor can be reduced. With the use of such a transistor, a semiconductor device with low power consumption can be provided.

Electron affinity or conduction band minimum Ec can be obtained from an energy gap Eg and an ionization potential Ip, which is a difference between a vacuum level and an energy of valence band maximum Ev. The ionization potential Ip can be measured using, for example, an ultraviolet photoelectron spectroscopy (UPS) apparatus. The energy gap Eg can be measured using, for example, a spectroscopic ellipsometer.

The conductors 242 (the conductor 242a and the conductor 242b) functioning as the source electrode and the drain electrode are provided over the oxide 230b. The thickness of the conductors 242 is, for example, greater than or equal to 1 nm and less than or equal to 50 nm, preferably greater than or equal to 2 nm and less than or equal to 25 nm.

For the conductors 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 250 functions as a gate insulator. The insulator 250 is preferably placed in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

The insulator 250 may be formed using an insulator from which oxygen is released by heating as in the insulator 224. When an insulator from which oxygen is released by heating is provided as the insulator 250 in contact with the top surface of the oxide 230c, oxygen can be efficiently supplied to the channel formation region of the oxide 230b. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Provision of the metal oxide that inhibits diffusion of oxygen inhibits diffusion of oxygen from the insulator 250 into the conductor 260. That is, a reduction in the amount of excess oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium such as aluminum oxide, hafnium oxide, or an oxide containing aluminum and hafnium (hafnium aluminate).

The metal oxide has a function of part of the gate electrode in some cases. In that case, a conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen entering from an external insulator or the like can be trapped in some cases.

Although the transistor 200 with the conductor 260 having a stacked-layer structure of two layers is described, the present invention is not limited thereto. For example, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. As the conductor 260 also functioning as a wiring, a conductor having high conductivity is preferably used. For example, a conductive material containing tungsten, copper, or aluminum as its main component can be used. In addition, the conductor 260b may have a stacked-layer structure, for example, a stacked-layer structure of any of the above conductive materials and titanium or titanium nitride.

The insulator 280 preferably contain, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable. The insulator 280 preferably contains a larger amount of oxygen so that oxygen contained in the insulator 280 is supplied to the oxide 230b through the oxide 230c, or the lower layer of the oxide 230c, and preferably contains more oxygen than that in the stoichiometric ratio, for example. To increase the concentration of oxygen contained in the insulator 280, a deposition gas used for forming the insulator 280 preferably contains oxygen.

The concentration of impurities such as water and hydrogen in the insulator 280 is preferably reduced. It is particularly preferable that the insulator 280 be formed by a sputtering method because the insulator 280 in which the concentration of impurities such as water and hydrogen is reduced can be obtained. For example, silicon oxide formed by a sputtering method using a target containing silicon or silicon oxide and a gas containing argon or oxygen is more suitable for the insulator 280 than silicon oxide and silicon oxynitride formed by a CVD method using a deposition gas containing hydrogen because the hydrogen concentration of in film is low. Taking a deposition rate at the time of forming the insulator 280 and coverage of steps formed by the oxide 230a, the oxide 230b, the opening reaching the conductor 247, and the like into consideration, the insulator 280 may be formed by a CVD method. Although not illustrated, the insulator 280 may have a stacked-layer structure of two or more layers, and may be a stack including silicon oxide formed by a sputtering method as the first layer and silicon oxynitride formed by a CVD method as the second layer. The top surface of the insulator 280 may be planarized.

The insulator 282 and the insulator 281 preferably function as barrier insulating films that inhibit impurities such as water and hydrogen from entering the insulator 280 from above. As the insulator 282 and the insulator 281, an insulator such as aluminum oxide, silicon nitride, or silicon nitride oxide may be used. For example, aluminum oxide may be used for the insulator 282, and silicon nitride may be used for the insulator 281. With the aluminum oxide used for the insulator 282, oxygen can be supplied to the insulator 280. Furthermore, with the silicon nitride film used for the insulator 281, diffusion of impurities such as hydrogen and water from above to the transistor 200 side can be inhibited.

An insulator functioning as an interlayer film, such as silicon oxide or silicon oxynitride, may be provided between the insulator 282 and the insulator 281. When the level of the capacitor 100 is adjusted by providing the insulator, the electrostatic capacitance of the capacitor 100 can be adjusted. As in the insulator 224 or the like, the concentration of impurities such as water and hydrogen contained in the film of the insulator is preferably lowered.

[Capacitor 100]

The capacitor 100 includes the conductor 110 placed in the opening formed in the insulator 256, the insulator 280, the insulator 282, and the insulator 281 and in contact with the top surface of the conductor 242b, the insulator 130 over the conductor 110 and the insulator 281, and the conductor 120 over the insulator 130. Here, at least parts of the conductor 110, the insulator 130, and the conductor 120 are placed in the opening formed in the insulator 256, the insulator 280, the insulator 282, and the insulator 281.

The conductor 110 functions as a lower electrode of the capacitor 100, the conductor 120 functions as an upper electrode of the capacitor 100, and the insulator 130 functions as a dielectric of the capacitor 100. In the capacitor 100, the upper electrode and the lower electrode face each other with the dielectric positioned therebetween on the side surface as well as the bottom surface of the opening in the insulator 256, the insulator 280, the insulator 282, and the insulator 281; thus, the electrostatic capacitance per unit area can be increased. Thus, the deeper the opening is, the larger the electrostatic capacitance of the capacitor 100 can be. Increasing the electrostatic capacitance per unit area of the capacitor 100 in this manner can promote miniaturization or higher integration of a semiconductor device.

The shape of the opening formed in the insulator 256, the insulator 280, the insulator 282, and the insulator 281 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably larger in the top view. For example, as illustrated in FIG. 1(A), the capacitor 100 is preferably provided so that the capacitor 100 is in the area of the oxide 230b in the top view. In that case, the length of the conductor 110 in the channel width direction is smaller than the length of the oxide 230b in the channel width direction. Such a structure can reduce the area occupied by the semiconductor device including the capacitor 100 and the transistor 200.

The conductor 110 is placed along the opening formed in the insulator 256, the insulator 280, the insulator 282, and the insulator 281. The level of part of a top surface of the conductor 110 is substantially aligned with the level of a top surface of the insulator 281. The top surface of the conductor 242b is in contact with a bottom surface of the conductor 110. The conductor 110 is preferably deposited by an ALD method, a CVD method, or the like and a conductor that can be used as the conductor 205 or the conductor 242 may be used, for example. When the same conductive material as the conductor 242b is used for the conductor 110, for example, the contact resistance between the conductor 110 and the conductor 242b can be reduced. Tantalum nitride deposited by an ALD method can be used for the conductor 110, for example.

The insulator 130 is placed to cover the conductor 110 and part of the insulator 281. The insulator 130 is preferably deposited by an ALD method or a CVD method, for example. The insulator 130 can be provided to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

In addition, for the insulator 130, a material with high dielectric strength such as silicon oxynitride or a high permittivity (high-k) material (high dielectric constant material) is preferably used. Alternatively, a stacked-layer structure using a material with high dielectric strength and a high-k material may be employed.

Examples of the insulator with a high-k material include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can secure sufficient electrostatic capacitance of the capacitor 100 even if the insulator 130 has a large thickness. When the insulator 130 has a large thickness, leakage current generated between the conductor 110 and the conductor 120 can be inhibited.

Meanwhile, examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, $SiO_x$ deposited by an ALD method can be used. Moreover, for example, it is possible to use an insulating film in which $SiN_x$ deposited by an ALD method, $SiO_x$ deposited by a PEALD method, and $SiN_x$ deposited by an ALD method are stacked in this order. The use of such an insulator having high dielectric strength can increase dielectric strength and inhibit electrostatic breakdown of the capacitor 100.

The conductor 120 is placed to fill the opening formed in the insulator 256, the insulator 280, the insulator 282, and the insulator 281. Here, the conductor 120 preferably has a region overlapping with the insulator 281 with the insulator 130 positioned therebetween. With such a structure, the conductor 120 can be surely insulated from the conductor 110 with the insulator 130 positioned therebetween. Furthermore, a portion above the insulator 281 of the conductor 120 may be extended and formed as a wiring. The conductor 120 is preferably deposited by an ALD method, a CVD method, or the like and a conductor that can be used as the conductor 205 may be used. For example, as the conductor 120, a stacked film of titanium nitride deposited by an ALD method and tungsten deposited thereover by a CVD method can be used. Note that in the case where the adhesion of tungsten to the insulator 130 is sufficiently high, a single-layer film of tungsten deposited by a CVD method may be used as the conductor 120.

A conductor functioning as a wiring may be placed in contact with a top surface of the conductor 120. For the conductor, a conductive material containing tungsten, copper, or aluminum as its main component is preferably used. The conductor may have a stacked-layer structure, for example, stack layers of any of the above conductive materials and titanium or titanium nitride. Note that the conductor may be formed to be embedded in an opening provided in an insulator.

The insulator 241 is preferably placed in contact with the side surface of the opening formed in the insulator 256, the insulator 280, the insulator 282, and the insulator 281. The conductor 110 is provided in contact with an inner side surface of the insulator 241, the insulator 130 is provided in contact with an inner side surface of the conductor 110, and the conductor 120 is provided in contact with an inner side surface of the insulator 130.

As the insulator 241, an insulator such as aluminum oxide, silicon nitride, or silicon nitride oxide may be used. Since the insulator 241 is provided in contact with the insulator 281, the insulator 282, the insulator 280, and the insulator 256, the entry of impurities such as water and hydrogen into the oxide 230 through the conductor 110 from the insulator 280 or the like can be inhibited. Moreover, oxygen contained in the insulator 280 can be prevented from being absorbed into the conductor 110.

<Constituent Material of Semiconductor Device>

Constituent materials that can be used for the semiconductor device will be described below.

<Substrate>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<Insulator>

As an insulator, an oxide, a nitride, an oxynitride, a nitride oxide, a metal oxide, a metal oxynitride, and a metal nitride oxide, each of which has an insulating property can be given.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material with a low relative permittivity is used for the insulator functioning as an interlayer film, the parasitic capacitance generated between wirings can be reduced. Accordingly, a material is preferably selected depending on the function of an insulator.

As the insulator having a high relative permittivity, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given.

As the insulator with a low relative permittivity, silicon oxide, silicon oxynitride, silicon nitride oxide, silicon oxide to which fluorine is added, silicon oxide to which carbon is added, silicon oxide to which carbon and nitrogen are added, porous silicon oxide, a resin, and the like can be given.

When a transistor using an oxide semiconductor is surrounded by insulators having a function of inhibiting the permeation of oxygen and impurities such as hydrogen, the electrical characteristics of the transistor can be stable. As the insulator having a function of inhibiting the permeation of oxygen and impurities such as hydrogen, an insulator, which is a single layer or a stacked layer, containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used, for example. Specifically, for the insulator having a function of inhibiting the permeation of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen that is released by heating. When a structure is employed in which silicon oxide or silicon oxynitride including a region containing oxygen that is released by heating is in contact with the oxide 230, oxygen vacancies contained in the oxide 230 can be compensated for.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen entering from an external insulator or the like can be trapped in some cases.

<Metal Oxide>

As the oxide 230, a metal oxide functioning as an oxide semiconductor is preferably used. A metal oxide that can be used for the oxide 230 according to the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, (M, Zn) layer) are stacked. Note that indium and the element M can be replaced with each other, and when the element M in the (M,Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

The oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in the oxide semiconductor of one embodiment of the present invention.

Note that there is no particular limitation on a structure of an oxide semiconductor (metal oxide) in the semiconductor device of one embodiment of the present invention; however, the oxide semiconductor preferably has crystallinity. For example, the oxide 230 can have a CAAC-OS structure. The semiconductor device can have high reliability when the oxide 230 has the above crystal structure.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration obtained by secondary ion mass spectrometry (SIMS)) is set lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to become water, and thus forms an oxygen vacancy, in some cases. When hydrogen enters the oxygen vacancy, an electron which is a carrier is generated in some cases. Furthermore, in some cases, bonding of part of hydrogen to oxygen bonded to a metal atom causes generation of an electron which is a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities are sufficiently reduced is used in a channel formation region of a transistor, stable electrical characteristics can be given.

Note that the example in which an oxide semiconductor is used for the semiconductor layer of the transistor 200 has been described as one embodiment of the present invention; however, one embodiment of the present invention is not limited thereto. Depending on circumstances or conditions, in one embodiment of the present invention, the semiconductor layer of the transistor 200 may include various semiconductor materials such as silicon, germanium, silicon germanium, silicon carbide, gallium arsenide, aluminum gallium arsenide, indium phosphide, gallium nitride, or an organic semiconductor.

<Method for Manufacturing Semiconductor Device>

Next, a method for manufacturing the semiconductor device including the transistor 200 and the capacitor 100, which is illustrated in FIG. 1, will be described with reference to FIG. 3 to FIG. 14. In FIG. 3 to FIG. 14, (A) of each drawing is a top view. Moreover, (B) of each drawing is a cross-sectional view corresponding to a portion indicated by the dashed-dotted line A1-A2 in (A), and is also a cross-sectional view of the transistor 200 in the channel length direction. Furthermore, (C) of each drawing is a cross-sectional view corresponding to a portion indicated by the dashed-dotted line A3-A4 in (A), and is also a cross-sectional view of the transistor 200 in the channel width direction. Furthermore, (D) of each drawing is a cross-sectional view corresponding to a portion indicated by the dashed-dotted line A5-A6 in (A), and is also a cross-sectional view of the source region or the drain region of the transistor 200 in the channel width direction. Note that for clarity of the drawings, some components are not illustrated in the top view of (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

In an ALD method, one atomic layer can be deposited at a time using self-regulating characteristics of atoms. Hence, an ALD method has effects such as deposition of an extremely thin film, deposition on a component with a large aspect ratio, deposition of a film with a small number of defects such as pinholes, deposition with excellent coverage, and low-temperature deposition. An ALD method includes a PEALD (Plasma Enhanced ALD) method, which is a deposition method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of the source gases. For example, by a CVD method or an ALD method, a film with a certain composition can be deposited depending on a flow rate ratio of the source gases. Moreover, by a CVD method or an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, productivity of semiconductor devices can be improved in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to be diffused, such as copper, is used for a conductor in a layer (not illustrated) below the insulator 214, diffusion of the metal into a layer above the insulator 214 can be inhibited.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Examples of the opening include a groove and a slit. A region where the opening is formed may be referred to as an opening portion. Wet etching can be used for the formation of the openings; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205 and the conductor 247 is deposited. The conductive film preferably includes a conductor that has a function of inhibiting the permeation of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205 and the conductor 247 can be deposited by a sputtering method, a CVD method, an MBE method, a PLD method, an ALD method, or the like.

In this embodiment, the conductive film to be the conductor 205 and the conductor 247 has a multilayer structure. First, tantalum nitride is deposited as a conductive film to be the conductor 205a and the conductor 247a by a sputtering method, and titanium nitride is deposited by a CVD method as a conductive film to be the conductor 205b and the conductor 247b over the tantalum nitride. Even when a metal that is likely to be diffused, such as copper, is used for a conductive film to be a conductor 205c and a conductor 247c described below, the use of such metal nitrides for a lower layer of the conductive film to be the conductor 205 and the conductor 247 can prevent outward diffusion of the metal from the conductor 205 and the conductor 247.

Next, the conductive film to be the conductor 205c and the conductor 247c is deposited. The conductive film can be deposited by a plating method, a sputtering method, a CVD method, an MBE method, a PLD method, an ALD method, or the like. In this embodiment, for the conductive film to be the conductor 205c and the conductor 247c, a low-resistance conductive material such as tungsten or copper is deposited. For example, tungsten may be deposited by a CVD method as the conductive film to be the conductor 205c and the conductor 247c.

Next, CMP (Chemical Mechanical Polishing) treatment is performed to remove part of the conductive film to be the conductor 205 and the conductor 247, so that the insulator 216 is exposed. As a result, the conductive film to be the conductor 205 and the conductive film to be the conductor 247 remain only in the opening portions. Thus, the conductor 205 and the conductor 247 whose top surfaces are flat can be formed (see FIG. 3). Note that the insulator 216 is partly removed by the CMP treatment in some cases.

Here, a method for forming the conductor 205 and the conductor 247 which are different from the above will be described below.

The conductive film to be the conductor 205 and the conductor 247 is deposited over the insulator 214. The conductive film can be deposited by a sputtering method, a CVD method, an MBE method, a PLD method, an ALD method, or the like. In addition, the conductive film can be a multilayer film. In this embodiment, tungsten is deposited for the conductive film.

Next, the conductive film is processed by a lithography method to form the conductor 205 and the conductor 247.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-described light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205 and the conductor 247, forming a resist mask thereover, and then etching the hard mask material.

The etching of the conductive film to be the conductor 205 and the conductor 247 may be performed after removal of the resist mask or with the resist mask remaining. In the latter case, the resist mask sometimes disappears during the etching. The hard mask may be removed by etching after the etching of the conductive film. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency power sources with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 216 is deposited over the insulator 214, the conductor 205, and the conductor 247. The insulator to be insulator 216 can be deposited by a sputtering method, a CVD method, an MBE method, a PLD method, an ALD method, or the like. In this embodiment, for the insulating film to be insulator 216, silicon oxide is deposited by a CVD method.

Here, the thickness of the insulating film to be the insulator 216 is preferably greater than or equal to the thickness of the conductor 205 and the conductor 247. For example, when the thickness of the conductor 205 and the conductor 247 is 1, the thickness of the insulating film to be the insulator 216 is greater than or equal to 1 and less than or equal to 3. In this embodiment, the thickness of the thickness of the conductor 205 and the conductor 247 is 150 nm and the thickness of the insulating film to be the insulator 216 is 350 nm.

Next, CMP treatment is performed on the insulating film to be the insulator 216, so that part of the insulating film to be the insulator 216 is removed and surfaces of the conductor 205 and the conductor 247 are exposed. Thus, the conductor 205, the conductor 247, and the insulator 216 whose top surfaces are flat can be formed. The above is another method for forming the conductor 205 and the conductor 247.

Next, the insulator 222 is deposited over the insulator 216, the conductor 205, and the conductor 247. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, the insulator 224 is deposited over the insulator 222. The insulator 224 can be deposited by a sputtering method, a CVD method, an MBE method, a PLD method, an ALD method, or the like.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for an hour, and successively another treatment is performed at 400° C. in an oxygen atmosphere for an hour. By the heat treatment, impurities such as water and hydrogen contained in the insulator 224 can be removed.

The above heat treatment may be performed after the insulator 222 is deposited. For the heat treatment, the conditions for the above-described heat treatment can be used.

Here, plasma treatment containing oxygen may be performed under reduced pressure so that an excess-oxygen region can be formed in the insulator 224. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment is not necessarily performed.

Here, aluminum oxide may be deposited over the insulator 224 by a sputtering method and the aluminum oxide may be subjected to CMP treatment until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can improve the coverage with an oxide deposited later and a decrease in the yield of the semiconductor device in some cases. The deposition of aluminum oxide over the insulator 224 by a sputtering method is preferred because oxygen can be added to the insulator 224.

Next, an oxide film 230A and an oxide film 230B are deposited in this order over the insulator 224 (see FIG. 3). Note that the oxide films are preferably deposited successively without exposure to an air atmosphere. By the deposition without exposure to the air, impurities or moisture from the air atmosphere can be prevented from being attached to top surfaces of the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. The amount of excess oxygen in the oxide film to be deposited can be increased by an increase in the proportion of oxygen contained in the sputtering gas. In the case where the above oxide films are deposited by a sputtering method, the above In-M-Zn oxide target can be used.

In particular, when the oxide film 230A is deposited, part of oxygen contained in the sputtering gas is supplied to the insulator 224 in some cases. Therefore, the proportion of oxygen contained in the sputtering gas for the oxide film 230A is preferably 70% or higher, further preferably 80% or higher, and still further preferably 100%.

In the case where the oxide film 230B is deposited by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor using an oxygen-deficient oxide semiconductor for its channel formation region, relatively high field-effect mobility can be obtained.

In this embodiment, the oxide film 230A is deposited by a sputtering method using a target with In:Ga:Zn=1:1:0.5 (2:2:1) [atomic ratio] or In:Ga:Zn=1:3:4 [atomic ratio]. The oxide film 230B is deposited by a sputtering method using a target with In:Ga:Zn=4:2:4.1 [atomic ratio] or 1:1:1 [atomic ratio]. Note that each of the oxide films is preferably formed to have characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for an hour, and successively another treatment is performed at 400° C. in an oxygen atmosphere for an hour.

Next, the opening through which at least part of the conductor 247 is exposed is formed in the oxide film 230B, the oxide film 230A, the insulator 224, and the insulator 222 by a lithography method (see FIG. 4). Wet etching can be used for the formation of the opening; however, dry etching is preferably used for microfabrication.

Next, the conductive film 242A in contact with the conductor 247 in the opening is formed. The conductive film 242A can be deposited by a sputtering method, a CVD method, an MBE method, a PLD method, an ALD method, or the like (see FIG. 4).

Next, the oxide film 230A, the oxide film 230B, and the conductive film 242A are processed into island shapes to form the oxide 230a, the oxide 230b, and a conductor layer 242B (see FIG. 5). Note that in this step, the thickness of a region of the insulator 224 which does not overlap with the oxide 230a becomes small in some cases.

Note that the oxide 230a, the oxide 230b, and the conductor layer 242B are formed to at least partly overlap with the conductor 205. Alternatively, the side surfaces of the oxide 230a and the oxide 230b and a side surface of the conductor layer 242B may be substantially perpendicular to a top surface of the insulator 222. When the side surfaces of the oxide 230a, the oxide 230b, and the conductor layer 242B are substantially perpendicular to the top surface of the insulator 222, the plurality of transistors 200 can be provided in a smaller area and at a higher density. Alternatively, a structure may be employed in which an angle formed by the side surfaces of the oxide 230a, the oxide 230b, and the conductor layer 242B and the top surface of the insulator 222 is small. In that case, the angle formed by the side surfaces of the oxide 230a, the oxide 230b, and the conductor layer 242B and the top surface of the insulator 222 is preferably greater than or equal to 60° and less than 70°. With such a shape, coverage with the insulator 256 and the like can be improved in a later step, so that defects such as voids can be reduced.

Note that for the processing of the oxide films and the conductive film, a lithography method can be employed. The processing can be performed by a dry etching method or a wet etching method. The processing by a dry etching method is suitable for microfabrication.

It is preferable that there be a curved surface between the side surface of the conductor layer 242B and a top surface of the conductor layer 242B. That is, an end portion of the side surface and an end portion of the top surface are preferably curved (hereinafter such a curved shape is also referred to as a rounded shape). The radius of curvature of the curved surface at an end portion of the conductor layer 242B is greater than or equal to 3 nm and less than or equal to 10 nm, preferably greater than or equal to 5 nm and less than or equal to 6 nm, for example. When the end portions are not angular, the coverage with films in a later deposition step can be improved.

Note that for the processing of the conductive film, a lithography method can be employed. The processing can be performed by a dry etching method or a wet etching method. The processing by a dry etching method is suitable for microfabrication.

Next, the insulator 256 is deposited over the insulator 224, the oxide 230a, the oxide 230b, and the conductor layer 242B (see FIG. 6).

The insulator 256 can be deposited by a sputtering method, a CVD method, an MBE method, a PLD method, an ALD method, or the like. As the insulator 256, an insulating film having a function of inhibiting the permeation of oxygen is preferably used. For example, silicon nitride, silicon oxide, or aluminum oxide is deposited by a sputtering method. A material that can be used for the oxide 230a and the oxide 230b can be used for the insulator 256. For example, a metal oxide with In:Ga:Zn=1:3:4 [atomic ratio] or 1:1:0.5 [atomic ratio] is preferably used for the insulator 256.

The insulator 256 may have a stacked-layer structure. The insulator 256 can be deposited by the above-described methods, and the upper layer and the lower layer of the insulator 256 may be deposited by the same method or different methods. Furthermore, the above-described materials can be used for the insulator 256, and the same material or different materials may be used for the upper layer and the lower layer of the insulator 256. For example, it is preferable that an aluminum oxide film be deposited by a sputtering method as the lower layer of the insulator 256 and an aluminum oxide film be deposited by an ALD method as the upper layer of the insulator 256. Alternatively, an aluminum oxide film may be deposited by a sputtering method as the lower layer of the insulator 256 and a silicon nitride film may be deposited by an ALD method as the upper layer of the insulator 256 (see FIG. 6).

Next, an insulating film to be the insulator 280 is deposited over the insulator 256. The insulating film to be the insulator 280 can be deposited by a sputtering method, a CVD method, an MBE method, a PLD method, an ALD method, or the like. In order that the insulator 280 contain a larger amount of oxygen, the deposition gas used for forming the insulator 280 preferably contains oxygen. In order that the hydrogen concentration in the insulator 280 be reduced, the deposition gas used for forming the insulator 280 preferably contains no hydrogen or contains hydrogen as little as possible. For example, it is preferable to deposit silicon oxide using a target containing silicon or silicon oxide and gas containing argon or oxygen. The insulator 280 may have a stacked-layer structure of two or more layers, in which case silicon oxide is formed by a sputtering method as the first layer and silicon oxynitride is formed by a CVD method as the second layer. Next, the insulating film to be the insulator 280 is subjected to CMP treatment, so that the insulator 280 having a flat top surface is formed (see FIG. 6).

Next, part of the insulator 280, part of the insulator 256, and part of the conductor layer 242B are processed to form an opening through which the oxide 230b is exposed. The opening is preferably formed to overlap with the conductor 205. The conductor 242a and the conductor 242b are formed by the formation of the opening. In addition, the formation of the opening decreases the thickness of part of the insulator 224 in some cases (see FIG. 7). Furthermore, in some cases, the top surface of the oxide 230b that is exposed through the region between the conductor 242a and the conductor 242b is partly removed.

Part of the insulator 280, part of the insulator 256, and part of the conductor layer 242B may be processed under different conditions. For example, part of the insulator 280 may be processed by a dry etching method, part of the insulator 256 may be processed by a wet etching method, and part of the conductor layer 242B may be processed by a dry etching method.

At this time, the opening formed in the insulator 280 overlaps with a region between the conductor 242a and the conductor 242b. In this manner, the conductor 260 can be placed between the conductor 242a and the conductor 242b in a self-aligned manner in a later step.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

Next, heat treatment may be performed. Heat treatment may be performed under reduced pressure, and an oxide film 230C may be successively deposited without exposure to the air. The treatment can remove moisture and hydrogen adsorbed onto the surface of the oxide 230b and the like, and further can reduce the moisture concentration and the hydrogen concentration in the oxide 230a and the oxide 230b. The heat treatment is preferably performed at a temperature higher than or equal to 100° C. and lower than or equal to 400° C. In this embodiment, the heat treatment is performed at 200° C. (see FIG. 8).

Here, it is preferable that the oxide film 230C be provided in contact with at least part of the side surface of the oxide 230a, part of the top and side surfaces of the oxide 230b, part of the side surfaces of the conductors 242, side surfaces of the insulator 256, and the side surfaces of the insulator 280. When the conductors 242 are surrounded by the insulator 256 and the oxide film 230C, a decrease in the conductivity of the conductors 242 due to oxidation in a later step can be inhibited.

The oxide film 230C can be deposited by a sputtering method, a CVD method, an MBE method, a PLD method, an ALD method, or the like. The oxide film 230C is deposited by a method similar to that for the oxide film 230A or the oxide film 230B in accordance with characteristics required for the oxide film 230C. In this embodiment, the oxide film 230C is deposited by a sputtering method using a target with In:Ga:Zn=1:3:4 [atomic ratio] or In:Ga:Zn=4:2:4.1 [atomic ratio].

The oxide film 230C may have a stacked-layer structure. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In particular, when the oxide film 230C is deposited, part of oxygen contained in the sputtering gas is supplied to the oxide 230a and the oxide 230b in some cases. Therefore, the proportion of oxygen contained in the sputtering gas for the oxide film 230C is preferably 70% or higher, further preferably 80% or higher, and still further preferably 100%.

Next, heat treatment may be performed. Heat treatment may be performed under reduced pressure, and the insulating film 250A may be successively deposited without exposure to the air. The treatment can remove moisture and hydrogen adsorbed onto the surface of the oxide film 230C and the like, and further can reduce the moisture concentration and the hydrogen concentration in the oxide 230a, the oxide 230b, and the oxide film 230C. The heat treatment is preferably performed at a temperature higher than or equal to 100° C. and lower than or equal to 400° C. (see FIG. 8).

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Next, a conductive film 260A and a conductive film 260B are deposited. The conductive film 260A and the conductive film 260B can be deposited by a sputtering method, a CVD method, an MBE method, a PLD method, an ALD method, or the like. For example, a CVD method is preferably used.

In this embodiment, the conductive film 260A is deposited by an ALD method, and the conductive film 260B is deposited by a CVD method (see FIG. 8).

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 9).

Next, heat treatment may be performed. In this embodiment, the treatment is performed at 400° C. in a nitrogen atmosphere for an hour. The heat treatment can reduce the moisture concentration and the hydrogen concentration in the insulator 250 and the insulator 280.

Since the conductors 242 are provided to be surrounded by the insulator 256 and the oxide 230c, a decrease in the conductivity of the conductors 242 due to oxidation can be inhibited.

Next, an insulating film to be the insulator 282 may be formed over the conductor 260, the oxide 230c, the insulator 250, and the insulator 280 (see FIG. 10). The insulating film to be the insulator 282 can be deposited by a sputtering method, a CVD method, an MBE method, a PLD method, an ALD method, or the like. An aluminum oxide is preferably deposited as the insulating film to be the insulator 282 by a sputtering method, for example. It is preferable to form the insulator 282 in contact with the top surface of the conductor 260 in this manner because oxygen contained in the insulator 280 can be inhibited from being absorbed into the conductor 260 in a later heat treatment.

Next, heat treatment may be performed. In this embodiment, the treatment is performed at 400° C. in a nitrogen atmosphere for an hour. By the heat treatment, oxygen added by the deposition of the insulator 282 can be supplied to the insulator 280. In addition, the oxygen can be supplied to the oxide 230a and the oxide 230b through the oxide 230c.

Next, an insulator to be the insulator 281 may be deposited over the insulator 282. An insulating film to be the insulator 281 can be deposited by a sputtering method, a CVD method, an MBE method, a PLD method, an ALD method, or the like. Silicon nitride is preferably deposited as the insulating film to be the insulator 281 by a sputtering method, for example (see FIG. 10).

Next, an opening 290 reaching the conductor 242b is formed in the insulator 256, the insulator 280, the insulator 282, and the insulator 281 (see FIG. 11). The opening 290 may be formed by a lithography method. Since the opening 290 has a high aspect ratio, anisotropic etching is preferably performed, and dry etching may be performed, for example. For the dry etching, for example, a $C_4F_6$ gas, a $C_5F_6$ gas, a $C_4F_8$ gas, a $CF_4$ gas, a $SF_6$ gas, a $CHF_3$ gas, a $Cl_2$ gas, a $BCl_3$ gas, a $SiCl_4$ gas, and the like can be used alone or two or more of the gases can be mixed and used. Alternatively, an oxygen gas, a helium gas, an argon gas, a hydrogen gas, or the like can be added to any of the above gases as appropriate. These etching gases can be appropriately changed depending on the object to be etched (the insulator 256, the insulator 280, the insulator 282, and the insulator 281).

Next, an insulating film to be the insulator 241 is deposited. At this time, the insulating film is deposited to be in contact with at least a side surface of the opening 290. The insulating film may be, for example, deposited along the side surface and a bottom surface of the opening 290. The insulating film can be deposited by a sputtering method, a CVD method, an MBE method, a PLD method, an ALD method, or the like. As the insulating film to be the insulator 241, an insulating film having a function of inhibiting the permeation of oxygen or impurities such as water and hydrogen is preferably used. For example, aluminum oxide or silicon nitride is preferably deposited by an ALD method.

Next, the insulating film is subjected to anisotropic etching to form the insulator 241 in contact with the side surface of the opening 290 (see FIG. 11). Here, at least part of the insulating film is removed, and at least part of the top surface of the conductor 242*b* is exposed. For the anisotropic etching, a dry etching method or the like is employed, for example. When a sidewall portion of the opening 290 has such a structure, the permeation of oxygen from the outside can be inhibited and oxidation of the conductor 110 to be formed next can be prevented. Furthermore, impurities such as water and hydrogen can be prevented from being diffused from the conductor 110 to the outside.

Next, a conductive film 110A is deposited to cover the insulator 281 and the opening 290. At this time, the conductive film 110A is preferably formed in contact with the side surface and the bottom surface of the opening 290 having a high aspect ratio. Thus, the conductive film 110A is preferably deposited by a deposition method that provides favorable coverage, such as an ALD method or a CVD method. For example, tantalum nitride may be deposited by an ALD method.

Then, a filler 288 is deposited over the conductive film 110A (see FIG. 12). The filler 288 fills the opening 290 to the degree allowing CMP treatment in a later step to be performed. Thus, a cavity or the like may be formed in the opening 290. For the filler 288, either an insulator or a conductor can be used. For example, as the filler 288, silicon oxide may be deposited by an APCVD method.

Then, the layer above the insulator 281 is removed by CMP treatment, so that the conductor 110 is formed (see FIG. 13). Here, the insulator 281 preferably functions as a stopper for the CMP treatment on the conductive film 110A. Note that the insulator 281 is partly removed by the CMP treatment in some cases.

Next, etching treatment is performed to remove the filler 288 in the opening 290. The etching treatment may be performed by a wet etching method or a dry etching method; the filler 288 in the opening 290 can be more easily removed by a wet etching method in some cases. When wet etching is employed, a hydrofluoric acid-based solution or the like can be used as the etchant. The insulator 280 is covered with the insulator 281, the insulator 241, and the conductor 110 here, and thus can be prevented from being etched.

Next, an insulating film 130A is deposited over the conductor 110 and the insulator 281 (see FIG. 14). The insulating film 130A is preferably formed in contact with the conductor 110 that is provided inside the opening 290 having a high aspect ratio. Thus, the insulating film 130A is preferably deposited by a deposition method that enables favorable coverage, such as an ALD method or a CVD method, and silicon oxide is deposited by an ALD method, for example. Note that silicon oxide may be deposited by a PEALD method.

When the insulating film 130A is deposited by a deposition method such as an ALD method to cover the conductor 110 favorably, a short circuit between the upper electrode and the lower electrode of the capacitor 100 can be prevented.

Next, a conductive film 120A is deposited over the insulating film 130A (see FIG. 14). At least the conductive film 120A is preferably formed in contact with the insulating film 130A that is provided inside the opening 290 having a high aspect ratio. Thus, the conductive film 120A is preferably deposited by a deposition method that enables favorable embeddability, such as an ALD method or a CVD method; for example, titanium nitride is deposited by an ALD method and tungsten is deposited thereover by a CVD method.

The conductive film 120A is deposited in the above manner, whereby the upper electrode of the capacitor 100 can be provided in the opening 290 with favorable embeddability, and thus the capacitor 100 can have increased electrostatic capacitance.

Then, the conductive film 120A and the insulating film 130A are processed by a lithography method to form the conductor 120 and the insulator 130 (see FIG. 1). Note that it is also possible that the insulating film 130A is not processed into the insulator 130 and remains the insulating film 130A. Alternatively, the conductor 120 may be formed so that a portion above the insulator 281 functions as a wiring, or a conductor functioning as a wiring may be formed in a layer above the conductor 120.

Through the above process, the semiconductor device that is illustrated in FIG. 1 and includes the transistor 200 and the capacitor 100 can be manufactured. As illustrated in FIG. 3 to FIG. 14, with the use of the method for manufacturing the semiconductor device described in this embodiment, the transistor 200 and the capacitor 100 can be manufactured.

According to one embodiment of the present invention, a semiconductor device that can be miniaturized or highly integrated can be provided. Alternatively, according to one embodiment of the present invention, a semiconductor device with favorable electrical characteristics can be provided. Alternatively, according to one embodiment of the present invention, a semiconductor device with a high on-state current can be provided. Alternatively, according to one embodiment of the present invention, a semiconductor device with favorable frequency characteristics can be provided. Alternatively, according to one embodiment of the present invention, a highly reliable semiconductor device can be provided. Alternatively, according to one embodiment of the present invention, a semiconductor device with a low off-state current can be provided. Alternatively, according to one embodiment of the present invention, a semiconductor device with reduced power consumption can be provided. Alternatively, according to one embodiment of the present invention, a semiconductor device with high productivity can be provided.

<Modification Example of Semiconductor Device>

Examples of semiconductor devices of embodiments of the present invention which are different from the semiconductor device described in <Structure example of semiconductor device> above will be described below with reference to FIG. 15 and FIG. 16.

In FIG. 15 and FIG. 16, (A) of each drawing is a top view. Moreover, (B) of each drawing is a cross-sectional view corresponding to a portion indicated by the dashed-dotted line A1-A2 in (A), and is also a cross-sectional view of the transistor 200 in the channel length direction. Furthermore, FIG. 15(C) is a cross-sectional view corresponding to a portion indicated by the dashed-dotted line A3-A4 in FIG. 15(A), and is also a cross-sectional view of the transistor 200 in the channel width direction. Furthermore, FIG. 15(D) is a cross-sectional view corresponding to a portion indicated by the dashed-dotted line A5-A6 in FIG. 15(A), and is also a cross-sectional view of the source region or the drain region of the transistor 200 in the channel width direction. Note that for clarity of the drawings, some components are not illustrated in the top view of (A) of each drawing.

Note that in the semiconductor devices illustrated in FIG. 15 and FIG. 16, components having the same functions as the components in the semiconductor device described in <Structure example of semiconductor device> (see FIG. 1) are denoted by the same reference numerals. Note that in this section, the materials described in detail in <Structure example of semiconductor device> can be used as the constituent materials for the transistor 200 and the capacitor 100.

<Modification Example 1 of Semiconductor Device>

In the semiconductor device illustrated in FIG. 1, the insulator 241 is provided in contact with the side surface of the opening in which the capacitor 100 is provided; however, this embodiment is not limited thereto. As in the semiconductor device illustrated in FIG. 15, a structure may be employed in which the insulator 241 is not provided in the capacitor 100.

In that case, the conductor 110 preferably has a function of inhibiting diffusion of hydrogen (e.g., at least one of a hydrogen atom, a hydrogen molecule, and the like). In addition, the conductor 110 preferably has a function of inhibiting diffusion of oxygen (e.g., at least one of an oxygen atom, an oxygen molecule, and the like). The conductor 110 preferably has lower permeability of one or both of oxygen and hydrogen than the insulator 280. For example, tantalum, tantalum nitride, titanium, titanium nitride, ruthenium, ruthenium oxide, or the like is preferably used for the conductor 110. With such a structure, excess oxygen and impurities such as hydrogen can be prevented from being diffused from the insulator 280 into the oxide 230b through the conductor 110.

<Modification Example 2 of Semiconductor Device>

Figure 16A:
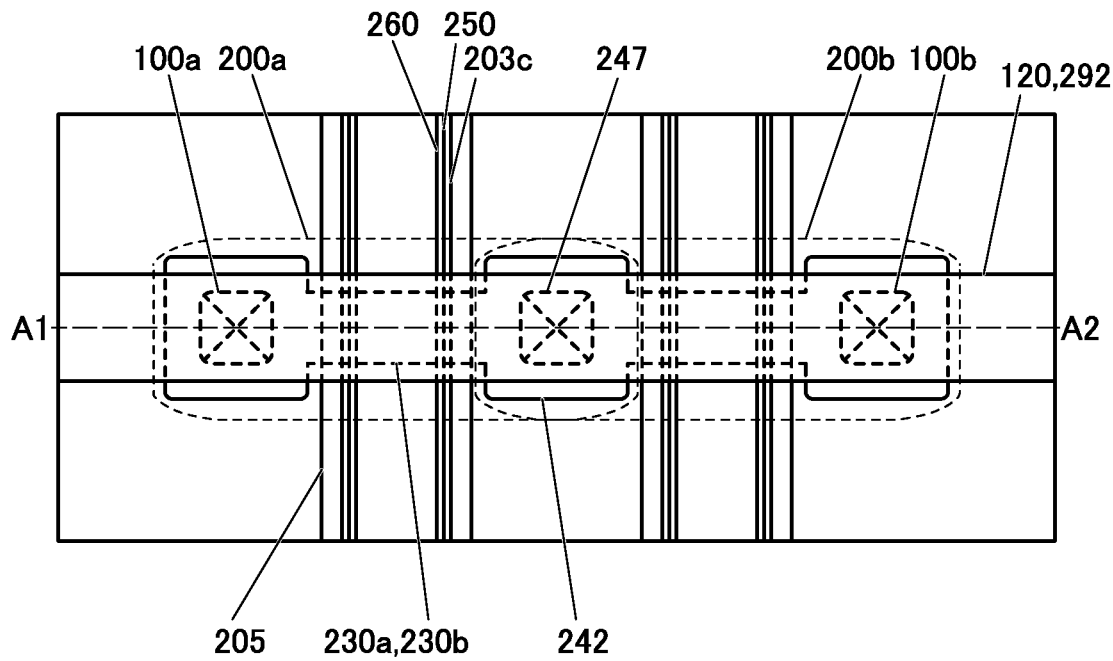
FIGS. 16(A) and (B) A top view and a cross-sectional view of a semiconductor device according to one embodiment of the present invention.
Figure 16B:
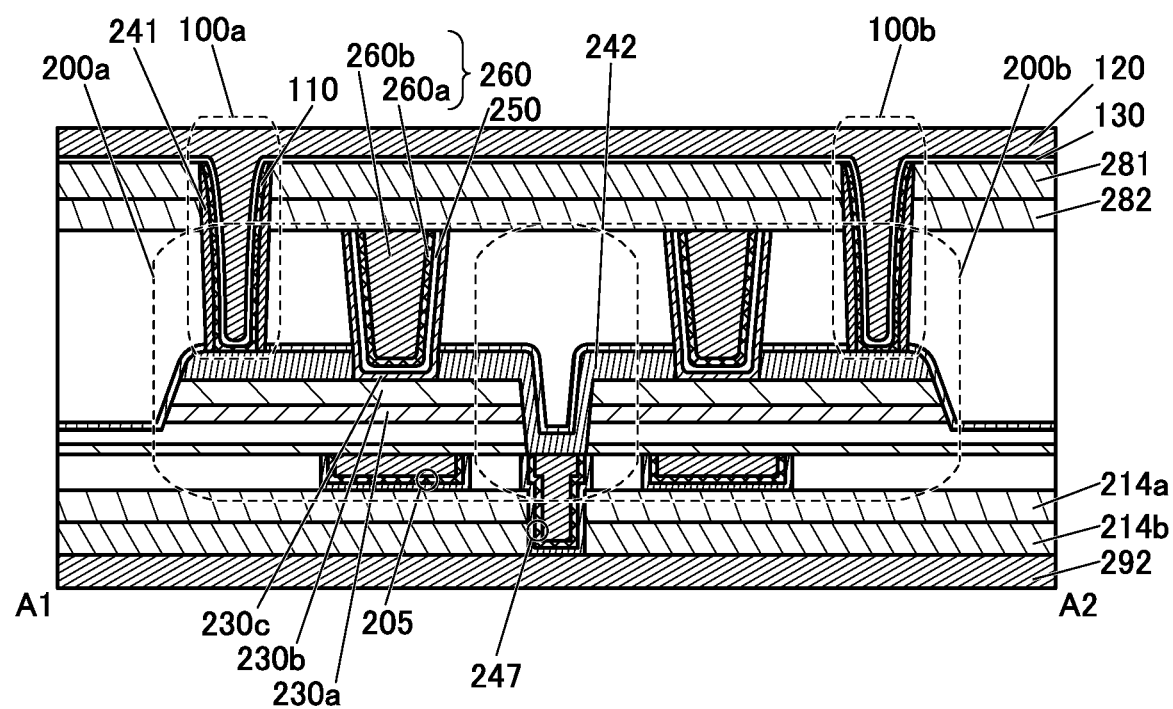

The semiconductor device illustrated in FIG. 16A and FIG. 16B includes a transistor 200a, a capacitor 100a, a transistor 200b, and a capacitor 100b.

In the semiconductor device illustrated in FIG. 16, the transistor 200a and the transistor 200b each have a structure similar to that of the transistor 200 except that the conductor 247, the oxide 230a, the oxide 230b, and the conductor 242 are shared between the transistor 200a and the transistor 200b. Thus, the above description can be referred to for the details. In addition, the capacitor 100a and the capacitor 100b each have a structure similar to that of the capacitor 100 except that the conductor 120 and the insulator 130 are shared between the capacitor 100a and the capacitor 100b. Thus, the above description can be referred to for the details.

As illustrated in FIGS. 16(A) and 16(B), when the transistor 200a and the transistor 200b share the conductor 247, the area occupied by one transistor element in the top view can be reduced; therefore, higher integration of the semiconductor device can be achieved.

Note that in the semiconductor device illustrated in FIG. 16, a conductor 292 functioning as a wiring is provided in contact with a bottom surface of the conductor 247. As illustrated in FIG. 16(A), the conductor 120 and the conductor 292 functioning as wirings can be formed to extend in the A1-A2 direction and the conductor 260 and the conductor 205 functioning as wirings can be formed to extend in the A3-A4 direction. Thus, the semiconductor devices illustrated in FIG. 16 can be arranged in the A1-A2 direction and the A3-A4 direction, i.e., in a matrix.

Alternatively, as illustrated in FIG. 16(B), the insulator 214 may have a stacked-layer structure of an insulator 214a and an insulator 214b. Silicon nitride may be used for the insulator 214a and aluminum oxide may be used for the insulator 214b, for example. In this case, it is preferable that silicon nitride be used for the insulator 281 and aluminum oxide be used for the insulator 282. With such a structure, the transistor 200a and the transistor 200b are sandwiched between silicon nitride through which impurities such as water and hydrogen are less likely to be diffused, and thus diffusion of impurities such as water and hydrogen into the oxide 230 can be inhibited.

The structure, method, and the like described above in this embodiment can be used in combination as appropriate with the structures, methods, and the like described in the other embodiments and the like.

Embodiment 2

In this embodiment, one embodiment of a semiconductor device will be described with reference to FIG. 17 to FIG. 21.

[Memory Device 1]

Figure 17:
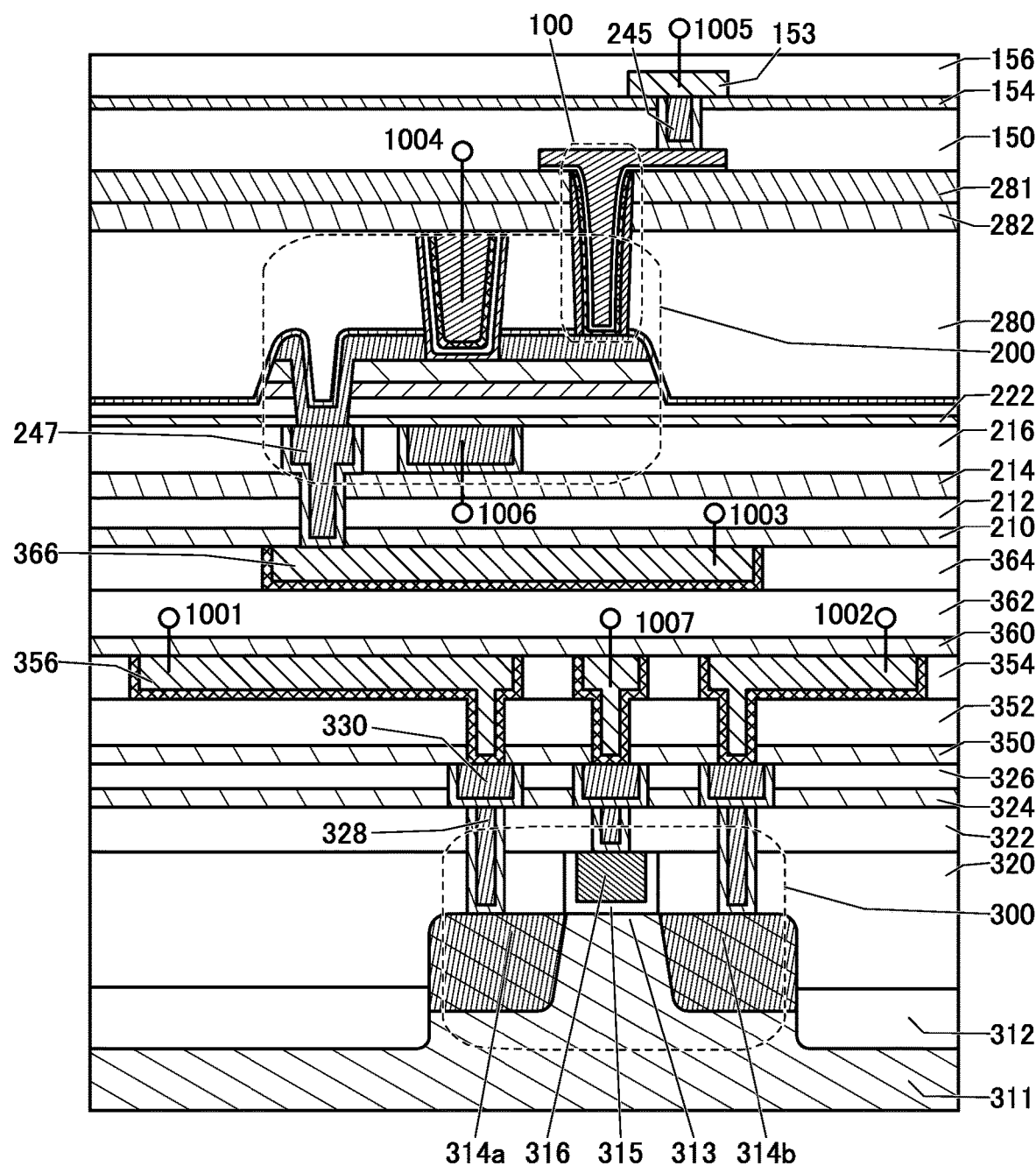
FIG. 17 A cross-sectional view illustrating a structure of a memory device according to one embodiment of the present invention.

FIG. 17 illustrates an example of a semiconductor device (memory device) of one embodiment of the present invention using transistors and a capacitor. In the semiconductor device of one embodiment of the present invention, the transistor 200 is provided above the transistor 300, and the capacitor 100 is provided above the transistor 200. At least part of the capacitor 100 or the transistor 300 preferably overlaps with the transistor 200. Accordingly, the area occupied by the capacitor 100, the transistor 200, and the transistor 300 in a top view can be reduced, whereby miniaturization or high integration of the semiconductor device of this embodiment can be achieved. The semiconductor device according to this embodiment can be applied to logic circuits typified by a CPU (Central Processing Unit) and a GPU (Graphics Processing Unit) and memory circuits typified by DRAM (Dynamic Random Access Memory) and NVM (Non-Volatile Memory), for example.

Note that the transistor 200 and the capacitor 100 described in the above embodiment can be used as the transistor 200 and the capacitor 100. Therefore, for the transistor 200, the capacitor 100, and layers including the transistor 200 or the capacitor 100, the description in the above embodiment can be referred to. Although in the semiconductor device illustrated in FIG. 17, the transistor 200 and the capacitor 100 have the same structures as those of the transistor 200 and the capacitor 100 illustrated in FIG. 1, the present invention is not limited thereto. The structure illustrated in FIG. 15 or FIG. 16 can be employed for the semiconductor device illustrated in FIG. 17, for example, and the same applies to semiconductor devices illustrated in FIG. 18 to FIG. 20.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device. The transistor 200 exhibits favorable electrical characteristics at high temperatures, in comparison with a transistor using silicon in a semiconductor layer. For example, the transistor 200 has favorable electrical characteristics even within the temperature range of 125° C. to 150° C. Moreover, the transistor 200 has an on/off ratio of 10 digits or larger within the temperature range of 125° C. to 150° C. In other words, in comparison with a transistor using silicon in a semiconductor layer, the transistor 200 excels in characteristics such as on-state current and frequency characteristics at higher temperatures.

In the semiconductor device illustrated in FIG. 17, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of the source and the drain of the transistor 200, a wiring 1004 is electrically connected to the first gate of the transistor 200, and a wiring 1006 is electrically connected to the second gate of the transistor 200. The other of the source and the drain of the transistor 200 is electrically connected to one electrode of the capacitor 100, and a wiring 1005 is electrically connected to the other electrode of the capacitor 100. The wiring 1003 may be electrically connected to the wiring 1001, the wiring 1002, or the wiring 1007.

The semiconductor device illustrated in FIG. 17 has a characteristic of being able to retain charge stored in the one electrode of the capacitor 100 by switching of the transistor 200; thus, writing, retention, and reading of data can be performed. The transistor 200 is an element to which the back gate is provided in addition to the source, the gate (front gate), and the drain. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. In contrast, in the semiconductor device illustrated in FIG. 17, data rewriting is performed by charging or discharging of electrons with the transistor and the capacitor; thus, the semiconductor device has characteristics such as high write endurance and a few structure changes.

Furthermore, by arranging the semiconductor devices illustrated in FIG. 17 in a matrix, a memory cell array can be formed. In this case, the transistor 300 can be used for a sense amplifier, a read circuit, a driver circuit, or the like that is connected to the memory cell array. Note that in the case where the transistor 300 is used for part of the sense amplifier, the wiring 1003 is preferably electrically connected to the wiring 1001, the wiring 1002, or the wiring 1007. When the semiconductor device illustrated in FIG. 17 is used as a memory element, for example, an operation frequency of 200 MHz or higher is achieved at a driving voltage of 2.5 V and an evaluation environment temperature within the range of −40° C. to 85° C.

As described in the above embodiment, the conductor 247 is placed below the transistor 200, whereby the parasitic capacitances of the conductor 247 and the wiring connected to the conductor 247 can be reduced. Thus, even when the transistor 300 is used for the sense amplifier, electrostatic capacitance required for the capacitor 100 can be reduced. As a result, the capacitor 100 can be miniaturized and thus the semiconductor device according to this embodiment can be miniaturized or highly integrated.

<Transistor 300>

The transistor 300 is provided over a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is placed over the semiconductor region 313, and the conductor 316 is placed over the insulator 315. The transistors 300 formed in the same layer are electrically isolated from each other by an insulator 312 functioning as an element isolation insulating layer. As the insulator 312, an insulator similar to that used as an insulator 326 or the like described later can be used. The transistor 300 may be a p-channel transistor or an n-channel transistor.

In the substrate 311, it is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor; and it is also preferable that single crystal silicon be contained therein. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or using a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 17, the semiconductor region 313 (part of the substrate 311) where a channel is formed has a convex shape. Furthermore, the conductor 316 is provided to cover a side surface and a top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 17 is just an example and the structure is not limited thereto; an appropriate transistor can be used in accordance with a circuit structure or a driving method.

As illustrated in FIG. 17, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device illustrated in FIG. 17, a silicon-based semiconductor material and an oxide semiconductor can be used in different layers. The semiconductor device illustrated in FIG. 17 can be manufactured in a process similar to that employing an apparatus for manufacturing a semiconductor device containing a silicon-based semiconductor material, and can be highly integrated.

<Wiring Layer>

Wiring layers provided with an interlayer film, a wiring, a plug, and the like may be provided between the components. A plurality of wiring layers can be provided in accordance with the design. Here, a plurality of conductors having a function of plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked over the transistor 300 in this order as interlayer films. Moreover, a conductor 328 and a conductor 330 are formed in the insulator 320, the insulator 322, the insulator 324, and the insulator 326. The conductor 328 and the conductor 330 function as plugs or wirings. For example, as illustrated in FIG. 17, the conductor 328 and the conductor 330 can each function as at least one of a wiring for connecting the wiring 1001 and the source of the transistor 300, a wiring for connecting the wiring 1002 and the drain of the transistor 300, and a wiring for connecting the wiring 1007 and the gate of the transistor 300.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 17, an insulator 350, an insulator 352, and an insulator 354 are stacked in this order. Furthermore, a conductor 356 is formed in the insulator 350, the insulator 352, and the insulator 354. The conductor 356 functions as a plug or a wiring. For example, as illustrated in FIG. 17, the conductor 356 can function as at least one of a wiring for connecting the wiring 1001 and the source of the transistor 300, a wiring for connecting the wiring 1002 and the drain of the transistor 300, and a wiring for connecting the wiring 1007 and the gate of the transistor 300.

An insulator 360 is placed over the insulator 354, an insulator 362 is placed over the insulator 360, an insulator 364 is placed over the insulator 362, and an insulator 210 is placed over the insulator 364.

An opening is formed in the insulator 364, and a conductor 366 connected to the wiring 1003 is placed in the opening. The conductor 366 is in contact with the bottom surface of the conductor 247. That is, the conductor 366 functions as a wiring for connecting one of the source and the drain of the transistor 200 and the wiring 1003. For the conductor 366, an insulator that can be used for the conductor 356 and the like can be used.

In the case where the transistor 300 is used as part of the sense amplifier, the conductor 366 may penetrate the insulator 362 and the insulator 360 to be in contact with the conductor 356. In other words, the wiring 1003 may be connected to at least one of the wiring 1001, the wiring 1002, and the wiring 1007. With such a structure, the length of a wiring for connecting the transistor 200 and the transistor 300 can be shortened as compared to the case where the wiring is led over the transistor 200, so that the parasitic capacitance of the wiring can be reduced. Thus, even when the transistor 300 is used for the sense amplifier, electrostatic capacitance required for the capacitor 100 can be reduced. As a result, the capacitor 100 can be miniaturized and thus the semiconductor device according to this embodiment can be miniaturized or highly integrated.

The conductor 247 in contact with the conductor 366, a conductor (the conductor 205) included in the transistor 200, and the like are embedded in the insulator 210, the insulator 212, the insulator 214, and the insulator 216. Note that the conductor 247 has a function of a plug or a wiring that is electrically connected to the transistor 200.

A wiring layer may be provided over the capacitor 100. In the semiconductor device illustrated in FIG. 17, an insulator 150, an insulator 154, and an insulator 156 are stacked sequentially to cover the insulator 281. In the insulator 150 and the insulator 154, a conductor 245 is formed in contact with the other electrode of the capacitor 100. A conductor 153 functioning as a terminal connected to the wiring 1005 is provided in contact with a top surface of the conductor 245. The conductor 153 is covered with the insulator 156.

Examples of an insulator that can be used as an interlayer film include an oxide, a nitride, an oxynitride, a nitride oxide, a metal oxide, a metal oxynitride, and a metal nitride oxide, each of which has an insulating property. For example, when a material with a low relative permittivity is used for the insulator functioning as an interlayer film, the parasitic capacitance generated between wirings can be reduced. Accordingly, a material is preferably selected depending on the function of an insulator.

For example, for the insulator 320, the insulator 322, the insulator 326, the insulator 352, the insulator 354, the insulator 362, the insulator 364, the insulator 212, the insulator 150, the insulator 156, and the like, an insulator with a low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

It is preferable that the resistivity of an insulator provided over or under the conductor 153 be within the range of $1.0 \times 10^{12}$ Ωcm to $1.0 \times 10^{15}$ Ωcm, preferably within the range of $5.0 \times 10^{12}$ Ωcm to $1.0 \times 10^{14}$ Ωcm, further preferably within the range of $1.0 \times 10^{13}$ Ωcm and to $5.0 \times 10^{13}$ Ωcm. When the resistivity of the insulator provided over or under the conductor 153 is within the above range, the insulator can disperse charge accumulated between the transistor 200, the transistor 300, the capacitor 100, the conductor 153, and the like and can prevent poor characteristics and electrostatic breakdown of the transistor and a semiconductor device including the transistor due to the charge, while maintaining the insulating property, which is preferable. For such an insulator, silicon nitride or silicon nitride oxide can be used. For example, the resistivity of the insulator 281 is set within the above range.

Furthermore, when a transistor using an oxide semiconductor is surrounded by an insulator having a function of inhibiting the permeation of oxygen and impurities such as hydrogen, the electrical characteristics of the transistor can be stable. Thus, an insulator having a function of inhibiting the permeation of oxygen and impurities such as hydrogen is used as the insulator 324, the insulator 350, the insulator 360, the insulator 210, the insulator 154, and the like.

As the insulator having a function of inhibiting the permeation of oxygen and impurities such as hydrogen, an insulator, which is a single layer or a stacked layer containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the permeation of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide or silicon nitride; or the like can be used.

As the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, as the conductor 328, the conductor 330, the conductor 356, the conductor 366, the conductor 247, the conductor 245, the conductor 153, and the like, a single layer or a stacked layer of a conductive material such as a metal material, an alloy material, a metal nitride material, or a metal oxide material which is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

The above is the description of the structure example. With the use of this structure, the semiconductor device using the transistor including an oxide semiconductor can be miniaturized or highly integrated. Furthermore, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with a low off-state current can be provided. Alternatively, a semiconductor device with reduced power consumption can be provided.

Figure 18:
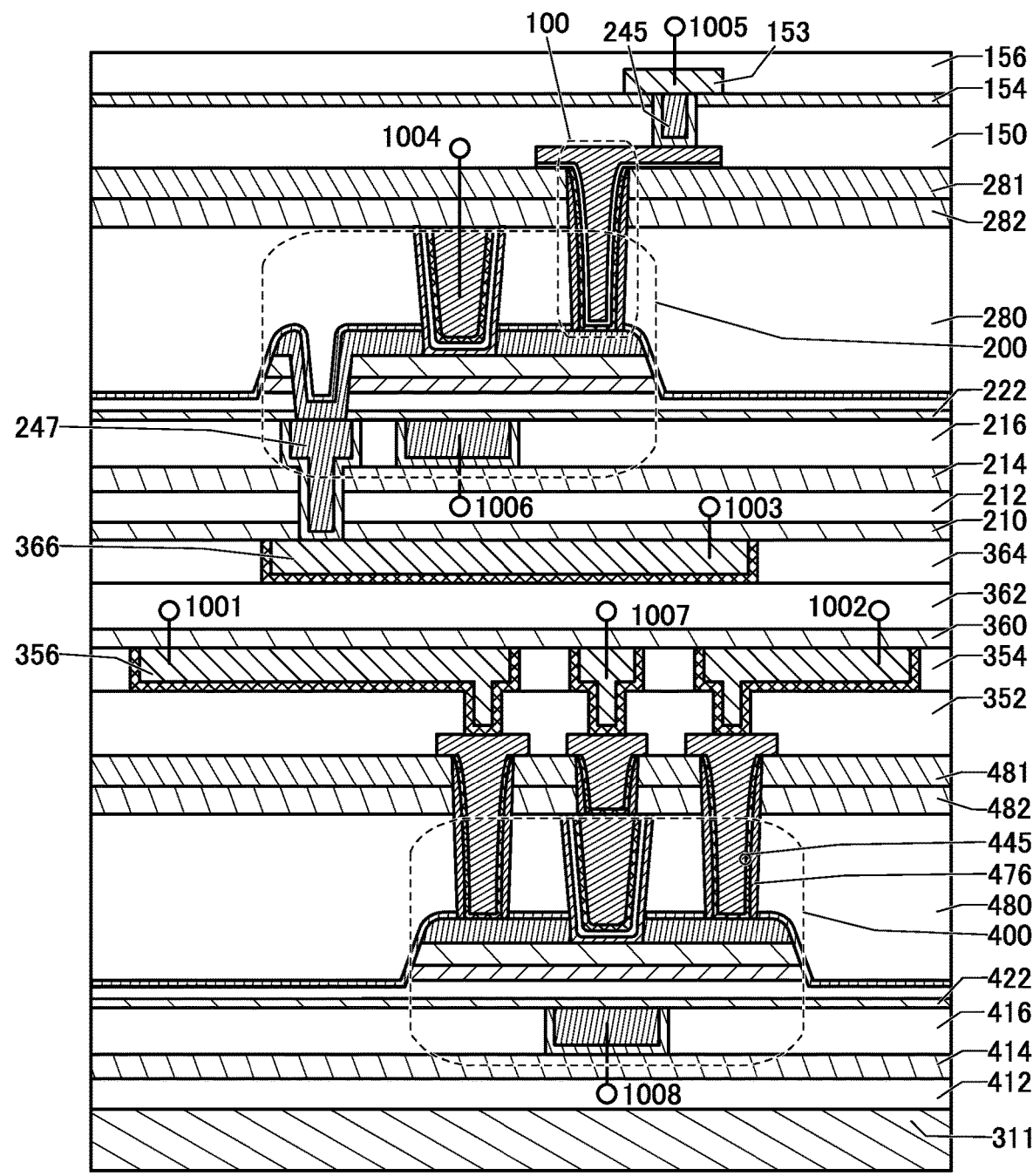
FIG. 18 A cross-sectional view illustrating a structure of a memory device according to one embodiment of the present invention.

Note that although FIG. 17 shows an example in which the transistor 300 whose channel region is formed in the substrate 311 is provided, the semiconductor device described in this embodiment is not limited thereto. For example, as illustrated in FIG. 18, a transistor 400 including an oxide semiconductor may be provided under the transistor 200. The semiconductor device illustrated in FIG. 18 has a structure similar to that of the semiconductor device illustrated in FIG. 17 except that the transistor 400 is provided instead of the transistor 300.

Unlike the semiconductor device illustrated in FIG. 17, the semiconductor device illustrated in FIG. 18 includes an insulator 412, an insulator 414, an insulator 416, an insulator 422, an insulator 480, an insulator 482, an insulator 481, and the transistor 400 formed in the layers between the substrate 311 and the insulator 352. Here, the insulator 412, the insulator 414, the insulator 416, the insulator 422, the insulator 480, the insulator 482, the insulator 481, and the transistor 400 correspond to the insulator 212, the insulator 214, the insulator 216, the insulator 222, the insulator 280, the insulator 282, the insulator 281, and the transistor 200, respectively.

That is, the transistor 400 and a layer including the transistor 400 have structures similar to those of the above-described transistor 200 and the above-described layer including the transistor 200. Therefore, the above description can be referred to for the details of the transistor 400 and the layer including the transistor 400.

Conductors 445 are embedded in openings formed in the insulator 480, the insulator 482, and the insulator 481. The conductors 445 function as a plug for connecting the wiring 1001 and a source of the transistor 400, a plug for connecting the wiring 1002 and a drain of the transistor 400, and a plug for connecting the wiring 1007 and a gate of the transistor 400.

For the conductor 445, a conductive material containing tungsten, copper, or aluminum as its main component is preferably used. The conductor 445 may have a stacked-layer structure.

In the case where the conductor 445 has a stacked-layer structure, a conductive material having a function of inhibiting the permeation of oxygen and impurities such as water and hydrogen is preferably used for a conductor in a lower layer. For example, tantalum, tantalum nitride, titanium, titanium nitride, ruthenium, ruthenium oxide, or the like is preferably used. A single layer or a stacked layer of the conductive material having a function of inhibiting the permeation of oxygen and impurities such as water and hydrogen may be used. The use of the conductive material can prevent oxygen added to the insulator 480 from being absorbed into the conductor 445. Moreover, impurities such as water and hydrogen can be inhibited from entering the transistor 400 through the conductor 445 from a layer above the insulator 481.

In the case where an oxide semiconductor is used in the transistor 400, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, an insulator 476 is preferably provided between the insulator 480 containing excess oxygen and the conductor 445 as illustrated in FIG. 18. Here, the insulator 476 has a structure similar to that of the insulator 241 described in the above embodiment. When the insulator 476 is provided, absorption of excess oxygen contained in the insulator 480 by the conductor 445 can be inhibited. In addition, when the insulator 476 is included, diffusion of hydrogen, which is an impurity, into the transistor 400 through the conductor 445 can be inhibited.

[Memory Device 2]

Figure 19:
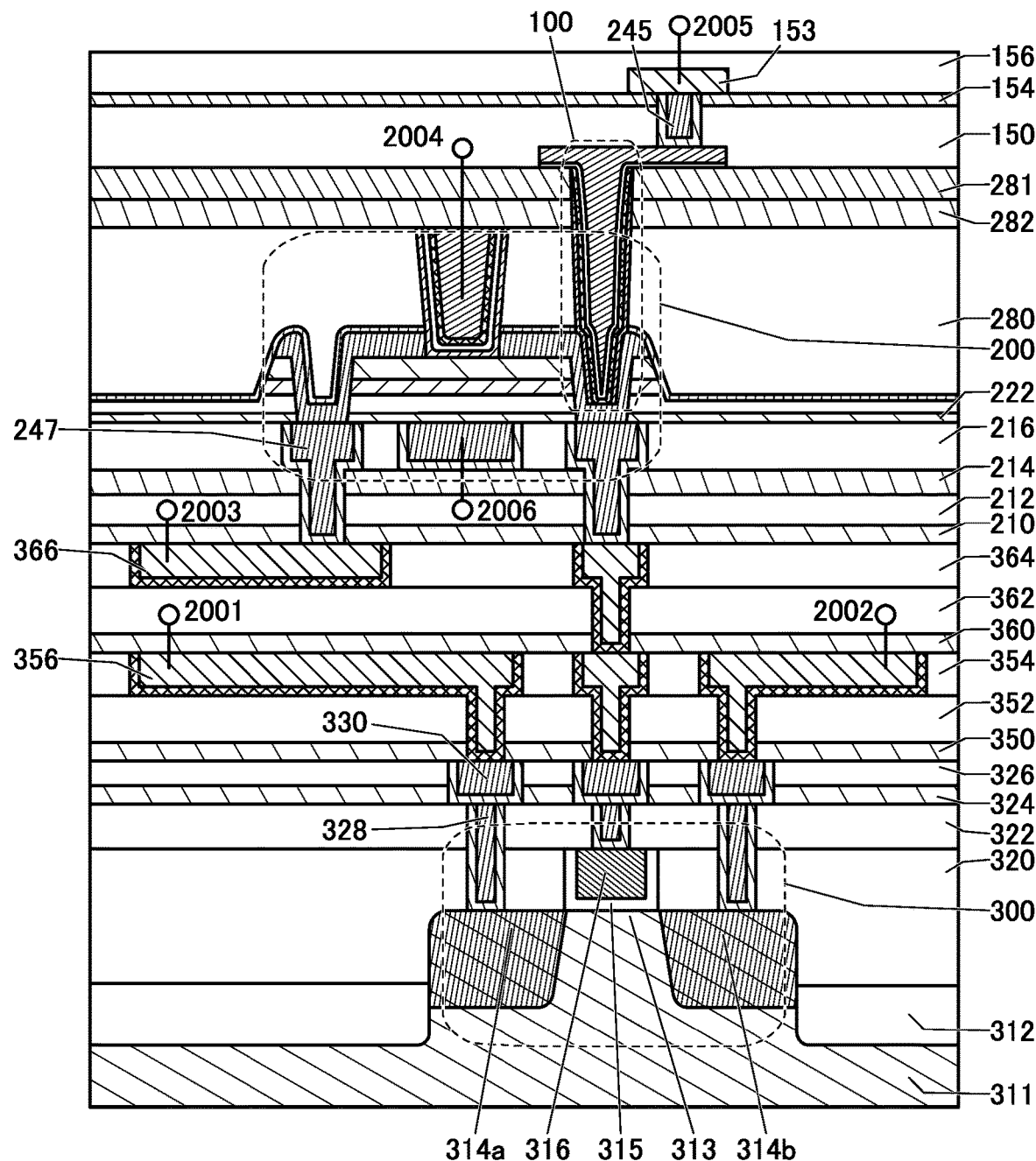
FIG. 19 A cross-sectional view illustrating a structure of a memory device according to one embodiment of the present invention.

FIG. 19 shows an example of a semiconductor device (memory device) using the semiconductor device of one embodiment of the present invention. Like the semiconductor device illustrated in FIG. 17, the semiconductor device illustrated in FIG. 19 includes the transistor 200, the transistor 300, and the capacitor 100. Note that the semiconductor device illustrated in FIG. 19 differs from the semiconductor device illustrated in FIG. 17 in that the transistor 200 and the transistor 300 are electrically connected to each other through one conductor 247 and one conductor 366.

In the semiconductor device of one embodiment of the present invention, the transistor 200 is provided above the transistor 300, and the capacitor 100 is provided above the transistor 200. Preferably, at least part of the capacitor 100 or the transistor 300 overlaps with the transistor 200. Accordingly, the area occupied by the capacitor 100, the transistor 200, and the transistor 300 in a top view can be reduced, so that the semiconductor device according to this embodiment can be miniaturized or highly integrated.

Note that the transistor 200 and the transistor 300 mentioned above can be used as the transistor 200 and the transistor 300, respectively. Therefore, the above description can be referred to for the transistor 200, the transistor 300, and the layers including these transistors.

In the semiconductor device illustrated in FIG. 19, a wiring 2001 is electrically connected to the source of the transistor 300, and a wiring 2002 is electrically connected to the drain of the transistor 300. A wiring 2003 is electrically connected to one of the source and the drain of the transistor 200, a wiring 2004 is electrically connected to the first gate of the transistor 200, and a wiring 2006 is electrically connected to the second gate of the transistor 200. The gate of the transistor 300 and the other of the source and the drain of the transistor 200 are electrically connected to one electrode of the capacitor 100. The wiring 2005 is electrically connected to the other electrode of the capacitor 100. Note that a node where the gate of the transistor 300, the other of the source and the drain of the transistor 200, and the one electrode of the capacitor 100 are connected to each other is hereinafter referred to as a node FG in some cases.

The semiconductor device illustrated in FIG. 19 can write, store, and read data using the characteristics that the potential of the gate (node FG) of the transistor 300 can be retained by switching of the transistor 200. The semiconductor devices illustrated in FIG. 19 can form a memory cell array when arranged in a matrix.

In the semiconductor device illustrated in FIG. 19, the conductor 247 and the conductor 366 are placed under the other of the source and the drain of the transistor 200 and the one electrode of the capacitor 100 to overlap with the other of the source and the drain of the transistor 200 and the one electrode of the capacitor 100. The conductor 247 and the conductor 366 function as part of the node FG, and can electrically connect the gate of the transistor 300, the other of the source and the drain of the transistor 200, and the one electrode of the capacitor 100.

In the semiconductor device illustrated in FIG. 19, the other of the source and the drain of the transistor 200 is formed to have a recess in some cases. In this case, as illustrated in FIG. 19, the capacitor 100 may be formed to fill the recess of the other of the source and the drain of the transistor 200.

Figure 20:
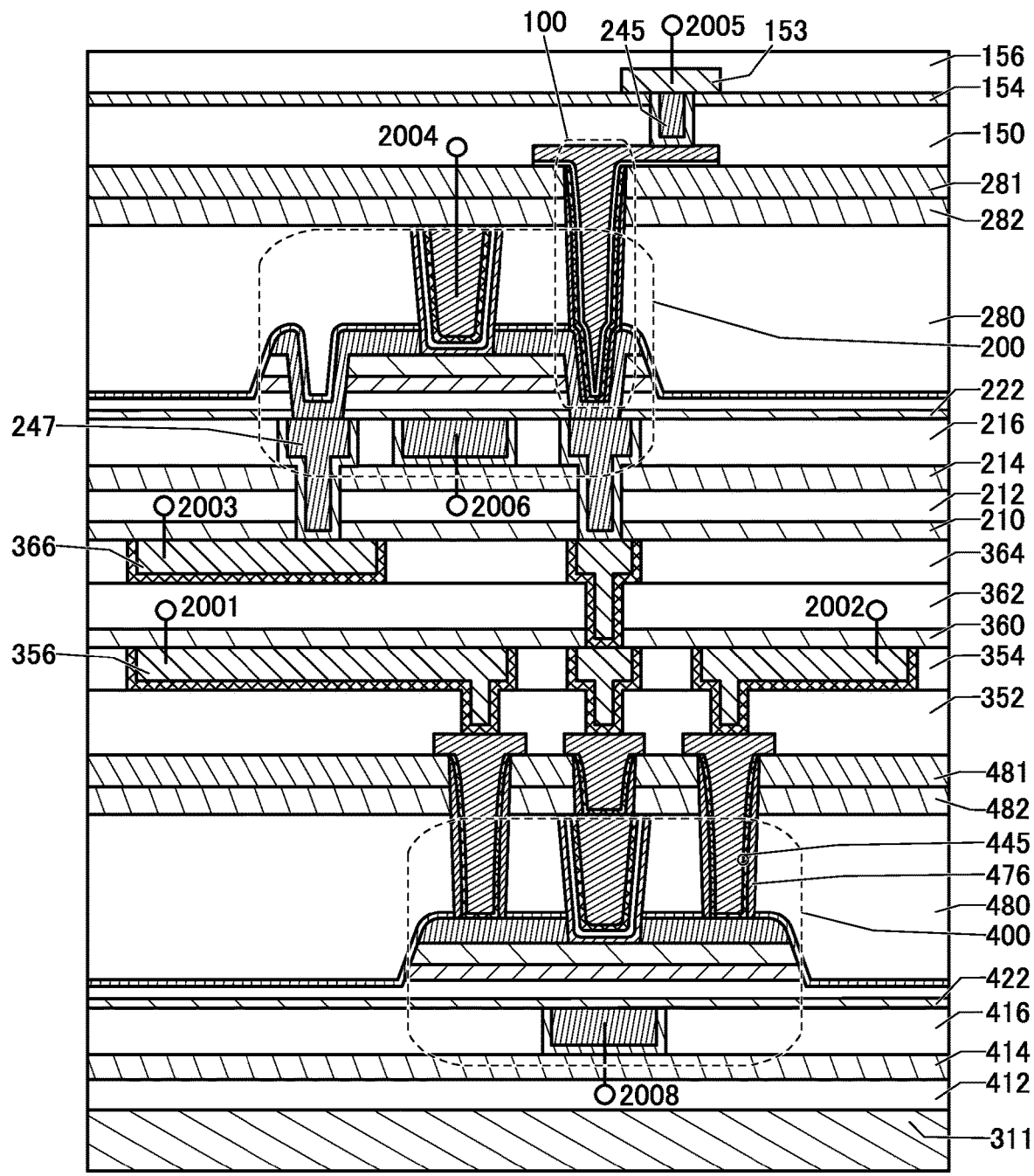
FIG. 20 A cross-sectional view illustrating a structure of a memory device according to one embodiment of the present invention.

Note that although FIG. 19 shows an example in which the transistor 300 whose channel region is formed in the substrate 311 is provided, the semiconductor device described in this embodiment is not limited thereto. For example, as illustrated in FIG. 20, a transistor 400 including an oxide semiconductor may be provided under the transistor 200. The semiconductor device illustrated in FIG. 20 has a structure similar to that of the semiconductor device illustrated in FIG. 19 except that the transistor 400 is provided instead of the transistor 300. The transistor 400 has a structure similar to that of the semiconductor device illustrated in FIG. 18.

Figure 21:
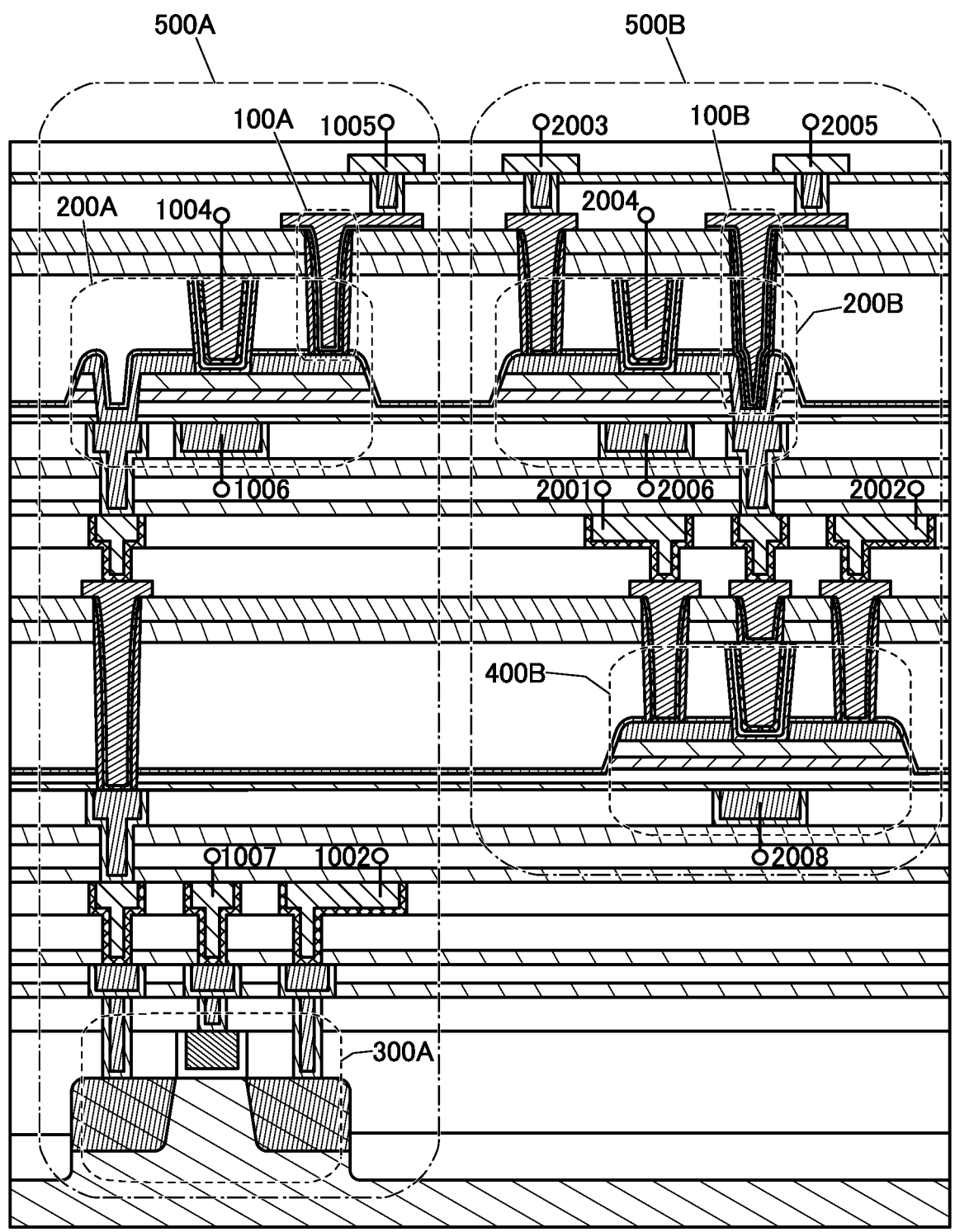
FIG. 21 A cross-sectional view illustrating a structure of a memory device according to one embodiment of the present invention.

Alternatively, the semiconductor devices illustrated in FIG. 17 to FIG. 20 may be provided over the same substrate. For example, as illustrated in FIG. 21, a semiconductor device 500A corresponding to the semiconductor device illustrated in FIG. 17 and a semiconductor device 500B corresponding to the semiconductor device illustrated in FIG. 20 may be provided over the same substrate.

The semiconductor device 500A includes a transistor 300A, a transistor 200A, and a capacitor 100A. In addition, the semiconductor device 500B includes a transistor 400B, a transistor 200B, and a capacitor 100B. Here, the transistor 300A has a structure similar to that of the transistor 300. The transistor 200A and the transistor 200B have a structure similar to that of the transistor 200. The capacitor 100A and the capacitor 100B have a structure similar to that of the capacitor 100. The transistor 400B has a structure similar to that of the transistor 400. Accordingly, the above description can be referred to for the details of the structures.

Note that in the semiconductor device 500A, a structure in which the wiring 1003 and the wiring 1001, which are illustrated in FIG. 17, are connected to each other is shown.

In the semiconductor device 500B, a structure in which a plug connected to the wiring 2003 is provided over the transistor 200B is shown. Here, a plug connected to one of a source and a drain of the transistor 200B may have a structure similar to that of the above-described conductor 445, and an insulator similar to the insulator 476 is preferably provided. With such a structure, the plug can be easily formed in the same layer as the capacitor 100A and the capacitor 100B.

This embodiment can be implemented in combination with any of the structures described in the other embodiments and the like, as appropriate.

Embodiment 3

In this embodiment, a memory device of one embodiment of the present invention including a transistor in which an oxide is used for a semiconductor (hereinafter referred to as an OS transistor in some cases) and a capacitor (hereinafter such a memory device is also referred to as an OS memory device in some cases) will be described with reference to FIG. 22 and FIG. 23. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 22A:
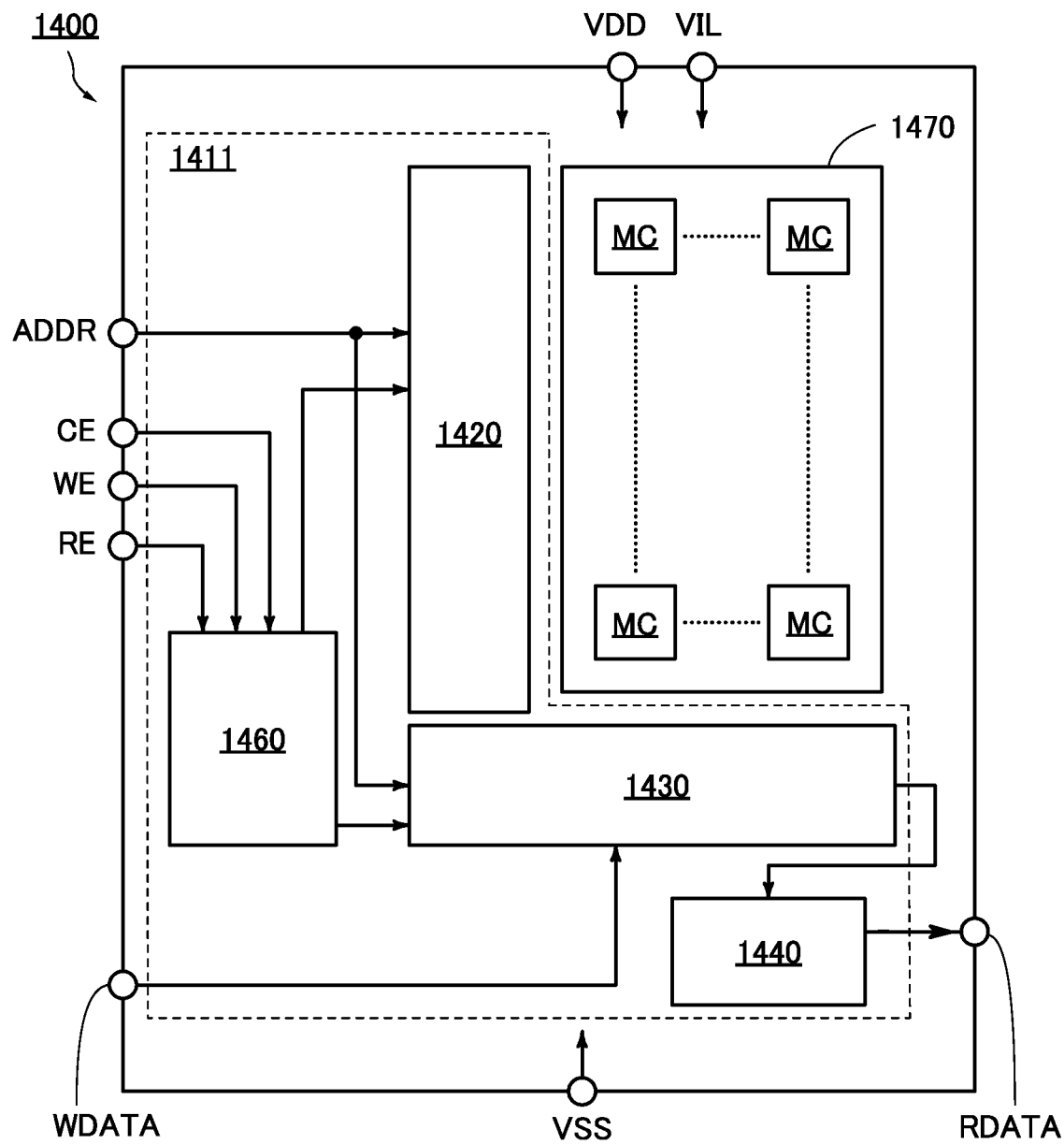
FIGS. 22(A) and (B) Block diagrams illustrating structure examples of a memory device according to one embodiment of the present invention.

FIG. 22(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are wirings connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 22B:
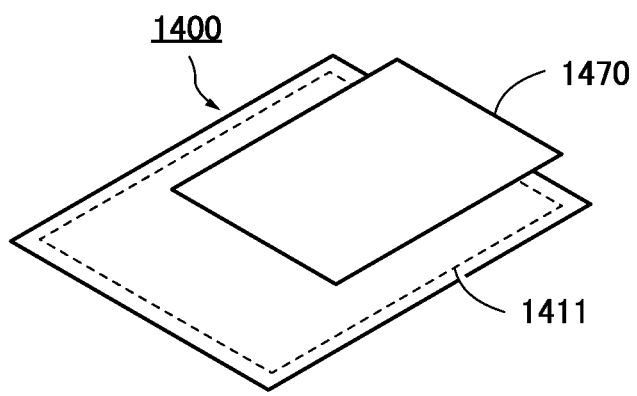

Note that FIG. 22(A) illustrates an example in which the peripheral circuit 1411 and the memory cell array 1470 are formed on the same plane; however, this embodiment is not limited thereto. For example, as illustrated in FIG. 22(B), the memory cell array 1470 may be provided to overlap with part of the peripheral circuit 1411. For example, the sense amplifier may be provided under the memory cell array 1470 so that they overlap with each other.

FIG. 23 illustrates structure examples of memory cells applicable to the memory cell MC.

[DOSRAM]

Figure 23A:
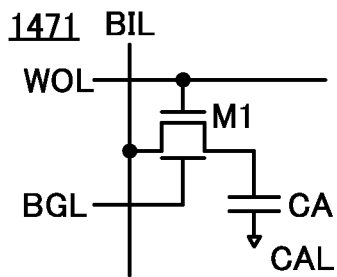
FIG. 23(A) to (H) Circuit diagrams illustrating structure examples of memory devices according to embodiments of the present invention.
Figure 23B:
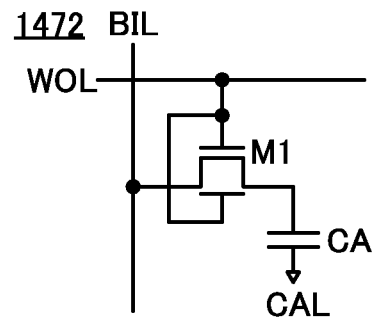
Figure 23C:
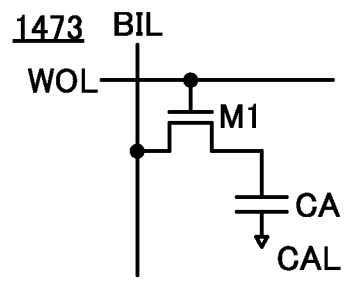

FIGS. 23(A) to 23(C) each illustrate a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 23(A) includes a transistor M1 and a capacitor CA. Note that the transistor M1 includes a gate (also referred to as a front gate in some cases) and a back gate.

A first terminal of the transistor M1 is connected to a first terminal of the capacitor CA, a second terminal of the transistor M1 is connected to a wiring BIL, a gate of the transistor M1 is connected to a wiring WOL, and a back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 23(A) corresponds to the memory device illustrated in FIG. 17 and FIG. 18. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 illustrated in FIG. 17 and FIG. 18 corresponds to a transistor provided in the peripheral circuit 1411 of the memory device 1400 illustrated in FIG. 22(B). For example, the transistor 300 illustrated in FIG. 17 and FIG. 18 is included in the sense amplifier included in the peripheral circuit 1411.

The memory cell MC is not limited to the memory cell 1471, and the circuit structure can be changed. For example, in the memory cell MC, the back gate of the transistor M1 may be connected to the wiring WOL instead of the wiring BGL as in a memory cell 1472 illustrated in FIG. 23(B). As another example, the memory cell MC may be a memory cell configured with a single-gate transistor, that is, the transistor M1 that does not have a back gate, like a memory cell 1473 illustrated in FIG. 23(C).

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time with the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, or the memory cell 1473.

In addition, in the DOSRAM, when the sense amplifier is provided under the memory cell array 1470 to overlap with the memory cell array 1470 as described above, the bit line can be shortened. This reduces bit line capacity, which reduces the storage capacity of the memory cell.

[NOSRAM]

FIGS. 23(D) to 23(H) each illustrate a circuit structure example of a gain-cell memory cell including two transistors and one capacitor. A memory cell 1474 illustrated in FIG. 23(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 23D:
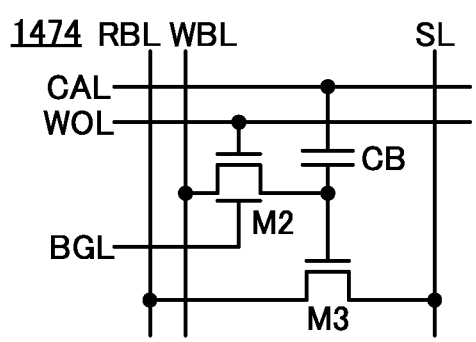
Figure 23E:
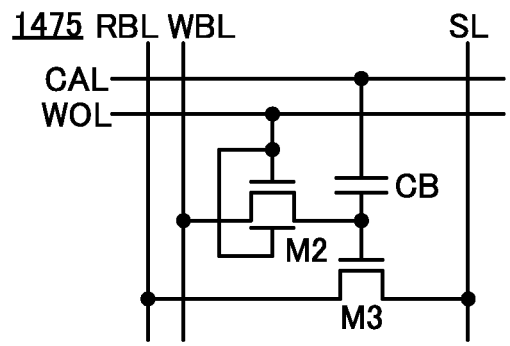
Figure 23F:
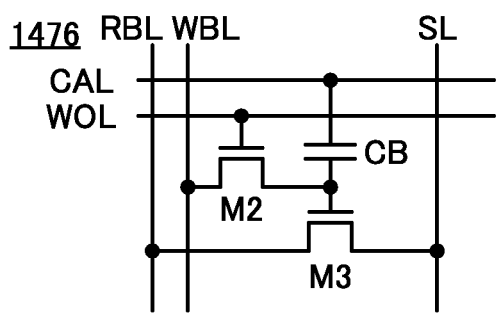
Figure 23G:
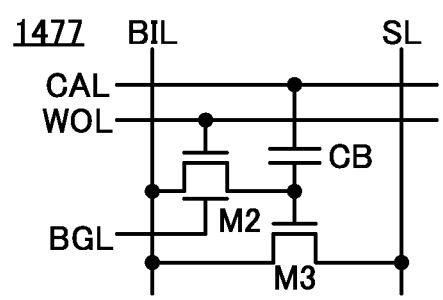

Here, the memory cell 1474 illustrated in FIG. 23(D) corresponds to the memory device illustrated in FIG. 19 and FIG. 20. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

In addition, the memory cell MC is not limited to the memory cell 1474, and the circuit structure can be changed as appropriate. For example, as in a memory cell 1475 illustrated in FIG. 23(E), a structure may be employed in which the back gate of the transistor M2 is connected not to the wiring BGL but to the wiring WOL in the memory cell MC. Alternatively, for example, like a memory cell 1476 illustrated in FIG. 23(F), the memory cell MC may be a memory cell including a single-gate transistor, that is, the transistor M2 that does not include a back gate. Alternatively, for example, like a memory cell 1477 illustrated in FIG. 23(G), the memory cell MC may have a structure in which the wiring WBL and the wiring RBL are combined into one wiring BIL.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. The use of an OS transistor as the transistor M2 enables the leakage current of the transistor M2 to be extremely low. Consequently, written data can be retained for a long time with the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cells 1475 to 1477.

Note that the transistor M3 may be a transistor containing silicon in a channel formation region (hereinafter such a transistor is referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistors M2 and M3, the circuit of the memory cell array 1470 can be formed using only n-channel transistors.

Figure 23H:
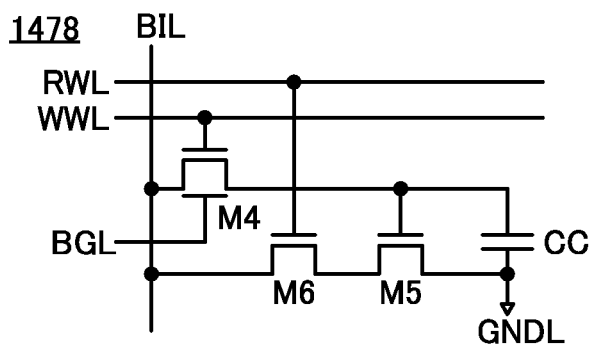

In addition, FIG. 23(H) illustrates an example of a gain-cell memory cell including three transistors and one capacitor. A memory cell 1478 illustrated in FIG. 23(H) includes transistors M4 to M6 and a capacitor CC. The capacitor CC is provided as appropriate. The memory cell 1478 is electrically connected to wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in the above embodiment is used in the memory cell 1478, the transistor 200 can be used as the transistor M4, the transistors 300 can be used as the transistors M5 and M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structure described in this embodiment can be used in an appropriate combination with the structures described in the other embodiments and the like.

Embodiment 4

In this embodiment, an example of a chip 1200 on which the semiconductor device of the present invention is mounted will be described with reference to FIG. 24. A plurality of circuits (systems) are mounted on the chip 1200. The technique for integrating a plurality of circuits (systems) on one chip as described above is referred to as system on chip (SoC) in some cases.

Figure 24A:
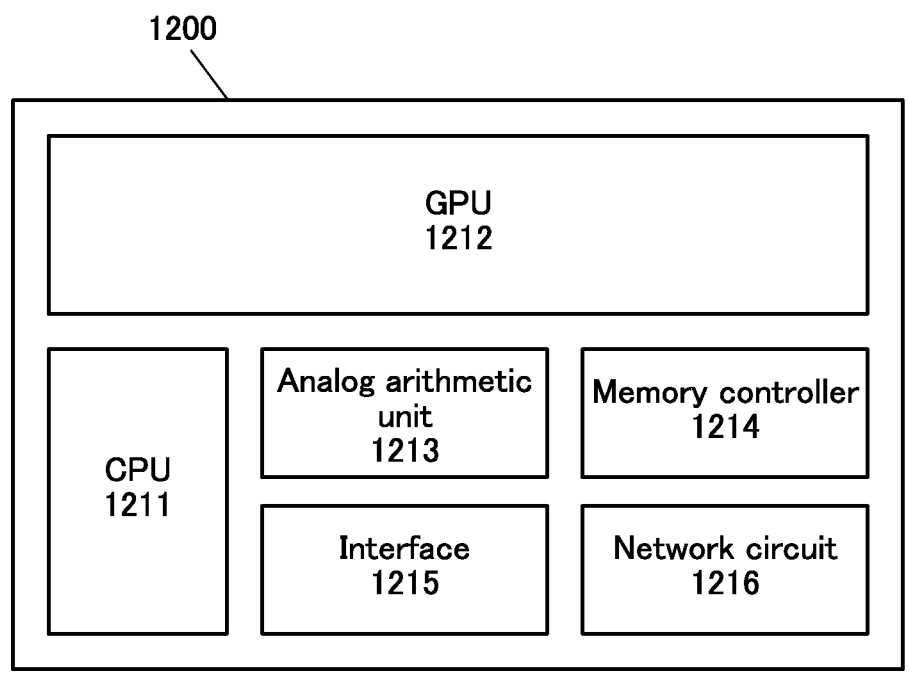
FIGS. 24(A) and (B) Schematic views of a semiconductor device according to one embodiment of the present invention.

As illustrated in FIG. 24(A), the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 24B:
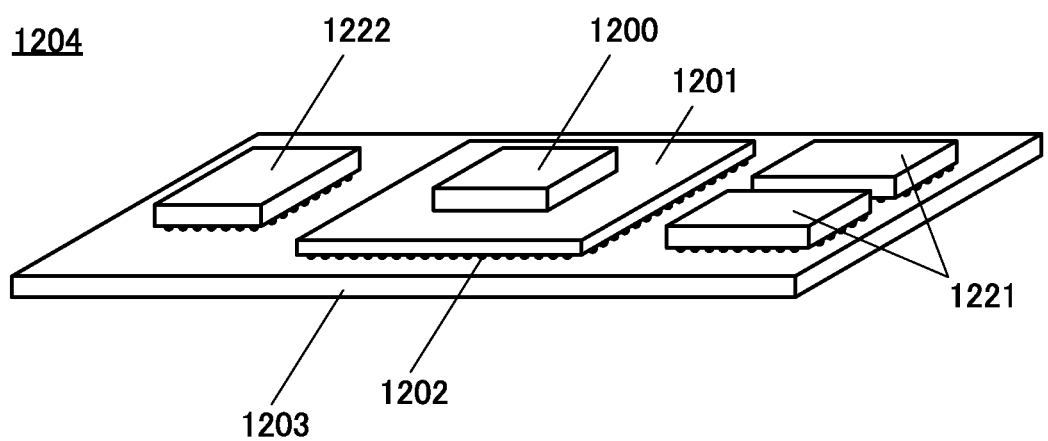

A bump (not shown) is provided on the chip 1200, and as shown in FIG. 24(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, a circuit for network security may be included.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement an arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments and other examples.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 25 schematically shows some structure examples of removable memory devices. The semiconductor device described in the above embodiment is processed into a packaged memory chip and used in a variety of storage devices and removable memories, for example.

FIG. 25(A) is a schematic diagram of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

FIG. 25(B) is a schematic external diagram of an SD card, and FIG. 25(C) is a schematic diagram of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

FIG. 25(D) is a schematic external diagram of an SSD, and FIG. 25(E) is a schematic diagram of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in combination with any of the structures described in the other embodiments and the like, as appropriate.

Embodiment 6

The semiconductor device of one embodiment of the present invention can be used for a chip or a processor such as a CPU or a GPU. FIG. 26 illustrates specific examples of electronic devices including a processor such as a CPU or a GPU or a chip of one embodiment of the present invention.
<Electronic Device and System>

The GPU or the chip of one embodiment of the present invention can be incorporated into a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 26 illustrates examples of electronic devices.

[Information Terminal]

Figure 26A:
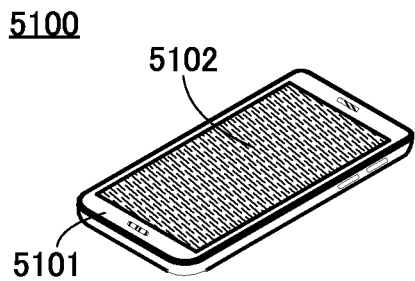
FIG. 26(A) to (H) Diagrams illustrating electronic devices according to embodiments of the present invention.

FIG. 26(A) illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 26B:
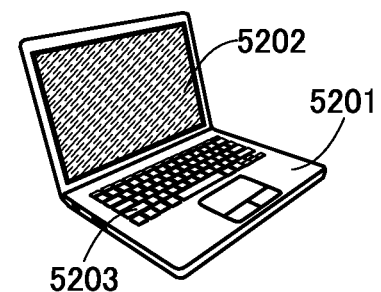

FIG. 26(B) illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 26(A) and FIG. 26(B) as examples of the electronic device, one embodiment of the present invention can be applied to an information terminal other than the smartphone and the notebook information terminal. Examples of an information terminal other than the smartphone and the notebook information terminal include a PDA (Personal Digital Assistant), a desktop information terminal, and a workstation.

[Game Machine]

Figure 26C:
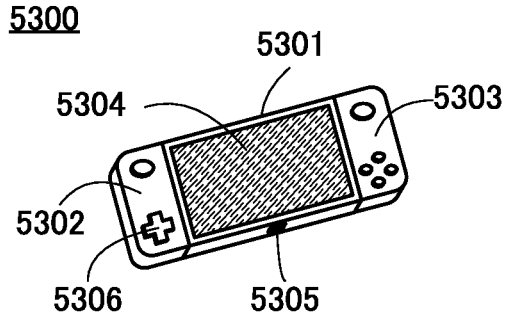

FIG. 26(C) illustrates a portable game machine 5300, which is an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

Figure 26D:
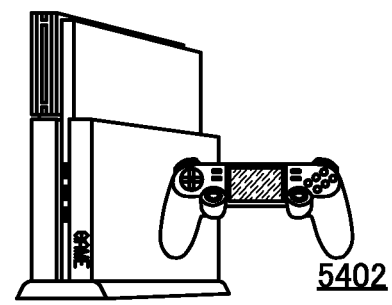

FIG. 26(D) illustrates a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, the progress of a game, the actions and words of game characters, and expressions of a phenomenon and the like in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are respectively illustrated in FIG. 26(C) and FIG. 26(D) as examples of a game machine, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like) and a throwing machine for batting practice installed in sports facilities.

[Large Computer]

The GPU or the chip of one embodiment of the present invention can be used in a large computer.

Figure 26E:
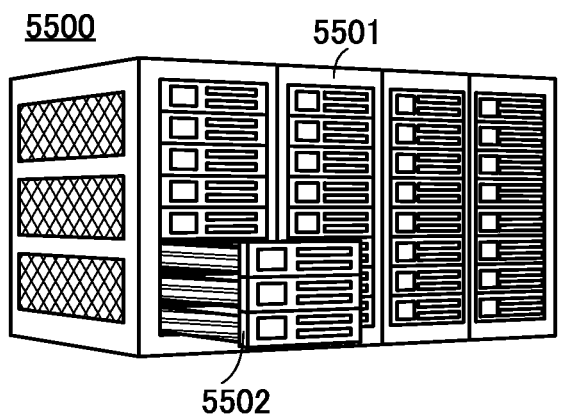
Figure 26F:
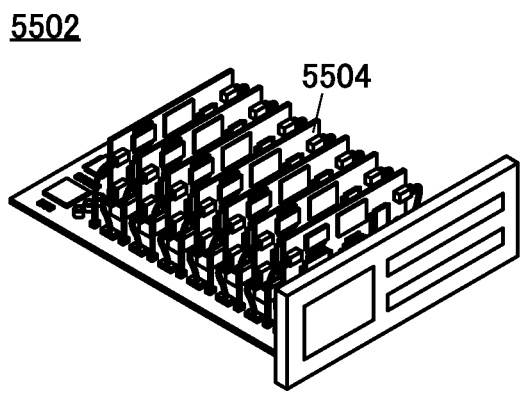

FIG. 26(E) illustrates a supercomputer 5500 as an example of a large computer. FIG. 26(F) illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is illustrated as an example of a large computer in FIG. 26(E) and FIG. 26(F), a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 26G:
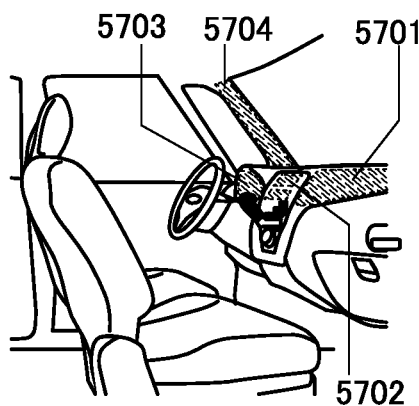

FIG. 26(G) illustrates the periphery of a windshield inside an automobile, which is an example of a moving vehicle. FIG. 26(G) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gearshift indicator, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided on the outside of the automobile. That is, displaying an image taken by the imaging device provided on the outside of the automobile leads to compensation for the blind spot and enhancement of safety. In addition, showing an image for compensating for the area that cannot be seen makes it possible to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile, for example. The chip can also be used for a system for navigation, risk prediction, or the like. The display panel 5701 to the display panel 5704 may display information regarding navigation, risk prediction, or the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Electrical Appliance]

Figure 26H:
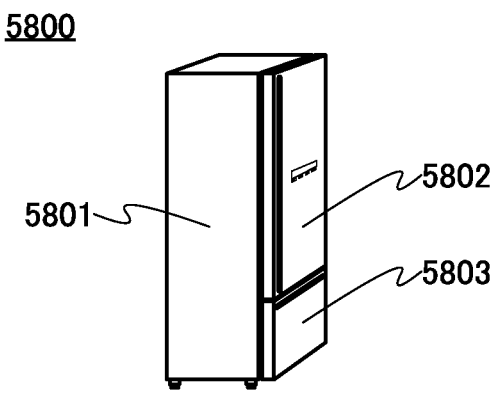

FIG. 26(H) illustrates an electric refrigerator-freezer 5800, which is an example of an electrical appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an example of an electrical appliance, other examples of an electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, application examples of artificial intelligence and its effects, and the like described in this embodiment can be combined as appropriate with the description of another electronic device.

This embodiment can be implemented in combination with any of the structures described in the other embodiments and the like, as appropriate.

REFERENCE NUMERALS

100: capacitor, 100a: capacitor, 100A: capacitor, 100b: capacitor, 100B: capacitor, 110: conductor, 110A: conductive film, 120: conductor, 120A: conductive film, 130: insulator, 130A: insulating film, 150: insulator, 152: conductor, 153: conductor, 154: insulator, 156: insulator, 200: transistor, 200a: transistor, 200A: transistor, 200b: transistor, 200B: transistor, 205: conductor, 205a: conductor, 205b: conductor, 205c: conductor, 210: insulator, 212: insulator, 214: insulator, 214a: insulator, 214b: insulator, 216: insulator, 222: insulator, 224: insulator, 230: oxide, 230a: oxide, 230A: oxide film, 230b: oxide, 230B: oxide film, 230c: oxide, 230C: oxide film, 231: region, 231a: region, 231b: region, 232: region, 232a: region, 232b: region, 234: region, 241: insulator, 242: conductor, 242a: conductor, 242A: conductive film, 242b: conductor, 242B: conductor layer, 245: conductor, 247: conductor, 247a: conductor, 247b: conductor, 247c: conductor, 249: region, 249a: region, 249b: region, 250: insulator, 250A: insulating film, 256: insulator, 260: conductor, 260a: conductor, 260A: conductive film, 260b: conductor, 260B: conductive film, 280: insulator, 281: insulator, 282: insulator, 288: filler, 290: opening, 292: conductor

The invention claimed is:

1. A semiconductor device comprising a transistor, a capacitor, an electrode, and an interlayer film,
wherein the transistor comprises a semiconductor layer, a gate, a source, and a drain,
wherein the transistor and the capacitor are placed to be embedded in the interlayer film, wherein one of the source and the drain overlaps with a first opening provided in the semiconductor layer, wherein the first opening overlaps with the electrode, wherein the one of the source and the drain is in contact with the electrode, wherein above the semiconductor layer, the other of the source and the drain is in contact with one electrode of the capacitor, wherein a second opening reaching the other of the source and the drain is provided in the interlayer film, and wherein the one electrode of the capacitor is placed along a side surface and a bottom surface of the second opening.

2. The semiconductor device according to claim 1, wherein an insulator is provided between the one electrode of the capacitor and the interlayer film.

3. The semiconductor device according to claim 1, wherein the semiconductor layer is an oxide semiconductor.

4. A semiconductor device comprising a first transistor and a capacitor, wherein the first transistor comprises first to fourth conductors, first to fourth insulators, and first and second oxides, wherein the first insulator is placed over the first conductor, wherein the first oxide is placed over the first insulator, wherein a first opening reaching the first conductor is provided in the first insulator and the first oxide, wherein the second conductor and the third conductor provided apart from each other are placed over the first oxide, wherein at least part of the second conductor overlaps with the first opening and is in contact with a top surface of the first conductor, wherein the second oxide is placed over the first oxide to at least partly overlap with a region between the second conductor and the third conductor, wherein the second insulator is placed over the second oxide, wherein the fourth conductor is placed over the second insulator, wherein the third insulator is placed over the first insulator, the second conductor, and the third conductor, wherein the fourth insulator is placed in contact with a top surface of the third insulator, a top surface of the second oxide, a top surface of the second insulator, and a top surface of the fourth conductor, wherein a second opening reaching the third conductor is provided in the third insulator and the fourth insulator, wherein the capacitor comprises fifth and sixth conductors and a fifth insulator, wherein the fifth conductor is placed in the second opening to be in contact with a top surface of the third conductor, wherein the fifth insulator is placed over the fifth conductor and the fourth insulator, and wherein the sixth conductor is placed over the fifth insulator.

5. The semiconductor device according to claim 4, further comprising a sixth insulator between the fifth conductor and the third insulator.

6. The semiconductor device according to claim 5, wherein the sixth insulator comprises lower hydrogen permeability than the third insulator.

7. The semiconductor device according to claim 4, wherein in a top view, a length of the fifth conductor in a channel width direction is shorter than a length of the first oxide in the channel width direction.

8. The semiconductor device according to claim 4, wherein a level of part of a top surface of the fifth conductor is substantially aligned with a level of a top surface of the fourth insulator.

9. The semiconductor device according to claim 4, further comprising a seventh conductor placed under the first insulator to at least partly overlap with the fourth conductor.

10. The semiconductor device according to claim 4, wherein the third conductor is in contact with a side surface of the first oxide in the first opening.

11. The semiconductor device according to claim 4, further comprising a seventh insulator placed between the second conductor and the third conductor, and the third insulator.

12. The semiconductor device according to claim 4, wherein the first oxide and the second oxide comprise In, an element M, and Zn, and wherein M is Al, Ga, Y, or Sn.

13. The semiconductor device according to claim 4, wherein a second transistor is further provided under the first conductor, and wherein a source or a drain of the second transistor is electrically connected to the first conductor.

14. The semiconductor device according to claim 13, wherein the second transistor is formed on a silicon substrate.

15. The semiconductor device according to claim 13, wherein the second transistor comprises a third oxide.

* * * * *